(12) United States Patent
Kanna et al.

(10) Patent No.: US 7,202,015 B2
(45) Date of Patent: Apr. 10, 2007

(54) POSITIVE PHOTORESIST COMPOSITION AND PATTERN MAKING METHOD USING THE SAME

(75) Inventors: Shinichi Kanna, Shizuoka (JP); Kazuyoshi Mizutani, Shizuoka (JP); Tomoya Sasaki, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 34 days.

(21) Appl. No.: 10/921,962

(22) Filed: Aug. 20, 2004

(65) Prior Publication Data

US 2005/0042543 A1   Feb. 24, 2005

(30) Foreign Application Priority Data

Aug. 22, 2003  (JP) .......................... P2003-298897

(51) Int. Cl.
    G03F 7/004    (2006.01)
    G03C 5/00     (2006.01)
(52) U.S. Cl. .................... 430/270.1; 430/326; 430/907
(58) Field of Classification Search .................... None
    See application file for complete search history.

(56) References Cited

U.S. PATENT DOCUMENTS

2001/0036589 A1    11/2001  Kinoshita et al.
2004/0126695 A1*    7/2004  Poss et al. ............... 430/270.1

FOREIGN PATENT DOCUMENTS

| EP | 1319981 A2 | 6/2003 |
| EP | 1376232 A1 | 1/2004 |
| EP | 1415974 A1 | 5/2004 |
| EP | 1505440 A2 | 2/2005 |
| JP | 11-125907 A | 5/1999 |
| JP | 2002-333715 A | 11/2002 |
| JP | 2002-341543 A | 11/2002 |
| JP | 2003-57826 A | 2/2003 |
| WO | WO 97/33198 * | 9/1997 |
| WO | WO 99/53377 A1 | 10/1999 |
| WO | WO 01/37047 A2 | 5/2001 |

OTHER PUBLICATIONS

Toriumi M. et al, "Novel Main-chain-fluorinated Polymers for 157-nm Photoresists", Proceedings of the SPIE, vol. 5039, Jun. 2003, pp. 53-60.

* cited by examiner

Primary Examiner—Rosemary Ashton
(74) Attorney, Agent, or Firm—Sughrue Mion, PLLC

(57) ABSTRACT

A positive photoresist composition containing: (A) a resin which contains at least one of a repeating unit represented by the formula (IA) defiend herein and a repeating unit represented by the formula (IB) defined herein, and is decomposed by an action of an acid and shows an increase in a solubility in an alkali developer; and (B) as compounds capable of generating an acid upon irradiation with one of an actinic ray and a radiation, at least two compounds selected from the compounds (B1), (B2), (B3) and (B4) as defiend herein.

7 Claims, 1 Drawing Sheet

POSITIVE PHOTORESIST COMPOSITION AND PATTERN MAKING METHOD USING THE SAME

FIELD OF THE INVENTION

This invention relates to a photosensitive resin composition which is appropriately usable in microlithography for producing very-large-scale integrated circuits and high-capacity microchips as well as other photofabrication processes. More specifically, it relates to a photoresist composition whereby highly fine pattern making can be made with the use of vacuum ultraviolet ray of 160 nm or less and a pattern making method using the same.

BACKGROUND OF THE INVENTION

Integration degrees of integrated circuits have been more and more increasing. As a result, ultrafine pattern processing with subquater-micron line width becomes necessary in producing semiconductor substrates such as very-large-scale integrated circuits. As one of techniques for fine pattern making, it is known to shorten the wavelength of an exposure light source to be used in resist pattern making In producing semiconductor devices up to 64 Mbit, for example, it has been a practice to employ the i-beam (365 nm) of a high pressure mercury lamp as the light source. As positive resists suitable for this light source, a large number of compositions containing a novolac resin and a naphtoquinone diadize compound as a photosensitive substance which have accomplished satisfactory results in processing at a line width of about 0.3 μm have been developed. In the production of semiconductor devices of 256 Mbit or more in the degree of integration, use has been made of a KrF excimer laser beam (248 nm) as an exposure light source.

To produce semiconductor devices of 1 Gbit or more in the degree of integration, furthermore, attempts have been recently made to use an ArF excimer laser beam (193 nm) and an $F_2$ excimer laser beam (156 nm) for forming patterns of 0.1 μm or less.

The tendency to shorten the light source wavelength as described above brings about large changes in components constituting resist materials and structures of compounds used therein.

As resist compositions for the exposure with the KrF excimer laser beam, so-called chemical amplification resists comprising a resin which has poly(hydroxystyrene) showing small absorption in the 248 nm range as the fundamental skeleton and protected with an acid-decomposable group as the main component together with a compound capable of generating an acid upon far ultraviolet light irradiation (a photo-acid generator) have been developed.

As resist compositions for the exposure with the ArF excimer laser beam (193 nm), chemical amplification resists with the use of an acid-decomposable resin in which an alicyclic structure showing no absorption in the 193 nm range is introduced into the main or side chain of a polymer have been developed.

In the case of using the $F_2$ excimer laser (157 nm), it is clarified that even such an alicyclic resin as described above is insufficient for obtaining a desired pattern of 0.1 μm or less because of showing large absorption in the 157 nm range. It is also found out that resins having a fluorine atom introduced therein (perfluoro structure) have sufficient transparency at 157 nm. Thus, various resist compositions containing fluororesins are discussed in, for example, JP-A-2003-57826, JP-A-2002-333715 and JP-A-2002-341543.

However, these fluororesin-containing resist compositions for $F_2$ excimer laser exposure suffer from the problem of bottom spread.

SUMMARY OF THE INVENTION

Therefore, an object of the present invention is to provide a photosensitive resin composition appropriately usable in the case of using an exposure light source of 160 nm or less, in particular, the $F_2$ excimer laser beam (157 nm) More specifically speaking, the present invention aims at providing a resist composition which has a sufficient transmittance in the case of using a light source of 157 nm, shows regulated bottom spread and has a favorable profile and a pattern making method using the same.

The present inventors have attracted their attention to the characteristics as described above and conducted intensive studies. As a result, they have found out that the object of the present invention can be achieved by using a specific composition as will be described below, thereby completing the invention.

Accordingly, the present invention has the following constitution.

(1) A positive photoresist composition containing:
(A) a resin which contains at least one of a repeating unit represented by the formula (IA) and a repeating unit represented by the formula (IB), is decomposed by the action of an acid and shows an increase in the solubility in an alkali developer; and
(B) as compounds capable of generating an acid upon irradiation with one of an actinic ray and a radiation, at least two compounds selected from among;
(B1) a compound capable of generating an aliphatic or aromatic sulfonic acid substituted by at least one fluorine atom upon irradiation with one of an actinic ray and a radiation;
(B2) a compound capable of generating an aliphatic or aromatic sulfonic acid containing no fluorine atom upon irradiation with one of an actinic ray and a radiation;
(B3) a compound capable of generating an aliphatic or aromatic carboxylic acid substituted by at least one fluorine atom upon irradiation with one of an actinic ray and a radiation; and
(B4) a compound capable of generating an aliphatic or aromatic carboxylic acid containing no fluorine atom upon irradiation with one of an actinic ray and a radiation;

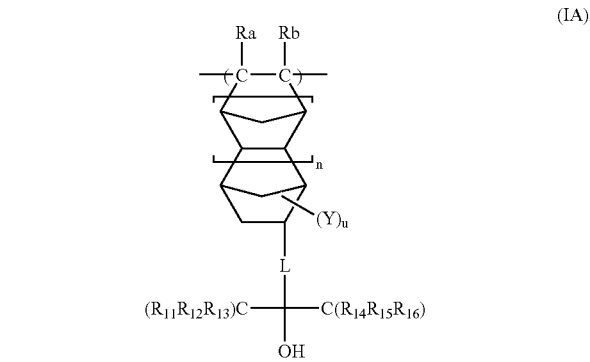

-continued

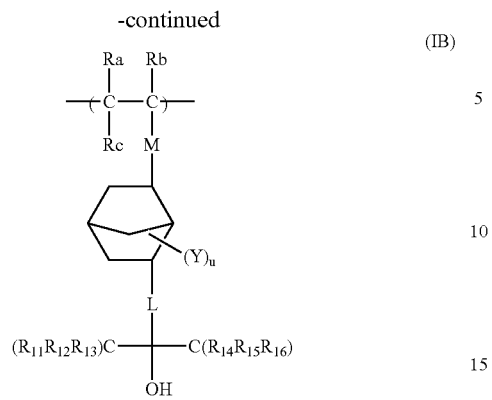
(IB)

wherein Ra, Rb and Rc independently represent each a hydrogen atom, a methyl group, a fluorine atom or a fluoroalkyl group;
n is 0 or 1;
Y represents a fluorine atom or a fluoroalkyl group;
u is an integer of from 1 to 5;
L and M independently represent each a methylene group, an oxygen atom or an ester group; and
$R_{11}$ to $R_{16}$ independently represent each a hydrogen atom, a fluorine atom or a fluoroalkyl group, provided that at least one of $R_{11}$ to $R_{16}$ represents a fluorine atom or a fluoroalkyl group.

(2) The photoresist composition according to the above (1) characterized in that the resin (A) contains at least one of a repeating unit represented by the following formula (IIA) and a repeating unit represented by the following formula (IIB):

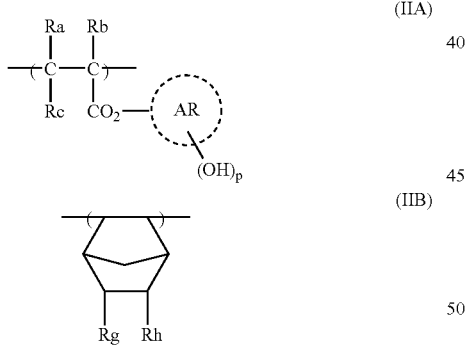
(IIA)

(IIB)

wherein Ra, Rb and Rc independently represent each a hydrogen atom, a methyl group, a fluorine atom or fluoroalkyl group;
AR represents an alicyclic hydrocarbon structure;
p is an integer of from 1 to 5; and
Rg and Rh independently represent each a hydrogen atom, a hydroxyl group or hydroxyalkyl group, provided that one of them represents a hydroxyl group or a hydroxyalkyl group.

(3) A photoresist composition according to the above (1) or (2) characterized in that the resin A further contains at least one of repeating units represented by the following formulae (VIII) to (XVII):

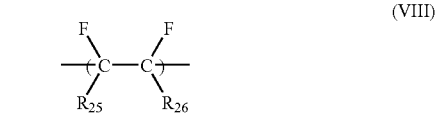
(VIII)

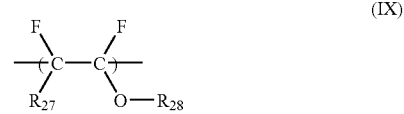
(IX)

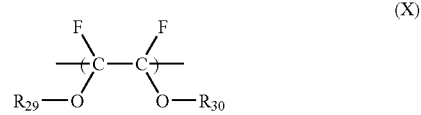
(X)

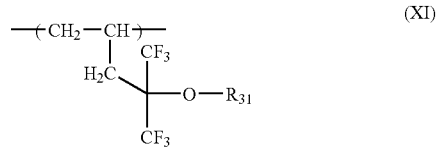
(XI)

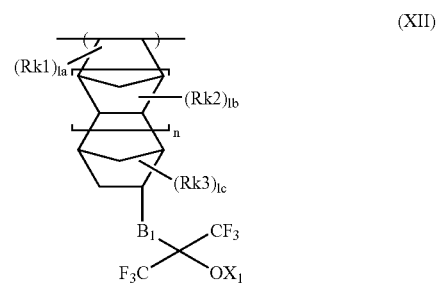
(XII)

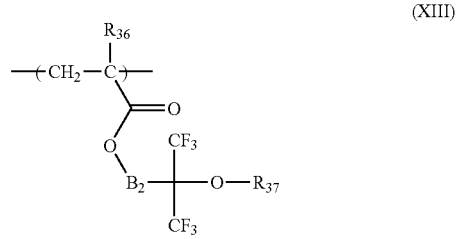
(XIII)

(XIV)

(XV)

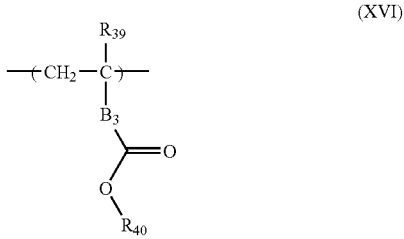
(XVI)

(XVII)

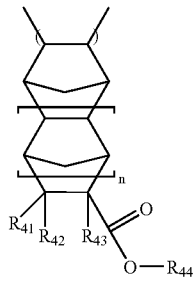

wherein $R_{25}$, $R_{26}$ and $R_{27}$ may be the same or different and each represents a hydrogen atom, a fluorine atom, an alkyl group, a cycloalkyl group or an aryl group; $R_{28}$, $R_{29}$ and $R_{30}$ may be the same or different and each represents an alkyl group, a cycloalkyl group or an aryl group; or $R_{25}$ and $R_{26}$, $R_{27}$ and $R_{28}$, or $R_{29}$ and $R_{30}$ may be bonded to each other to form a ring; $R_{31}$, $R_{37}$, $R_{40}$ and $R_{44}$ may be the same or different and each represents a hydrogen atom, an alkyl group, a cycloalkyl group, an acyl group or an alkoxycarbonyl group; $R_{41}$, $R_{42}$ and $R_{43}$ may be the same or different and each represents a hydrogen atom, a halogen atom, an alkyl group or an alkoxy group; $R_{36}$ and $R_{39}$ may be the same or different and each represents a hydrogen atom, a halogen atom, a cyano group or an alkyl group; $R_{38}$ represents an alkyl group, a cycloalkyl group, an aralkyl group or an aryl group; $B_1$ and $B_2$ represent each a single bond or a divalent linking group; $B_3$ represents a divalent linking group; n is 0 or 1;

Rk1, Rk2 and Rk3 independently represent each a halogen atom, an alkyl group or an alkoxy group;

$X_1$ represents a hydrogen atom or a monovalent organic group;

1a is 0 or 1; 1b is an integer of 0 to 2; and 1c is an integer of 0 to 5.

(4) A photoresist composition according to any of the above (1) to (3) characterized by further containing (D) a surfactant containing at least one of a group consisting of a fluorine atom and a silicone atom.

(5) A photoresist composition according to any of the above (1) to (4) characterized by further containing (E) a basic compound having a nitrogen atom as an acid diffusion inhibitor.

(6) A photoresist composition according to any of the above (1) to (5) characterized by being intended to use in $F_2$ laser irradiation.

(7) A pattern making characterized by comprising forming a resist film by using a photoresist composition according to any of the above (1) to (6), exposing the resist film and then developing.

According to the present invention, it is possible to provide a resist composition which has a sufficient transmittance in the case of using a light source of 157 nm, shows regulated bottom spread and has a favorable profile and a pattern making method using the same.

DETAILED DESCRIPTION OF THE INVENTION

Figure 1:
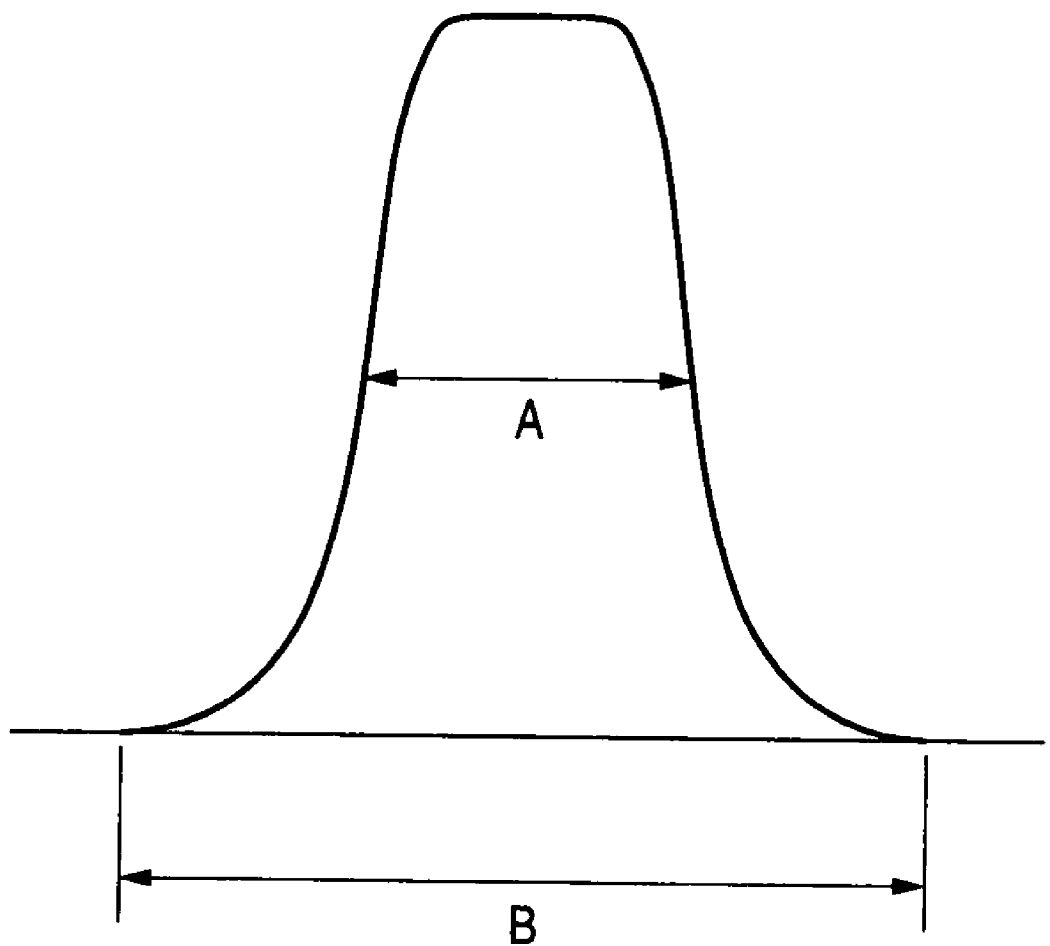
FIG. 1 is a diagram showing the bottom spread shape to be used in evaluating the bottom spread in EXAMPLES.

Now, compounds to be used in the present invention will be described in detail.

In the description of groups (atomic groups) herein, a group not specified as substituted or unsubstituted involves a group having no substituent as well as one having substituent(s). For example, the term "an alkyl group" involves not only an alkyl group having n substituent (an unsubstituted alkyl group) but also an alkyl group having substituent (s) (a substituted alkyl group).

[1] Resin (A)

The resin (A) contained in the composition according to the invention is a resin which contains at least one of a repeating unit represented by the above formula (IA) and a repeating unit represented by the above formula (IB), is decomposed by the action of an acid and shows an increase in the solubility in an alkali developer (an aid-decomposable resin):

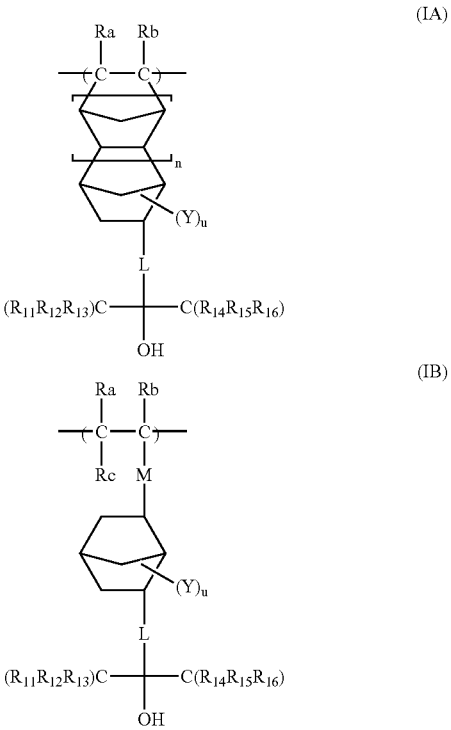

Ra, Rb and Rc independently represent each a hydrogen atom, a methyl group, a fluorine atom or a fluoroalkyl group.

n is 0 or 1.

Y represents a fluorine atom or a fluoroalkyl group.

u is an integer of from 1 to 5.

L and M independently represent each a methylene group, an oxygen atom or an ester group.

$R_{11}$ to $R_{16}$ independently represent each a hydrogen atom, a fluorine atom or a fluoroalkyl group, provided that at least one of $R_{11}$ to $R_{16}$ represents a fluorine atom or a fluoroalkyl group.

—$C(R_{11}R_{12}R_{13})$ represents a group in which each of the groups represented by $R_{11}$ to $R_{13}$ attaches to a carbon atom via a single bond.

A fluoroalkyl group represented by Ra, Rb, Rc or Y is an alkyl group in which at least one hydrogen atom is substituted by a fluorine atom and the substitution by the fluorine atom occurs at an arbitrary position of a linear or branched alkyl group. The fluoroalkyl group may have —O— in the middle thereof. It is preferable that the fluoroalkyl group has from 1 to 8 carbon atoms, still preferably form 1 to 5 carbon atoms. Examples thereof include monofluoromethyl, difluoromethyl, trifluoromethyl, 2,2,2-trifluoroethyl, pentafluoroethyl, 2,2,3,3,3-pentafluoropropyl, heptafluoropropyl, 2,2,3,3,4,4,4-heptafluorobutyl, nonafluorobutyl, perfluorohexyl and 1H-1H-perfluorobutyl groups Examples of the substituent of the fluoroalkyl group include hydroxyl group, alkoxy groups, halogen atoms and cyano group.

Next, specific examples of the repeating unit represented by the formula (IA) will be presented, though the invention is not restricted thereto.

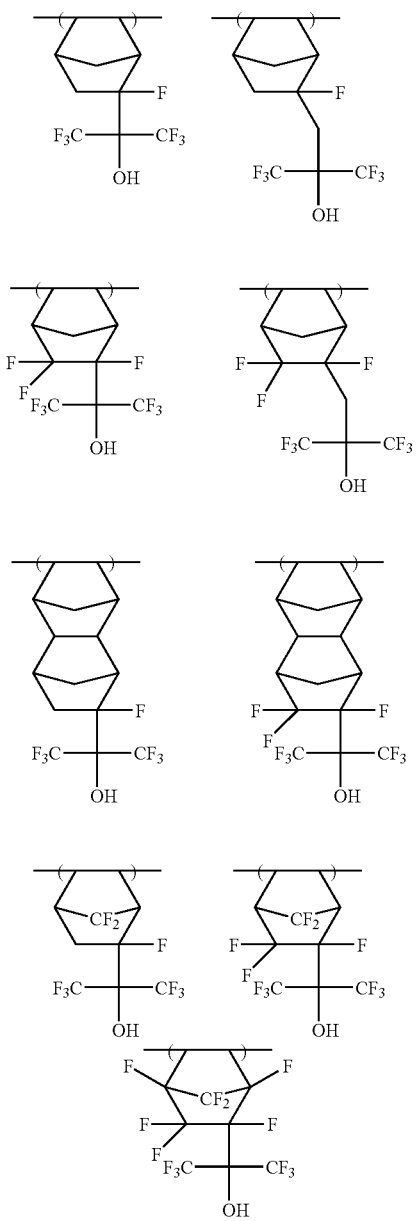

Next, specific examples of the repeating unit represented by the formula (IB) will be presented, though the invention is not restricted thereto.

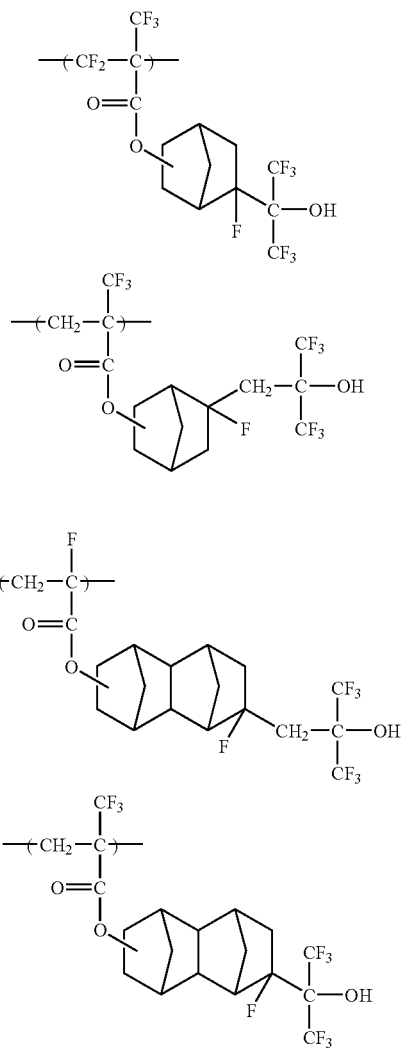

The resin (A) is a resin which is decomposed by the action of an acid and shows an increase in the solubility in an alkali developer. It contains a repeating unit having a group which generates an alkali-soluble group such as hydroxyl or carboxyl group (an acid-decomposable group). The acid-decomposable group may be contained in any repeating unit including the repeating units as will be described hereinafter.

Examples of the acid-decomposable group include —C($R_{36}$) ($R_{37}$) ($R_{38}$), —C($R_{36}$) ($R_{37}$) (O$R_{39}$), —COO—C ($R_{36}$) ($R_{37}$) ($R_{38}$), —C($R_{01}$) ($R_{02}$) (O$R_{38}$), —C($R_{01}$) ($R_{02}$) COO—C($R_{36}$) ($R_{37}$) ($R_{38}$) though the invention is not restricted thereto —C($R_{36}$) ($R_{37}$) ($R_{38}$) means a group in which each of the groups represented by $R_{36}$ to $R_{38}$ attaches to a carbon atom via a single bond.

$R_{36}$ to $R_{39}$ independently represent each an alkyl group, a cycloalkyl group, an alkenyl group, an aralkyl group or an aryl group. $R_{36}$ and $R_{39}$ may be bonded to each other to form a ring.

$R_{01}$ and $R_{02}$ independently represent each a hydrogen atom, an alkyl group, a cycloalkyl group, an alkenyl group, an aralkyl group or an aryl group.

An alkyl, group represented by $R_{36}$ to $R_{39}$, $R_{01}$ or $R_{02}$ may have a substituent and an alkyl group having from 1 to 8 carbon atoms is preferable. Examples thereof include methyl, ethyl, propyl, n-butyl, sec-butyl, hexyl, 2-ethylhexyl and octyl groups.

A cycloalkyl group represented by $R_{36}$ to $R_{39}$, $R_{01}$ or $R_{02}$ may have a substituent. It may be either a monocyclic or polycyclic group. As a monocyclic group, a cycloalkyl group having from 3 to 8 carbon atoms is preferable. Examples thereof include cyclopropyl, cyclopentyl, cyclohexyl, cyclobutyl and cyclooctyl groups. As a polycyclic group, a cycloalky; group having from 6 to 20 carbon atoms is preferable. Examples thereof include adamantyl, norbornyl, isobornyl, camphanyl, dicyclopentyl, α-pinenyl, tricyclodecanyl, tetracyclododecyl and androstanyl groups. A part of the carbon atoms in the cycloalkyl group may be substituted by a hetero atom such as an oxygen atom.

An aryl group represented by $R_{36}$ to $R_{39}$, $R_{01}$ or $R_{02}$ may have a substituent and an aryl group having from 6 to 10 carbon atoms is preferable. Examples thereof include phenyl, tolyl, dimethylphenyl, 2,4,6-trimethylphenyl, naphthyl, anthryl and 0,9,10-dimethoxyanthryl groups.

An aralkyl group represented by $R_{36}$ to $R_{39}$, $R_{01}$ or $R_{02}$ may have a substituent and an aralkyl group having from 7 to 12 carbon atoms is preferable. Examples thereof include benzyl, phenethyl and naphthylmethyl groups.

An alkenyl group represented by $R_{36}$ to $R_{39}$ $R_{02}$ or $R_{02}$ may have a substituent and an alkenyl group having from 2 to 8 carbon atoms is preferable. Examples thereof include vinyl, allyl, butenyl and cyclohexenyl groups.

Examples of the substituent which may be carried by $R_{36}$ to $R_{39}$, $R_{01}$ and $R_{02}$ include alkyl, cycloalkyl, aryl, amino, amido, ureido, urethane, hydroxy and carboxy groups, halogen atoms, alkoxy, thioether, acyl, acyloxy, alkoxycarbonyl, cyano and nitro groups.

Preferable examples of the acid-decomposable grbup include acetal groups such as 1-alkoxy-1-ethoxy, 1-alkoxy-1-methoxy and tetrahydropyranyl groups, t-alkyloxycarbonyl, ethoxymethyl, methoxyethoxymethyl and t-alkylcarbonylmethyl groups.

It is preferable that the resin (A) further contains at least one of a repeating unit represented by the following formula (IIA) and a repeating unit represented by the following formula (IIB).

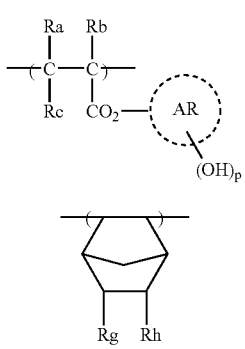

(IIA)

(IIB)

Ra, Rb and Rc independently represent each a hydrogen atom, a methyl group, a fluorine atom or fluoroalkyl group.

AR represents an alicyclic hydrocarbon structure.

p is an integer of from 1 to 5.

Rg and Rh independently represent each a hydrogen atom, a hydroxyl group or a hydroxyalkyl group, provided that one of them represents a hydroxyl group or a hydroxyalkyl group.

A fluoroalkyl group represented by Ra, Rb or Rc is the same as the fluoroalkyl group as in the formula (IA).

The alicyclic hydrocarbon structure represented by AR may be either a monocyclic or polycyclic structure. Specific examples thereof include alicyclic hydrocarbon structures having 5 or more carbon atoms such as monocyclo, bicyclo, tricyclo and tetracyclo structures. It is preferable that AR has from 6 to 30 carbon atoms, still preferable from 7 to 25 carbon atoms.

Preferable examples of the alicyclic hydrocarbon structure represented by AR include adamantane, noradamantane, decalin, tricyclodecane, tetracyclododecane, norbornane, cyclohexane, cycloheptane, cyclooctane, cyclodecane and cyclododecane. Still preferable examples thereof include adamantane, norbornane and cyclohexane.

The alicyclic hydrocarbon structure represented by AR may further have a substituent such as alkyl or alkoxy group.

It is preferable that a hydroxyalkyl group represented by Rg or Rh has 1 to 10 carbon atoms, still preferably 1 to 5 carbon atoms. A hydroxymethyl group is particularly preferable therefor.

Next, specific examples of the repeating unit represented by the formula (IIA) will be presented, though the invention is not restricted thereto.

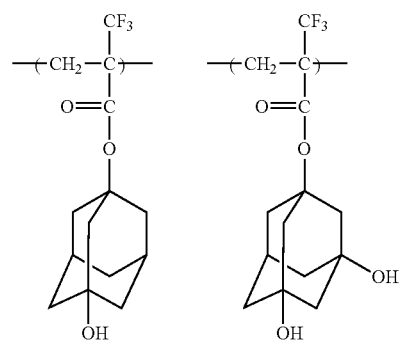

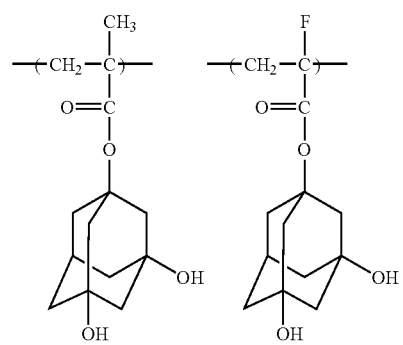

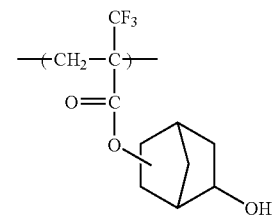

-continued

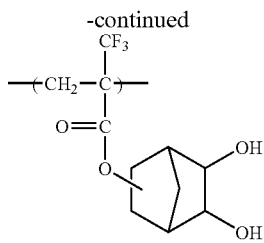

Next, specific examples of the repeating unit represented by the formula (uIB) will be presented, though the invention is not restricted thereto.

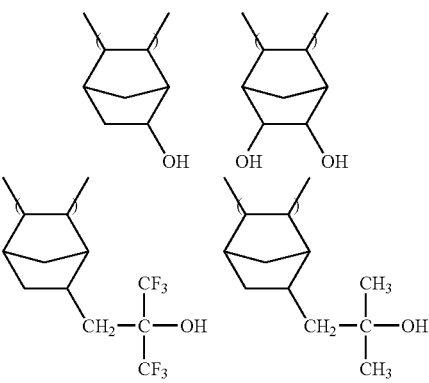

In the resin (A), the repeating unit represented by the above formula (IA) and the repeating unit represented by the above formula (IB) are used in a content of generally from 5 to 80% by mol, preferably from 7 to 75% by mol and still preferably from 10 to 70% by mol, based on the total repeating units.

In the the resin (A), the repeating unit represented by the above formula (IIA) and the repeating unit represented by the above formula (IIB) are used in a content of generally from 1 to 40% by mol, preferably from 3 to 35% by mol and still preferably from 5 to 30% by mol, based on the total repeating units.

In the resin (A), the repeating unit having the acid-decomposable group is used in a content of generally from 5 to 80% by mol., preferably from 7 to 75% by mol and still preferably from 10 to 70% by mol, based on the total repeating units.

The resin (A) may have an additional repeating unit and preferable examples thereof are as follows.

(1) Repeating units represented by the following formulae (I), (II) and (VI).

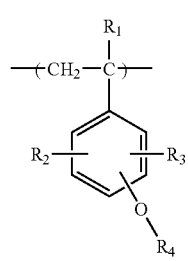

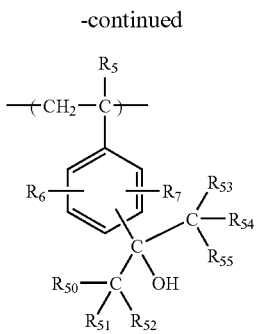

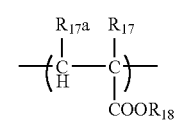

In the formulae (I), (II) and (VI), $R_1$, $R_5$, $R_{17a}$ and $R_{17}$ may be the same or different and each represents a hydrogen atom, a halogen atom, a cyano group or an alkyl group. $R_2$, $R_3$, $R_6$ and $R_7$ may be the same or different and each represents a hydrogen atom, a halogen atom, a cyano group, a hydroxyl group, an alkyl group, a cycloalkyl group, an aryl group or an aralkyl group. $R_{50}$ to $R_{55}$ may be the same or different and each represents a hydrogen atom, a fluorine atom or an alkyl group, provided that at least one of $R_{50}$ to $R_{55}$ represents a fluorine atom or an alkyl group having a substitution of at least one hydrogen atom by a fluorine atom (a fluoroalkyl group). $R_4$ represents a group of the following formula (IV) or (V). $R_{18}$ represents —$C(R_{18d})(R_{18e})(R_{18f})$ or —$C(R_{18d})(R_{18c})(OR_{18g})$. $R_{18d}$ to $R_{18g}$ may be the same or different and each represents a hydrogen atom, an alkyl group, a cycloalkyl group, an alkenyl group, an aralkyl group or an aryl group. Two groups among $R_{18d}$, $R_{18e}$ and $R_{18f}$ or two groups among $R_{18d}$, $R_{18c}$ and $R_{18g}$ may be bonded together to form a ring.

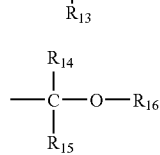

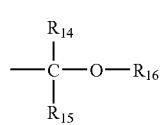

In the formula (IV), $R_{11}$, $R_{12}$ and $R_{13}$ may be the same or different and each represents an alkyl group, a cycloalkyl group, an alkenyl group, an aralkyl group or an aryl group.

In the formula (V), $R_{14}$ and $R_{15}$ may be the same or different and each represents a hydrogen atom or an alkyl group. $R_{16}$ represents an alkyl group, a cycloalkyl group, an aralkyl group or an aryl group. Two groups among $R_{14}$ to $R_{16}$ may be bonded together to form a ring.

In the above formula (VI), it is preferable that RIG is a group represented by any of the following formulae (VI-A) to (VI-C).

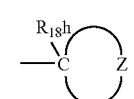
(VI-A)

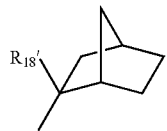
(VI-B)

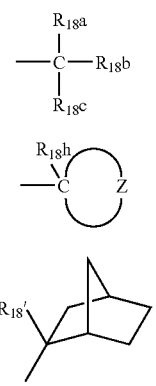
(VI-C)

In the formula (VI-A), $R_{18a}$ and $R_{18b}$ maybe the same or different and each represents an alkyl group. $R_{18c}$ represents a cycloalkyl group.

In the formula (VI-B), $R_{18h}$ represents an alkyl group, an alkenyl group, an alkynyl group, an aralkyl group or an aryl group. Z represents an atomic group which forms a monocyclic or polycyclic alicyclic group together with the carbon atom in the formula (VI-B).

In the formula (VI-C), $R_{18'}$ represents an alkyl group, an alkenyl group, an alkynyl group, an aralkyl group or an aryl group.

It is preferable that R in the above formula (I), $R_5$ in the formula (II) and $R_{17}$ in the formula (VI) are each a trifluoromethyl group.

(2) Repeating units represented by the following formulae (III) and (VII).

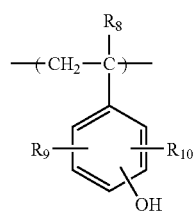
(III)

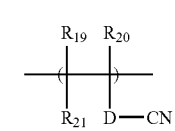
(VII)

In the formula (III), $R_8$ represents a hydrogen atom, a halogen atom, a cyano group or an alkyl group. $R_9$ and $R_{10}$ may be the same or different and each represents a hydrogen atom, a halogen atom, a cyano group, an alkyl group, a cycloalkyl group, an alkoxy group, an acyl group, an acyloxy group, an alkenyl group, an aryl group or an aralkyl group.

In the formula (VII), $R_{19}$ and $R_{20}$ may be the same or different and each represents a hydrogen atom, a halogen atom, a cyano group or an alkyl group.

$R_{21}$ represents a hydrogen atom, a halogen atom, an alkyl group or -D-CN. D represents a single bond or a divalent linking group.

(3) Repeating units represented by the following formulae (VIII) to (XVII).

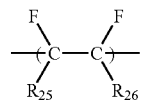
(VIII)

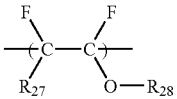
(IX)

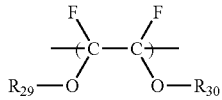
(X)

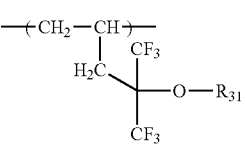
(XI)

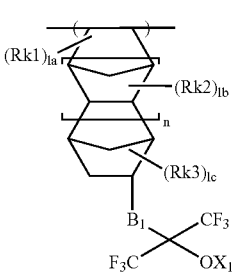
(XII)

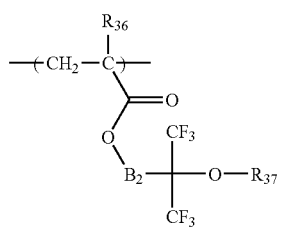
(XIII)

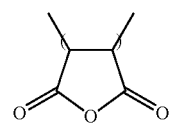
(XIV)

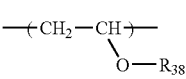
(XV)

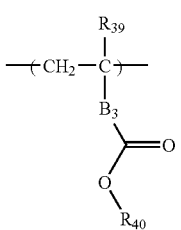
(XVI)

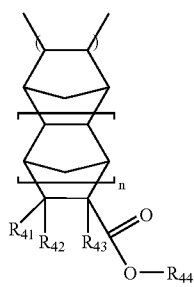

(XVII)

In the formulae (VIII) to (XVII), $R_{25}$, $R_{26}$ and $R_{27}$ may be the same or different and each represents a hydrogen atom, a fluorine atom, an alkyl group, a cycloalkyl group or an aryl group. $R_{28}$, $R_{29}$ and $R_{30}$ may be the same or different and each represents an alkyl group, a cycloalkyl group or an aryl group. Alternatively, $R_{25}$ and $R_{26}$, $R_{27}$ and $R_{28}$, or $R_{29}$ and $R_{30}$ may be bonded to each other to form a ring. $R_{31}$, $R_{37}$, $R_{40}$ and $R_{44}$ may be the same or different and each represents a hydrogen atom, an alkyl group, a cycloalkyl group, an acyl group or an alkoxycarbonyl group. $R_{41}$, $R_{42}$ and $R_{43}$ may be the same or different and each represents a hydrogen atom, a halogen atom, an alkyl group or an alkoxy group. $R_{36}$ and $R_{39}$ may be the same or different and each represents a hydrogen atom, a halogen atom, a cyano group or an alkyl group. $R_{38}$ represents an alkyl group, a cycloalkyl group, an aralkyl group or an aryl group. $B_1$ and $B_2$ represent each a single bond or a divalent linking group. $B_3$ represents a divalent linking group n is 0 or 1.

Rk1, Rk2 and Rk3 independently represent each a halogen atom, an alkyl group or an alkoxy group.

$X_1$ represents a hydrogen atom or a monovalent organic group.

1a is 0 or 1, 1b is an integer of 0 to 2, and 1c is an integer of 0 to 5.

Now, individual groups as described above will be illustrated in detail.

An alkyl group means a linear or branched alkyl group having, for example, from 1 to 8 carbon atoms. Preferable examples thereof include methyl, ethyl, propyl, n-butyl, sec-butyl, hexyl, 2-ethylhexyl and octyl groups.

A cycloalkyl group may be either a monocyclic or polycyclic group. As a monocyclic group, a cycloalkyl group having from 3 to 8 carbon atoms is preferable. Examples thereof include cyclopropyl, cyclopentyl, cyclohexyl, cycloheptyl and cyclooctyl groups. As a polycylic group, a cycloalkyl group having from 6 to 20 carbon atoms is preferable. Examples thereof include adamantyl, norbornyl, isobornyl, camphanyl, dicyclopentyl, α-pinenyl, tricyclodecanyl, tetracylcododecyl and androstanyl groups. A cycloalkyl group having substitution of a part of carbon atoms constituting a ring by a hetero atom such as an oxygen atom, a sulfur atom or a nitrogen atom is also involves.

An aryl group means an aryl group having, for example, from 6 to 15 carbon atoms. Preferable examples thereof include phenyl, tolyl, dimethylphenyl, 2,4,6-trimethylphenyl, naphthyl, anthryl and 9,10-dimethoxyanthryl groups.

An aralkyl group means an aralkyl group having, for example, from 7 to 12 carbon atoms. Preferable examples thereof include benzyl, phenethyl and naphthylmethyl groups.

An alkenyl group means an alkenyl group having from, for example, 2 to 8 carbon atoms. Preferable examples thereof include vinyl, allyl, butenyl and cyclohexenyl groups.

An alkoxy group means an alkoxy group having, for example, from 1 to 8 carbon atoms. Preferable examples thereof include methoxy, ethoxy, n-propoxy, iso-propoxy., butoxy, pentoxy, allyloxy and octoxy groups.

An acyl group means an acyl group having, for example, from 1 to 10 carbon atoms. Preferable examples thereof include formyl, acetyl, propanoyl, butanoyl, pivaloyl, octanoyl and benzoyl groups.

As an acyloxy group, acyloxy groups having from 2 to 12 carbon atoms such as acetoxy, propionyloxy and benzoyloxy groups are preferable.

As an alkynyl group, alkynyl groups having from 2 to 5 carbon atoms such as ethynyl, propynyl and butynyl groups are preferable.

Examples of an alkoxycarbonyl group include tertiary alkoxycarbonyl groups such as t-butoxycarbonyl, t-amyloxycarbonyl, 1-methyl-1-cyclohexylcarbonyl groups.

Examples of a halogen atom include fluorine, chlorine, bromine and iodine atoms.

A divalent linking group means an optionally substituted divalent alkylene, cycloalkylene, alkenylene or arylene group, or —O—CO—$R_{22a}$—, —CO—O—$R_{22b}$—, —CO—N($R_{22d}$)—$R_{22c}$—. $R_{22a}$, $R_{22b}$ and $R_{22c}$ may be the same or different and each represents a single bond or a divalent alkylene, cycloalkylene, alkenylene or arylene group optionally having an ether group, an ester group, an amido group, an urethane group or an ureido group. $R_{22d}$ represents a hydrogen atom or an optionally substituted alkyl, cycloalkyl, aralkyl or aryl group.

An alkylene group means a linear or branched alkylene group. Examples thereof include alkylene groups having from 1 to 8 carbon atoms such as methylene, ethylene, propylene, butylene, hexylene and octylene groups.

Examples of a cycloalkylene group include cycloalkylene groups having from 5 to 8 carbon atoms such as cyclopentylene and cyclohexylene groups.

Preferable examples of an alkenylene group include optionally substituted alkenylene groups having from 2 to 6 carbon atoms such as ethenylene, propenylene and butenylene groups.

Preferable examples of an arylene group include optionally substituted arylene groups having from 6 t 15 carbon atoms such as phenylene, tolylene and naphthylene groups.

Examples of a ring formed by two of $R_{18d}$ to $R_{18f}$ two of $R_{18d}$, $R_{18e}$ and $R_{18g}$, two of $R_{14}$ to $R_{16}$, $R_{25}$ and $R_{26}$, $R_{27}$ and $R_{28}$ or $R_{29}$ to $R_{30}$ bonded together include 3- to 8-membered rings such as cyclopropane, cyclopentane, cyclohexane, tetramethylene oxide, pentamethylene oxide, hexamethylene oxide, furan, pyrane, dioxonol and 1,3-dioxolane rings.

Z represents an atomic group which forms a monocyclic or polycyclic alicyclic group together with the carbon atom in the formula (VI-B). Preferable examples of the monocyclic alicyclic group include monocyclic alicyclic groups having from 3 to 8 carbon atoms such as cyclopropyl, cyclopentyl, cyclohexyl, cycloheptyl and cyclooctyl groups. Examples of the polycyclic alicyclic groups include polycyclic alicyclic groups having from 6 to 20 carbon atoms such as adamantyl, norbornyl, isobornyl, camphanyl, dicyclopentyl, α-pinenyl, tricyclodecanyl, tetracylcododecyl and androstanyl groups.

The above-described alkyl, cycloalkyl, alkoxy, acyl, acyloxy, alkynyl, alkenyl, aryl, aralkyl, alkoxycarbonyl, alkylene, cycloalkylene, alkenylene and arylene groups may have substituent(s).

Examples of the substituents which may be carried by these groups include active hydrogen-containing groups such as amino, amido, ureido, urethane, hydroxyl and carboxyl groups, halogen atoms (fluorine, chlorine, bromine and iodine atoms), alkoxy groups (methoxy, ethoxy, propoxy, butoxy and so on), thioether groups, acyl groups (acetyl, propanoyl, benzoyl and so on), acyloxy groups (acetoxy, propanoyloxy, benzoyloxy and so on), alkoxycarbonyl groups (methoxycarbonyl, ethoxycarbonyl, propoxycarbonyl and so on), alkyl groups (methyl, ethyl, propyl, butyl), cycloalkyl groups (cyclohexyl), aryl groups (phenyl), cyano group and nitro group.

It is preferable that the alkyl groups represented by Rk1, Rk2 and Rk3 in the formula (XII) are alkyl groups having from 1 to 5 carbon atoms such as methyl, ethyl, propyl, n-butyl, sec-butyl and t-butyl groups. The alkyl groups Rk1, Rk2 and Rk3 may have substituent(s). As a substituted alkyl group, a perfluoroalkyl group wherein all of the hydrogen atoms in an alkyl group as described above are substituted by fluorine atoms. It is preferable that the alkoxy groups Rk1, Rk2 and Rk3 are alkoxy groups having from 1 to 5 carbon atoms such as methoxy, ethoxy, propoxy and n-butoxy groups.

It is preferable that Rk1, Rk2 and Rk3 represent each a halogen atom or a perfluoroalkyl group and a halogen atom is still preferable. As the halogen atom, a fluorine atom is preferred.

Examples of the divalent linking group represented by $B_1$ include an alkylene group, a cycloalkylene group, an alkenylene group, an arylene group, —O—, —O—$R_{22a}$—, —O—C(=O)—$R_{22b}$—, —C(=O)—O—$R_{22c}$— and —C(=O)—N($R_{22d}$)—$R_{22e}$—. $R_{22a}$, $R_{22b}$, $R_{22c}$ and $R_{22e}$ represent each a single bond, or an alkylene group, a cycloalkylene group, an alkenylene group or an arylene group optionally having an ether group, an ester group, an amido group, a urethane group or an ureido group. $R_{22d}$ represents a hydrogen atom, an alkyl group (preferably having from 1 to 5 carbon atoms), a cycloalkyl group (preferably having from 3 to 10 carbon atoms), an aralkyl group (preferably having from 7 to 10 carbon atoms) or an aryl group (preferably having from 6 to 10 carbon atoms).

Preferable examples of the alkylene group include linear and branched alkylene groups having from 1 to 8 carbon atoms such as methylene, ethylene, propylene, butylene, hexylene and octyelne groups.

Preferable examples of the cycloalkylene group include cycloalkylene groups having from 5 to 12 carbon atoms., e.g., monocyclic residues such as cyclopentylene and cyclohoxylene groups and polycyclic residues such as norbornane and adamantane skeletons.

Preferable examples of the alkenylene group include alkenylene groups having from 2 to 6 carbon atoms such as ethenylene, propenylene and butenylene groups.

Preferable examples of the arylene group include arylene groups having from 6 to 15 carbon atoms such as phenylene, tolylene and naphthylene groups.

Examples of the substituents which may be carried by the divalent linking group $B_1$ include halogen atoms such as a fluorine atom and a chlorine atom and a cyano group and a fluorine atom is preferred.

It is preferable that $B_1$ represents a single bond, a methylene group or an —O— group.

The monovalent organic group represented by $X_1$ may be either a group which is decomposed by the action of an acid (hereinafter also referred to as "acid-decomposable group") or a group which is not decomposed by the action of an acid (hereinafter also referred to as "acid-decomposable group").

As examples of the group which is decomposed by the action of a acid (hereinafter also referred to as "acid-decomposable group"), the same groups as described as examples of the above acid-decomposable group may be cited.

Preferable examples of the acid-decomposable group include acetal groups such as 1-alkoxy-1-ethoxy, 1-alkoxy-1-methoxy and tetrahydropyranyl groups, t-alkyloxycarbonyl, ethoxymethyl, methoxyethoxymethyl and t-alkylcarbonylmethyl groups.

As examples of the acid-undecomposable group, the same groups as the acid-undecomposable group $Y_1$ in the formula (XVIII) as will be described hereinafter.

1a is 0 or 1, 1b is an integer of from 0 to 2, and 1c is an integer of from 0 to 5. It is preferable that 1a is 0, 1b is 0 and 1a is from 0 to 3.

The resin according to the invention may further contain a repeating unit represented by the following formula (XVIII).

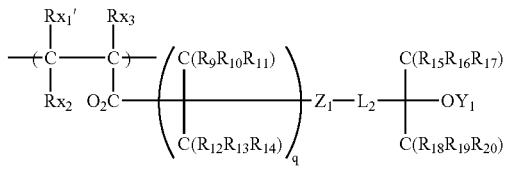

(XVIII)

In the formula (XVIII), $R_{x1}$ to $R_{x3}$ independently represent each a hydrogen atom, a fluorine atom, a chlorine atom, a cyano group or a fluoroalkyl group.

$R_9$ to $R_{20}$ independently represent each a hydrogen atom, a fluorine atom or an alkyl group, provided that at least one of $R_9$ to $R_{14}$ is a fluorine atom while at least one of $R_{15}$ to $R_{20}$ is a fluorine atom.

$Z_1$ represents a phenylene group, a cyclohexylene group, an adamantane residue or a norbornane residue.

$L_2$ represents a single bond or a divalent linking group.

$Y_1$ represents a hydrogen atom or an organic group.

q is 0 or 1.

Preferable examples of a fluoroalkyl group represented by $R_{x1}$ to $R_{x3}$ in the formula (XVIII) include alkyl groups having from 1 to 5 carbon atoms in which at least one hydrogen atom is substituted by a fluorine atom, e.g., trifluoromethyl, difluoromethyl, fluoromethyl, perfluoroethyl and perfluoropropyl groups.

Preferable examples of an alkyl group represented by $R_9$ to $R_{20}$ include alkyl groups having from 1 to 5 carbon atoms such as methyl, ethyl, propyl, n-butyl and sec-butyl groups. The alkyl group of $R_9$ to $R_{20}$ may have substituent(s). As an example of the substituents which may be carried by the alkyl group $R_9$ to $R_{20}$, a fluorine atom can be cited.

$Z_1$ may have substituent(s). Examples of the substituents which can be carried by $Z_1$ include halogen atoms, hydroxyl, alkoxy (preferably having from 1 to 5 carbon atoms) and cyano groups. As the substituents which can be carried by $Z_1$, a fluorine atom and a hydroxyl group are preferable and a fluorine atom is still preferable. In the case where $Z_1$ as a fluorine atom(s) as substituent(s), it preferably has from 1 to 5, still preferably from 1 to 3, fluorine atoms.

As examples of the divalent linking group $L_2$, the same groups as described as examples of the divalent linking group $B_1$ in the formula (XII) maybe cited.

As examples of the organic group represented by $Y_1$, an acid-decomposable group which leaves from an oxygen atom by the action of an acid and an acid-undecomposable group which does not leave from an oxygen group by the action of an acid can be cited.

Examples of the acid-decomposable group represented by $Y_1$ include —$C(R_{36})(R_{37})(R_{38})$, —$C(R_{36})(R_{37})(OR_{39})$, —C(=)—O—C$(R_{36})(R_{37})(R_{38})$, —$C(R_{01})(R_{02})(OR_{39})$ and —C$(R_{01})(R_{02})$—C(=O)—O—$C(R_{36})(R_{37})(R_{38})$.

$R_{36}$ to $R_{39}$ independently represent each an alkyl group, a cycloalkyl group, an aryl group, an aralkyl group or an alkenyl group. $R_{35}$ and $_{37}$ or $R_{36}$ and $R_{39}$ may be bonded to each other to form a ring.

$R_{01}$ and $R_{02}$ independently represent each a hydrogen atom, an alkyl group, a cycloalkyl group, an aryl group, an aralkyl group or an alkenyl group.

Preferable examples of an alkyl group represented by $R_{36}$ to $R_{39}$, $R_{01}$ or $R_{02}$ include alkyl groups having from 1 to 8 carbon atoms such as methyl, ethyl, propyl, n-butyl, sec-butyl, hexyl and octyl groups.

A cycloalkyl group represented by $R_{36}$ to $R_{39}$, $R_{01}$ or $R_{02}$ may be either a monocyclic or polycyclic group. As a monocyclic group, a cycloalkyl group having from 3 to 8 carbon atoms is preferable. Examples thereof include cyclopropyl, cyclobutyl, cyclopentyl, cyclohexyl and cyclooctyl groups. As a polycylic group, a cycloalkyl group having from 6 to 20 carbon atoms is preferable. Examples thereof include adamantyl, norbornyl, isobornyl, camphanyl, dicyclopentyl, α-pinenyl, tricyclodecanyl, tetracylcododecyl and androstanyl groups. A part of the carbon atoms in the cycloalkyl group may be substituted by a hetero atom such as an oxygen atom.

Preferable examples of an aryl group represented by $R_{36}$ to $R_{39}$, $R_{01}$ or $R_{02}$ include aryl groups having from 6 to 10 carbon atoms such as phenyl, naphthyl and anthryl groups.

Preferable examples of an aralkyl group represented by $R_{36}$ to $R_{39}$, $R_{01}$ or $R_{02}$ include aralkyl groups having from 7 to 12 carbon atoms such as benzyl, phenethyl and naphthylmethyl groups.

Preferable examples of an alkenyl group represented by $R_{36}$ to $R_{39}$, $R_{01}$ or $R_{02}$ include alkenyl groups having from 2 to 8 carbon atoms such as vinyl, allyl, butenyl and cyclohexenyl groups.

Examples of the substituent which may be carried by $R_{36}$ to $R_{38}$, $R_{01}$ and $R_{02}$ include alkyl, cycloalkyl, aryl, amino, amido, ureido, urethane, hydroxyl and carboxyl groups, halogen atoms, alkoxy, thioether, acyl, acyloxy, alkoxycarbonyl, cyano and nitro groups.

Examples of the acid-undecomposable group $Y_1$ include alkyl, cycloalkyl, aryl, aralkyl and alkenyl groups which would not leave from an oxygen atom even by the action of an acid.

As an alkyl group of the acid-undecomposable group represented by $Y_1$, an alkyl group having from 1 to 8 carbon atoms is preferable and examples thereof include methyl, ethyl, propyl, n-butyl, sec-butyl, hexyl and octyl groups.

A cycloalkyl group of the acid-undecomposable group represented by $Y_1$ maybe either a monocyclic group or a polycyclic group. As a monocyclic group, a cycloalkyl group having from 3 to 8 carbon atoms is preferable. Examples thereof include cyclopropyl, cyclobutyl, cyclopentyl, cyclohexyl and cyclooctyl groups. As a polycylic group, a cycloalkyl group having from 6 to 20 carbon atoms is preferable. Examples thereof include adamantyl, norbornyl, isobornyl, camphanyl, dicyclopentyl, α-pinenyl, tricyclodecanyl, tetracylcododecyl and androstanyl groups. A part of the carbon atoms in the cycloalkyl group may be substituted by a hetero atom such as an oxygen atom.

It is preferable that an aryl group of the acid-undecomposable group represented by $Y_1$ is an aryl group having from 6 to 10 carbon atoms. Examples thereof include phenyl, naphthyl and anthryl groups.

It is preferable that an aralkyl group of the acid-undecomposable group represented by $Y_1$ is an aralkyl group having from 7 to 12 carbon atoms. Examples thereof include benzyl, phenethyl and naphthylmethyl groups.

it is preferable that an alkenyl group of the acid-undecomposable group represented by $Y_1$ is an alkenyl group having from 2 to 8 carbon atoms is preferable. Examples thereof include vinyl, allyl, butenyl and cyclohexenyl groups.

Examples of the substituent which may be carried by the acid-undecomposable group represented by $Y_1$ include alkyl, cycloalkyl, aryl, amino, amido, ureido, urethane, hydroxyl and carboxyl groups, halogen atoms, alkoxy, thioether, acyl, acyloxy, alkoxycarbonyl, cyano and nitro groups.

A repeating unit represented by the formula (XIX)

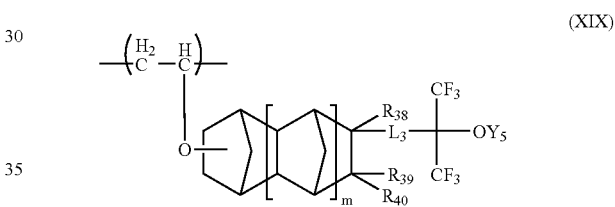

In the formula (XIX), $R_{38}$ to $R_{40}$ independently represent each a hydrogen atom, a halogen atom, a hydroxyl group, a cyano group, an alkyl group, an aryl group, an alkoxy group or an aralkyl group.

$L_3$ represents a single bond or a divalent linking group.

$Y_5$ represents a hydrogen atom or an organic group.

m is 0 or 1.

Examples of a halogen atom represented by $R_{38}$ to $R_{40}$ in the formula (XIX) include fluorine, chlorine, bromine and iodine atoms.

It is preferable that an alkyl group represented by $R_{38}$ to $R_{40}$ is an alkyl group having from 1 to 5 carbon atoms such as methyl, ethyl, propyl, n-butyl, sec-butyl and t-butyl groups.

It is preferable that an aryl group represented by $R_{38}$ to $R_{40}$ is an aryl group having from 6 to 10 carbon atoms such as phenyl, naphthyl and anthryl groups.

It is preferable that an alkoxy group represented by $R_{38}$ to $R_{40}$ is an alkoxy group having from 1 to 5 carbon atoms such as methoxy, ethoxy, propoxy and n-butoxy groups.

It is preferable that an aralkyl group represented by $R_{38}$ to $R_{40}$ is an aralkyl group having from 7 to 12 carbon atoms such as benzyl, phenethyl and naphthylmethyl groups.

Examples of the substituent which may be carried by the alkyl, aryl groups, etc. of $R_{38}$ to $R_{40}$ include alkyl, cycloalkyl, aryl, amino, amido, ureido, urethane, hydroxy and carboxy groups, halogen atoms, alkoxy, thioether, acyl, acyloxy, alkoxycarbonyl, cyano and nitro groups.

It is preferable that $R_{38}$ to $R_{40}$ represent each a hydrogen atom or a halogen atom, still preferably a fluorine atom. It is particularly preferable that $R_{38}$ is a fluorine atom.

Examples of a divalent linking group represented by $L_3$ are the same as those cited with respect to the divalent linking group $B_1$ in the formula (XVIII).

Examples of an organic group represented by $Y_5$ are the same as those cited with respect to the organic group $Y_1$ in the formula (XVIII).

In addition to the above-described repeating units, the resin (A) may have other polymerizable monomer having been polymerized.

Examples of the copolymerizable monomer usable herein include acrylic acid esters, acrylamides, methacrylic acid esters, methacrylamides, allyl compounds, vinyl ethers, vinyl esters, styrenes, crotonic acid esters, dialkyl esters of maleic acid or fumaric acid, maleic anhydride, maleimides, acrylonitrile, methacrylonitrile, maleylonitrile and $C(R_{1a})(R_{2a})=C(R_{3a})(R_{4a})$ (wherein $R_{1a}$ to $R_{4a}$ maybe the same or different and each represents a hydrogen atom, a halogen atom, an optionally halogenated alkyl group (preferably having from 1 to 10 carbon atoms), etc.). It is particularly preferable to use the following acrylic acid esters, acrylonitrile, methacrylonitrile, maleic anhydride, maleimide, N-hydroxymaleimide, N-(t-butoxycarbonyloxy)-maleimide or $C(R_{1a})(R_{2a})=C(R_{3a})(R_{4a})$. In general, use may be made of addition-polymerizable unsaturated compounds which can be copolymerized.

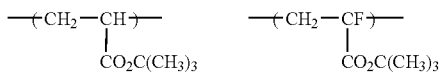

In the resin (A), the repeating unit represented by the formula (I) is used in an amount ranging generally from 5 to 80% by mol, preferably from 7 to 75% by mol and still preferably from 10 to 70% by mol.

In the resin (A), the repeating unit represented by the formula (II) is used in an amount ranging generally from 5 to 80% by mol, preferably from 7 to 70% by mol and still preferably from 10 to 65% by mol.

In the resin (A), the repeating unit represented by the formula (VI) is used in an amount ranging generally from 1 to 70% by mol, preferably from 1 to 65% 1 by mol and still preferably from 50 to 60% by mol.

In, the resin (A), the repeating unit represented by the formula (III) is used in an amount ranging generally from 1 to 40% by mol, preferably from 3 to 35% by mol and still preferably from 5 to 30% by mol.

In the res in (A), the repeating unit represented by the formula (VII) is used in an amount ranging generally from 1 to 40% by mol, preferably from 3 to 35% by mol and still preferably from 5 to 30% by mol.

In the resin (A), the repeating units represented by the formula (VIII) to (X) are each used in an amount ranging generally from 1 to 40% by mol, preferably from 3 to 35% by mol and still preferably from 5 to 30% by mol.

In the resin (A), the repeating units represented by the formulae (XI) to (XIII) are each used in an amount ranging generally from 1 to 40% by mol, preferably from 3 to 35% by mol and still preferably from 5 to 30% by mol.

In the resin (A), the repeating unit represented by the formula (XIV) is used in an amount ranging generally from 1 to 40% by mol, preferably from 3 to 35% by mol and still preferably from 5 to 30% by mol.

In the resin (A), the repeating unit represented by the formula (XV) is used in an amount ranging generally from 1 to 40% by mol, preferably from 3 to 35% by mol and still preferably from 5 to 30% by mol.

In the resin (A), the repeating unit represented by the formula (XVI) is used in an amount ranging generally from 1 to 40% by mol, preferably from 3 to 35% by mol and still preferably from 5 to 30% by mol.

In the resin (A), the repeating unit represented by the formula (XVII) is used in an amount ranging generally from 1 to 40% by mol, preferably from 3 to 35% by mol and still preferably from 5 to 30% by mol.

In the resin (A), the repeating unit represented by the formula (XVXII) is used in an amount ranging generally from 1 to by mol, preferably from 3 to 35% by mol and still preferably from 5 to 30% by mol.

In the resin (A), the repeating unit represented by the formula (XIX) is used in an amount ranging generally from 1 to 40% by mol, preferably from 3 to 35% by mol and still preferably from 5 to 30% by mol.

In addition to the above-described repeating structural units, the resin (A) according to the invention may contain another polymerizable monomer copolymerized therein to improve the performance of the photosensitive resin according to the invention.

Examples of the copolymerizable monomer usable therein include the following ones. For example, use can be made of a compound having an addition-polymerizable unsaturated bond selected form among acrylic acid esters, acrylamides, methacrylic acid esters, methacrylamides, allyl compounds, vinyl ethers, vinyl esters, styrenes, crotonic acid esters and so on other than those cited above.

Next, specific examples of the repeating structural unit represented by the formula (I) will be presented, though the invention is not restricted thereto.

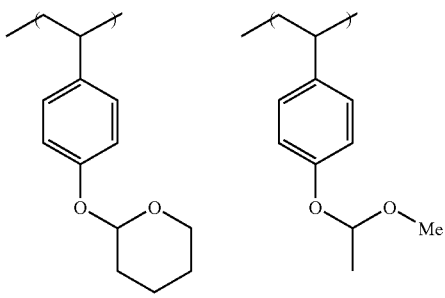

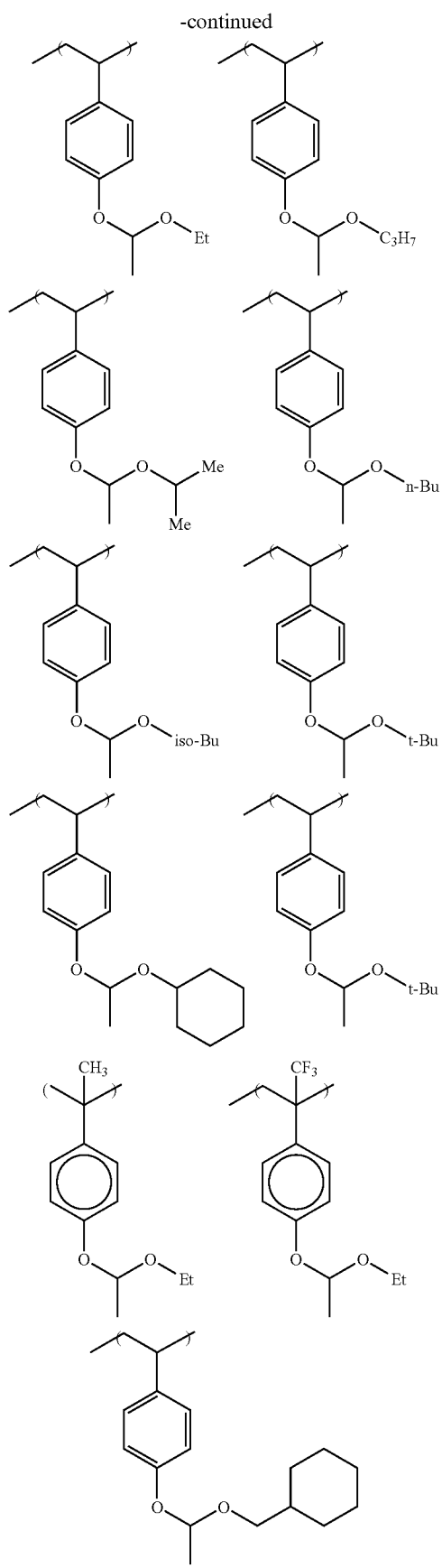
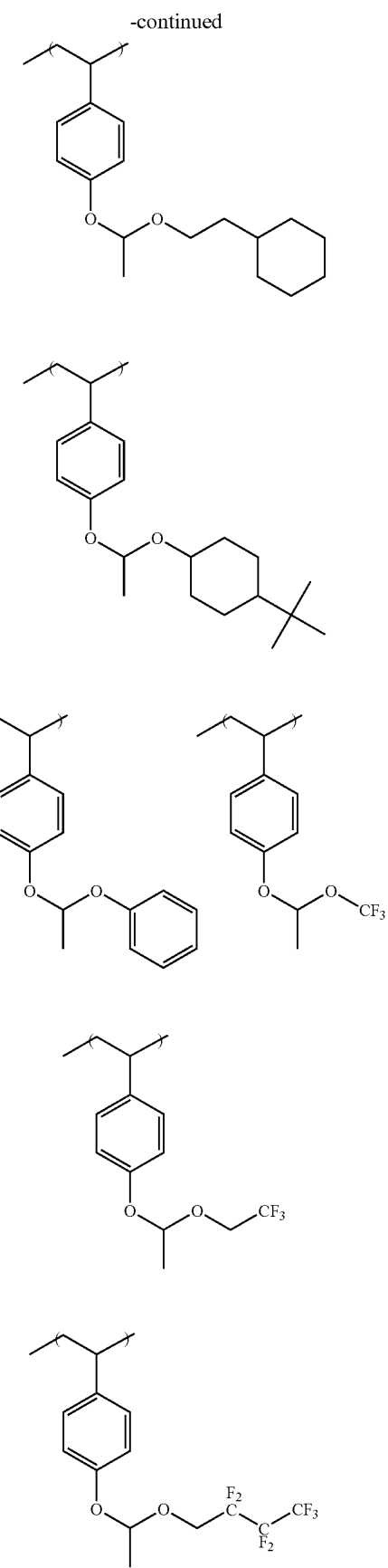

-continued
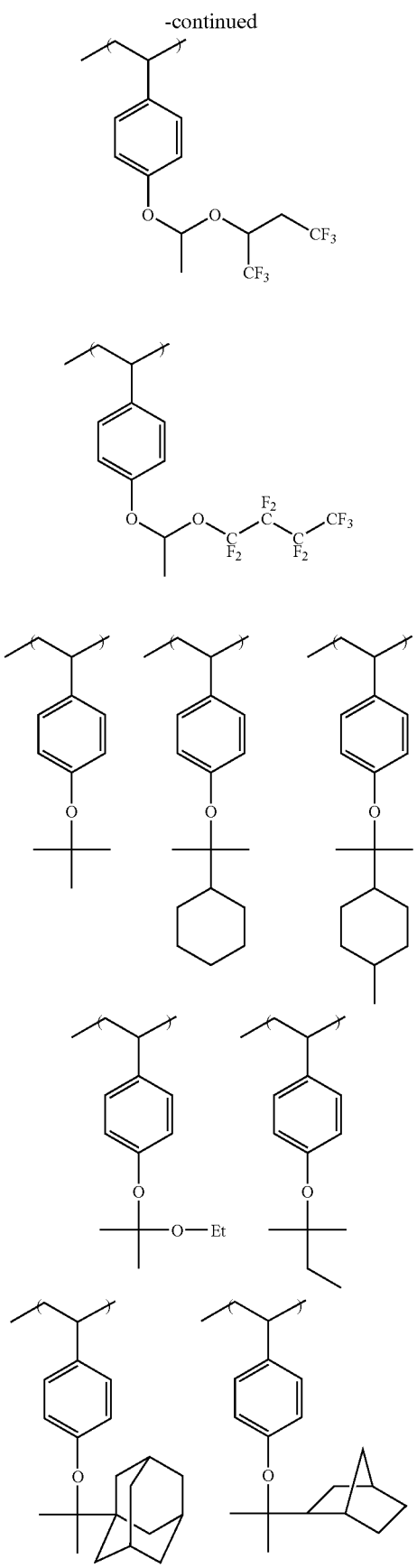
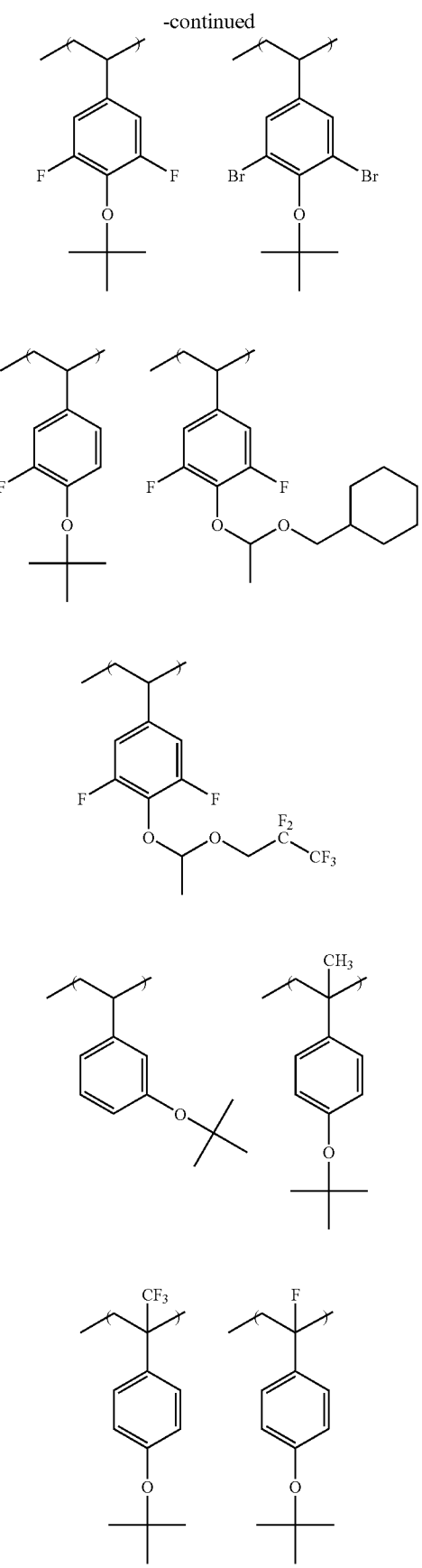

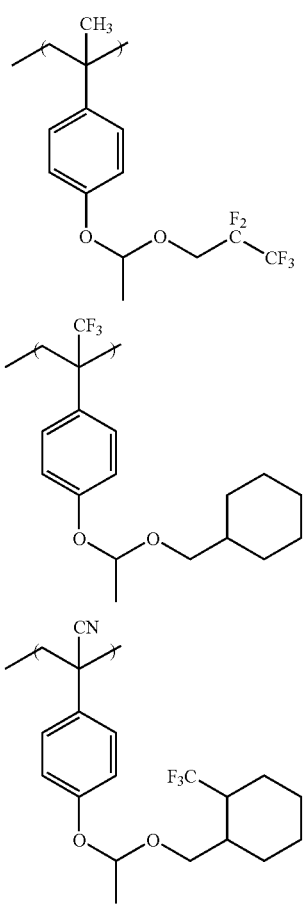

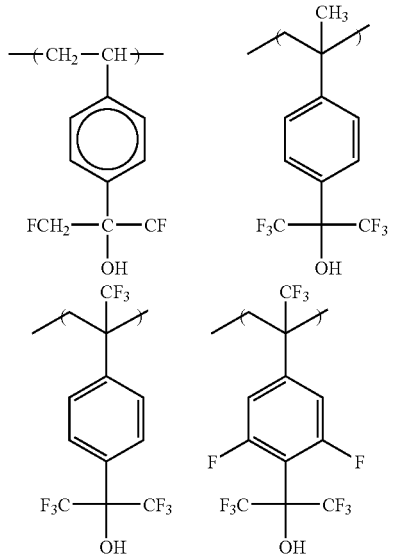

Next, specific examples of the repeating structural unit represented by the formula (III) will be presented, though the invention is not restricted thereto.

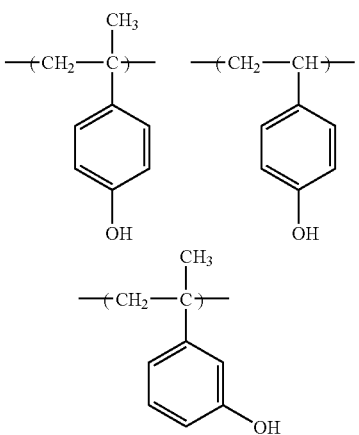

Next, specific examples of the repeating structural unit represented by the formula (II) will be presented, though the invention is not restricted thereto.

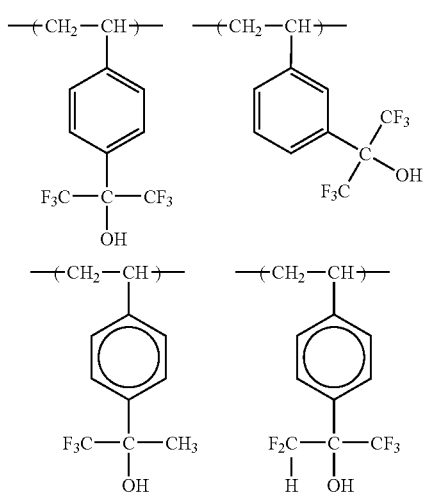

Next, specific examples of the repeating structural unit represented by the formula (VII) will be presented, though the invention is not restricted thereto.

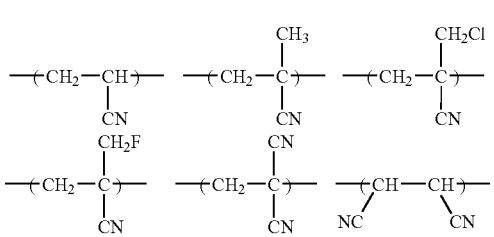

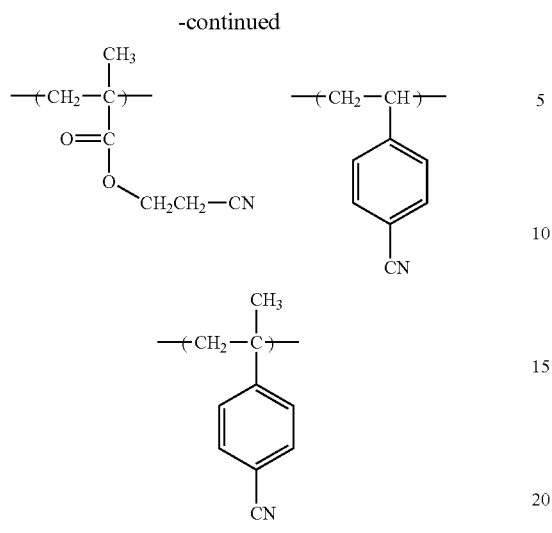
Next, specific examples of the repeating structural units represented by the formulae (VIII) to (XIII) will be presented, through the invention is not restricted thereto.
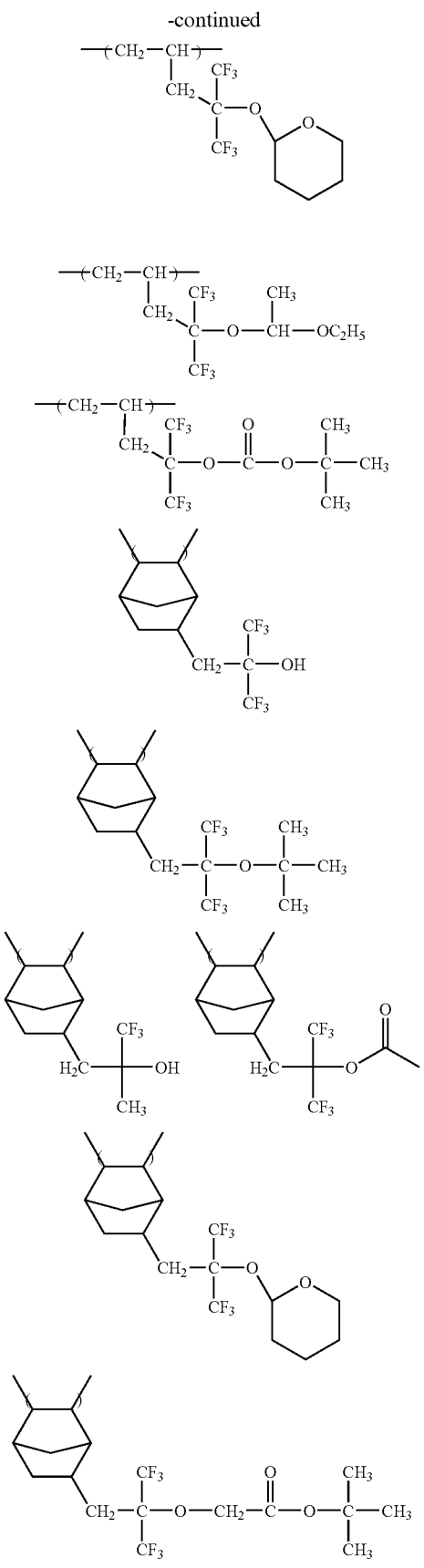

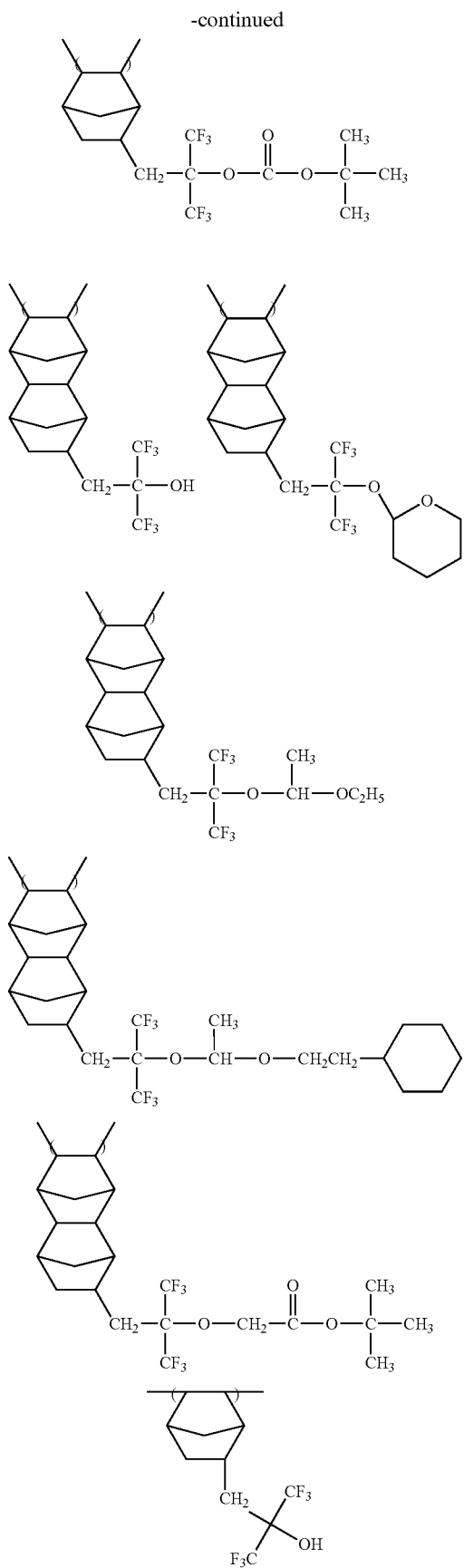
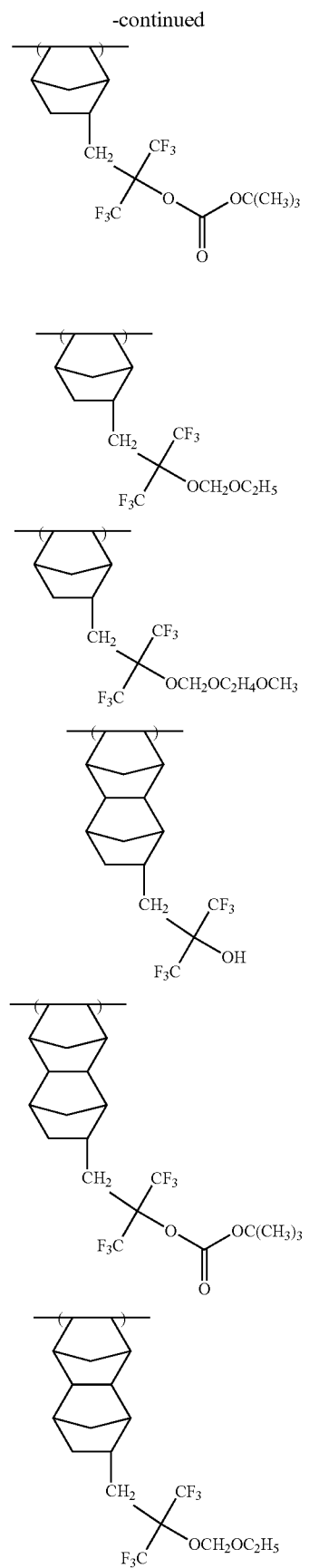

-continued
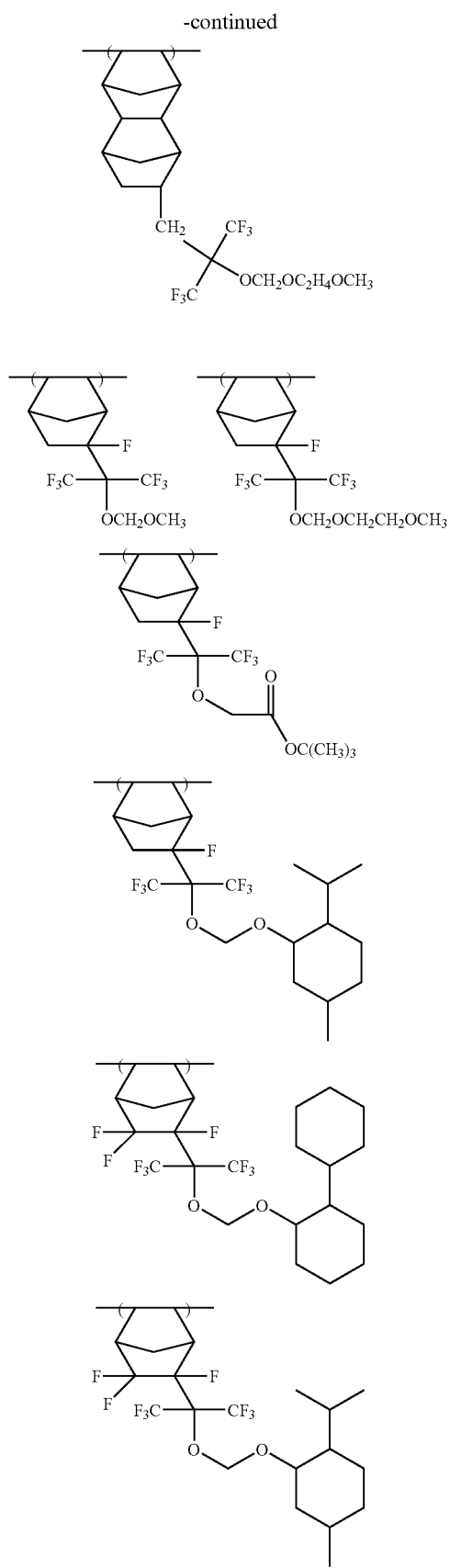
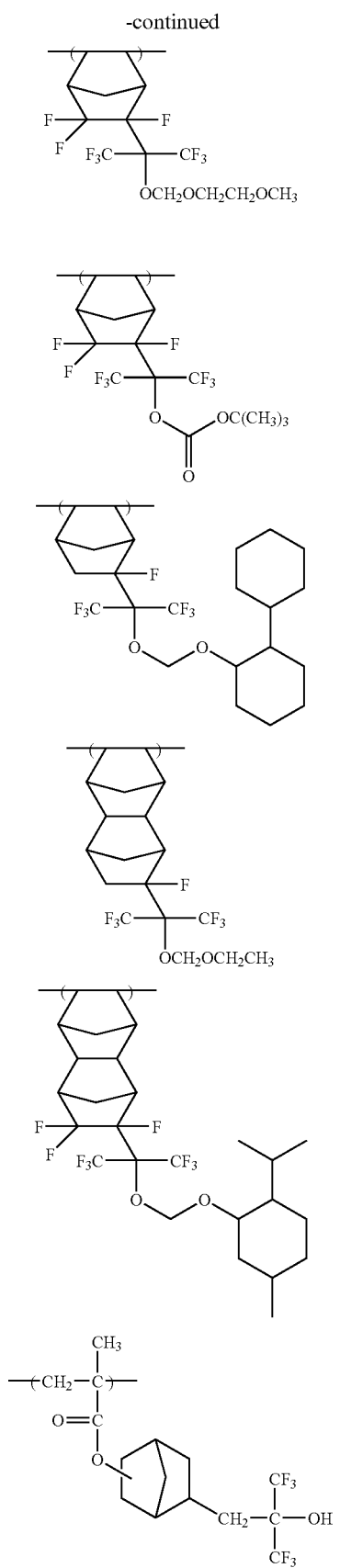

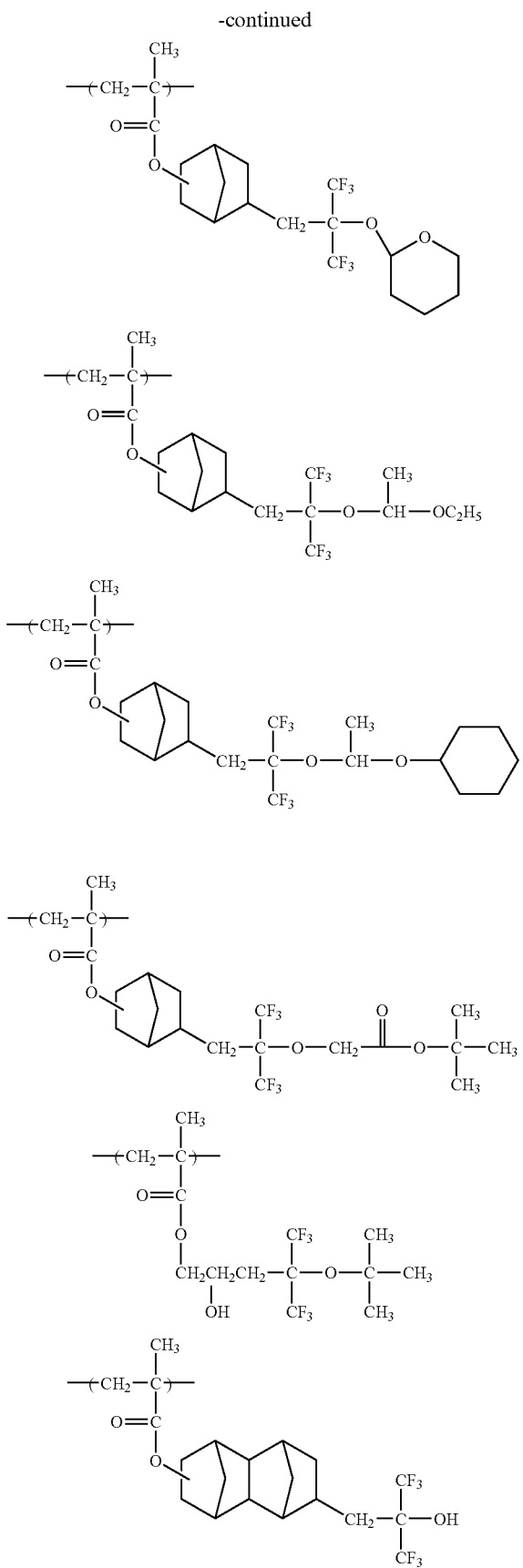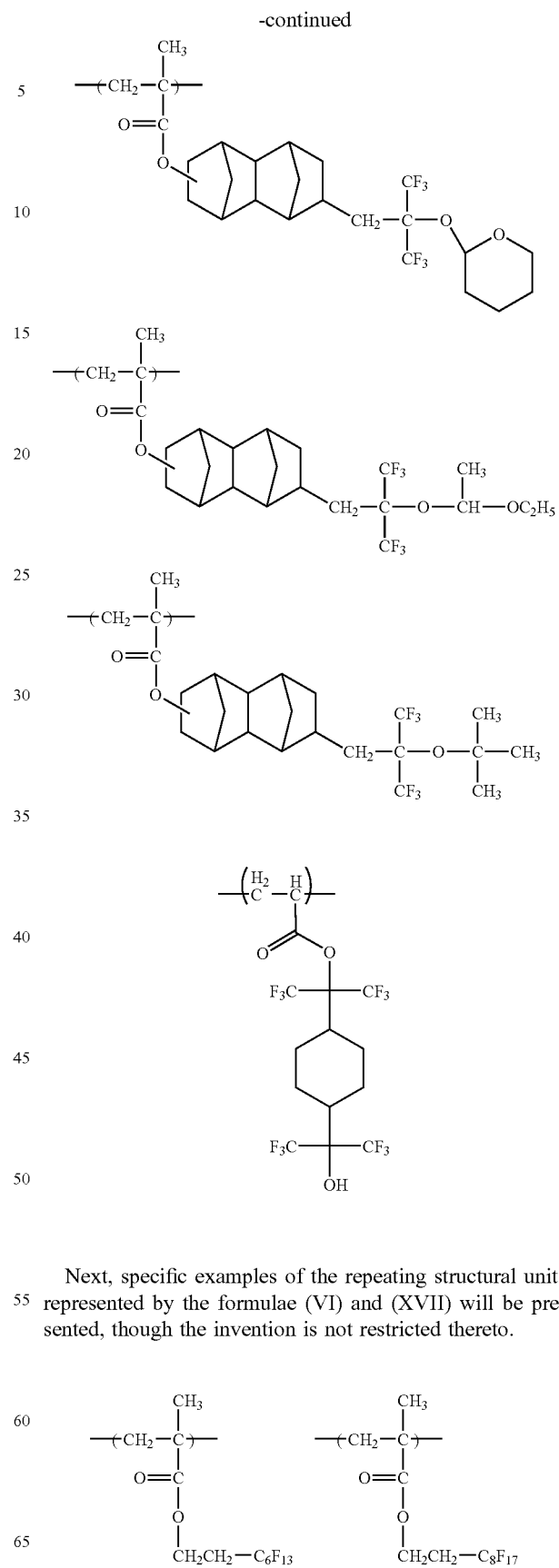
Next, specific examples of the repeating structural units represented by the formulae (VI) and (XVII) will be presented, though the invention is not restricted thereto.

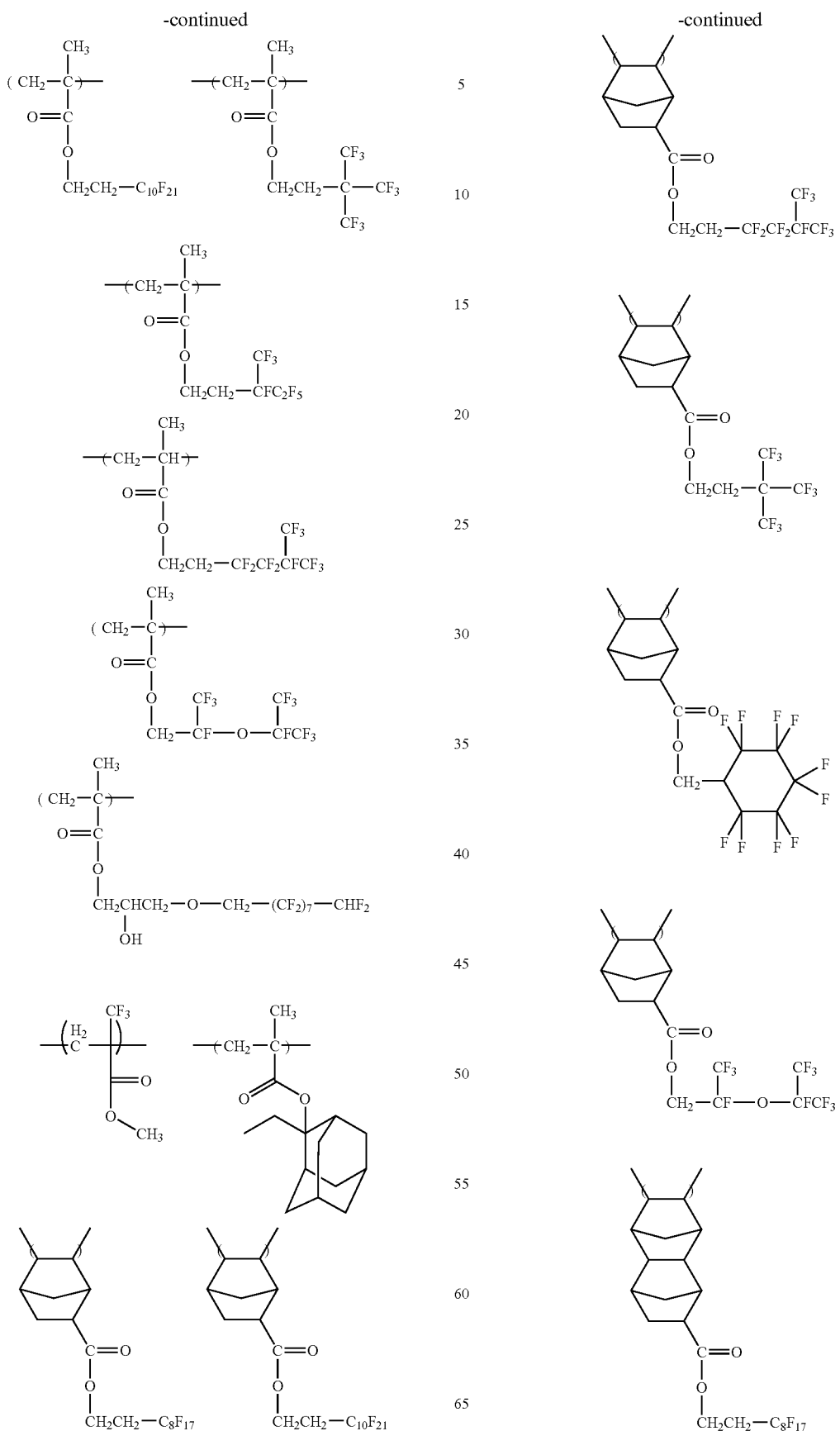

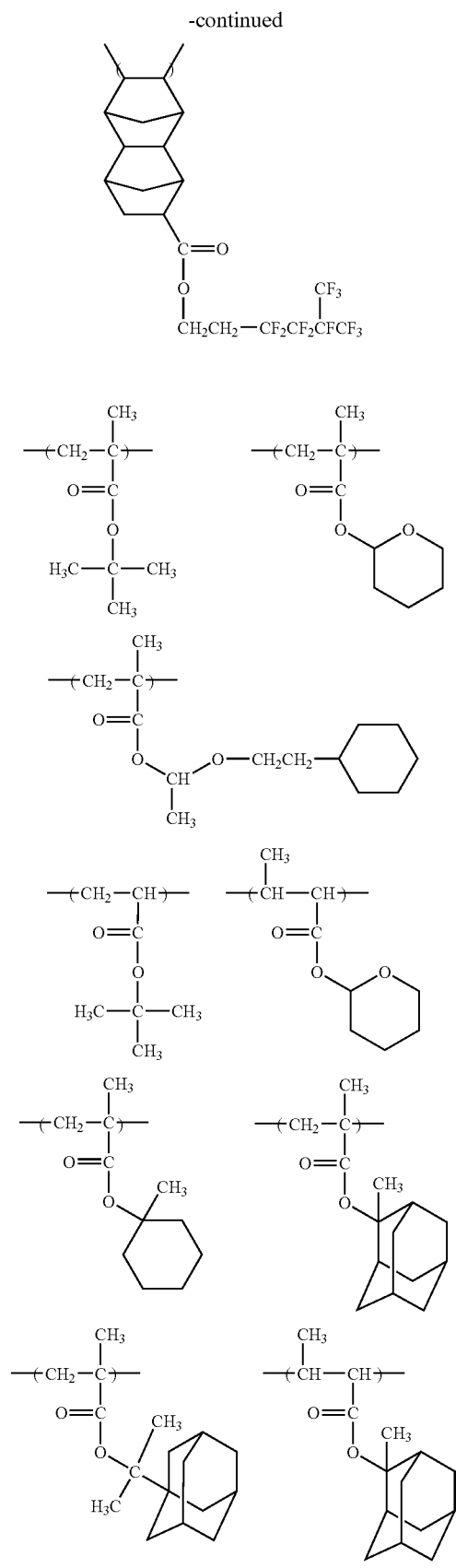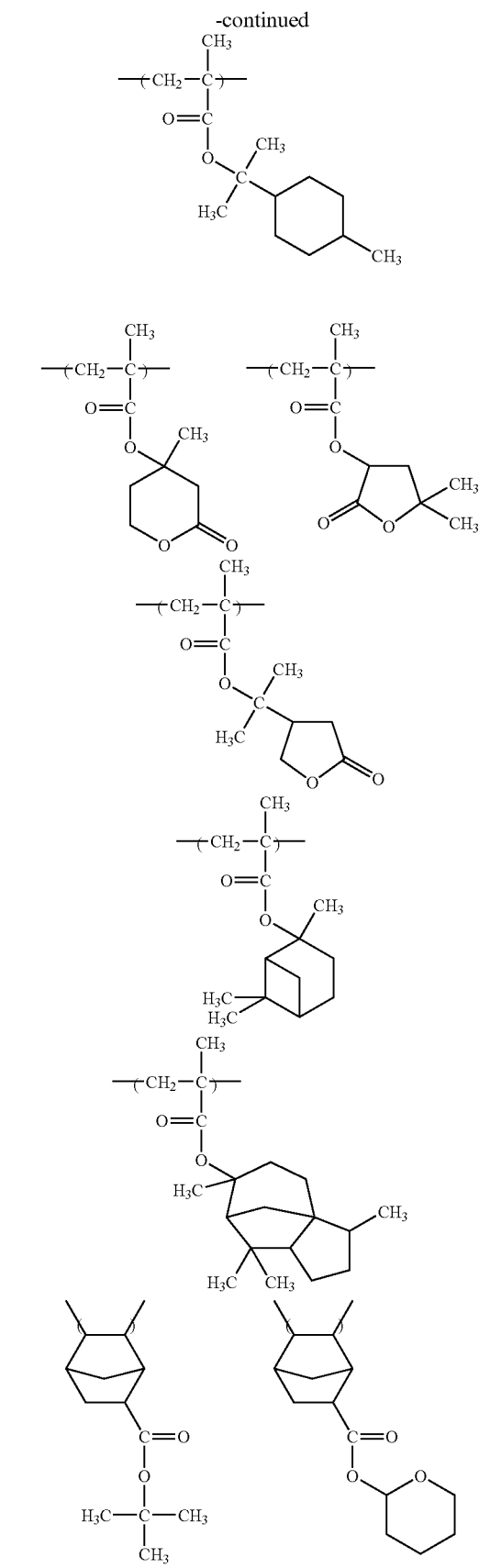

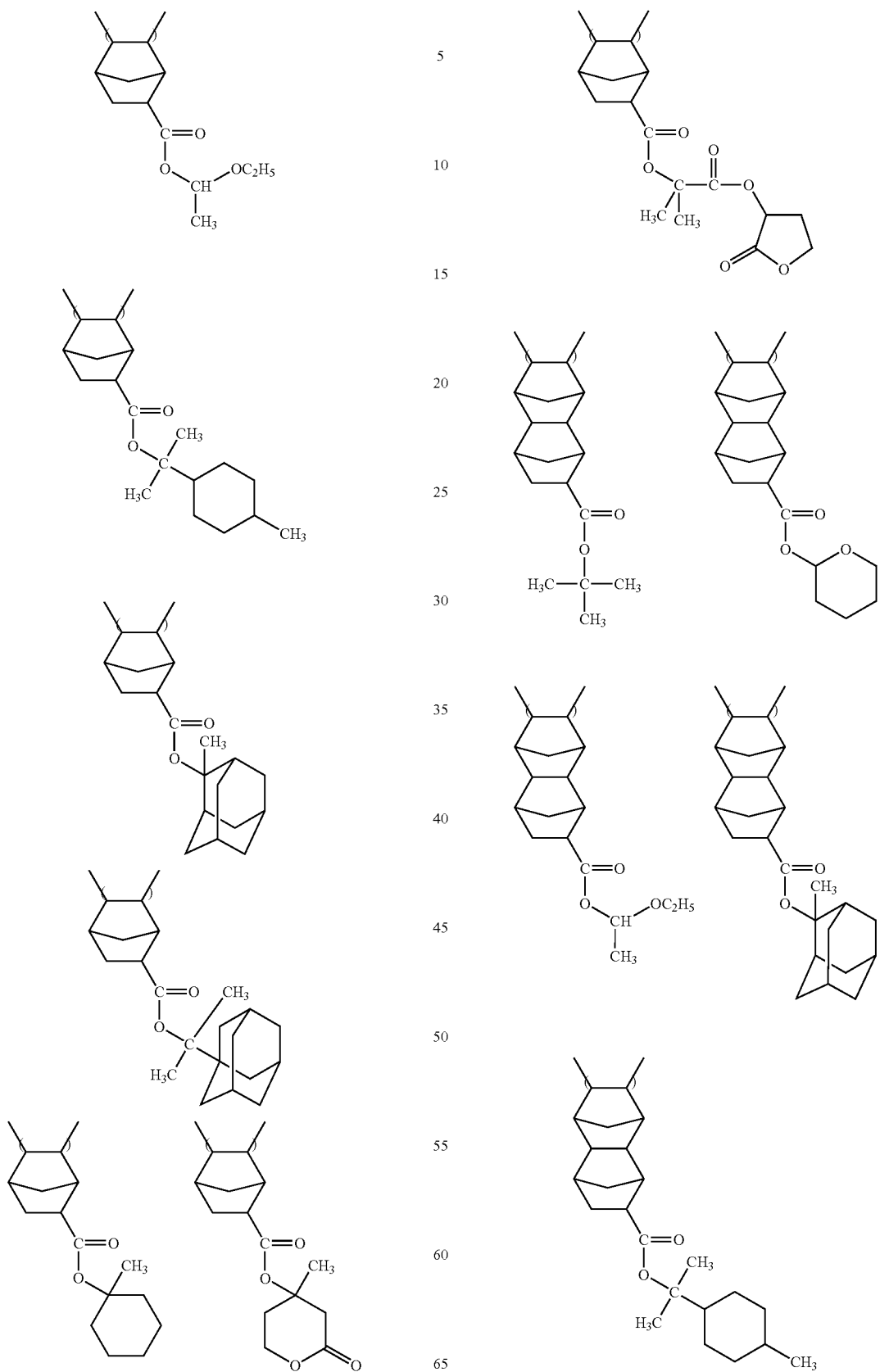

-continued

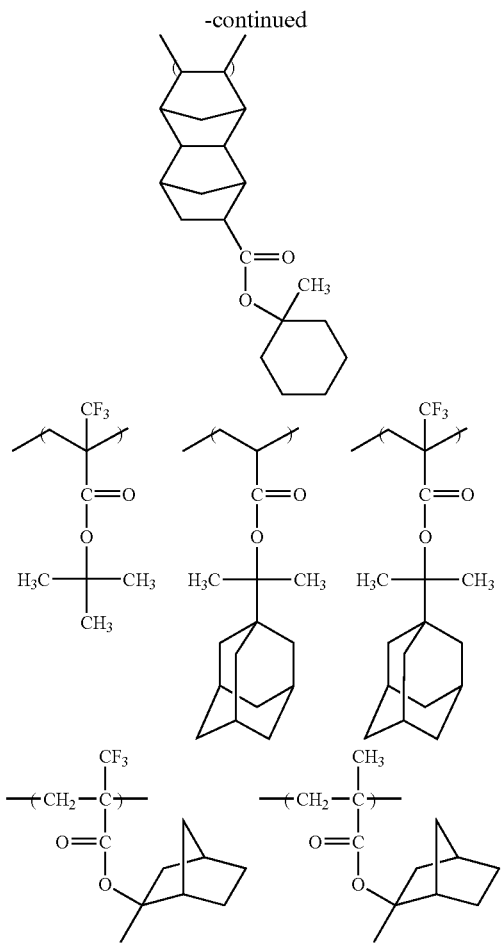

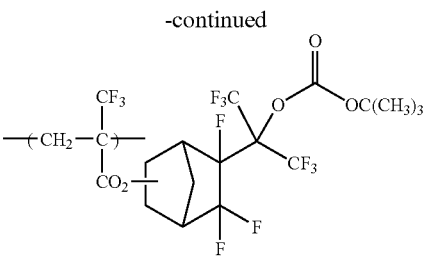

Next, specific examples of the repeating structural unit represented by the formula (XVIII) will be presented, though the invention is not restricted thereto.

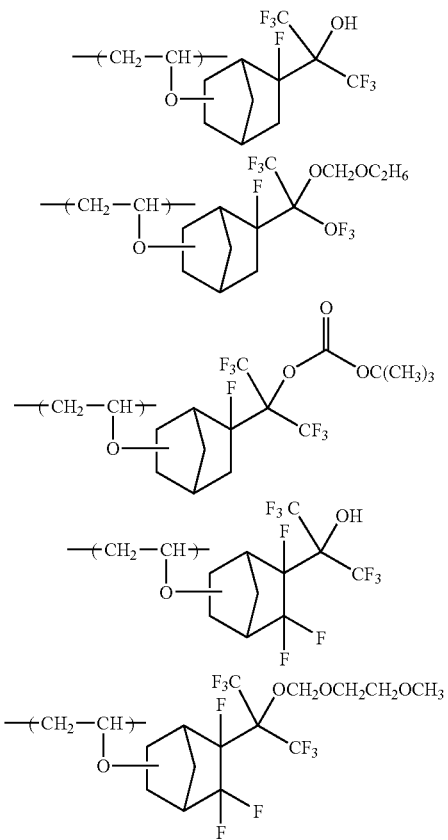

Next, specific examples of the repeating structural unit represented by the formula (XVIII) will be presented, though the invention is not restricted thereto.

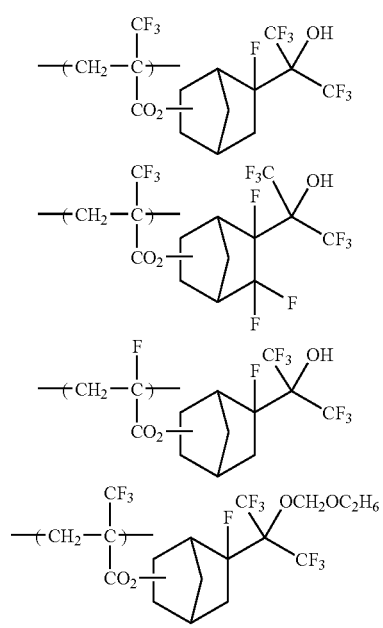

As specific examples of the repeating structural unit represented by the formula (XV), the repeating structural units formed by, for example, the above-described vinyl ethers may be cited.

Either one of the repeating structural units cited above as specific examples or a mixture of two or more thereof may be used.

It is preferable that the weight-average molecular weight of the resin (A) according to the invention having the above-described repeating structural unit ranges from 1,000 to 200,000, still preferably from 3,000 to 20,000. The molecular weight distribution (Mw/Mn) thereof is from 1 to 10, preferably from 1 to 3 and still preferably from 1 to 2. A smaller molecular weight distribution indicates the better resolution, resist shape, smoothness in resist pattern side wall and roughness. The resin (A) according to the invention is employed in an amount of generally from 50 to 99.5% by weight, preferably from 60 to 98% by weight and still preferably from 65 to 95% by weight based on the total solid components in the composition.

[2] Compound Capable of Generating Acid Upon Irradiation with One of Actinic Ray and Radiation (Component (B))

The resist composition according to the invention is characterized by containing a compound capable of generating an acid having a relatively high acid strength and another compound capable of generating an acid having a low acid strength upon irradiation with one of actinic ray and radiation, in particular, an $F_2$ excimer laser beam.

More specifically speaking, the resist composition according to the invention contains, as compounds capable of generating an acid upon irradiation with one of an actinic ray and a radiation, at least two compounds selected from among;

(B1) a compound capable of generating an aliphatic or aromatic sulfonic acid substituted by at least one fluorine atom upon irradiation with one of an actinic ray and a radiation;

(B2) a compound capable of generating an aliphatic or aromatic sulfonic acid containing no fluorine atom upon irradiation with one of an actinic ray and a radiation;

(B3) a compound capable of generating an aliphatic or aromatic carboxylic acid substituted by at least one fluorine atom upon irradiation with one of an actinic ray and a radiation; and (B4) a compound capable of generating an aliphatic or aromatic carboxylic acid containing no fluorine atom upon irradiation with one of an actinic ray and a radiation.

Because of the generation of two acids having different acid strengths upon irradiation with one of an actinic ray and a radiation, the deprotection reaction of the acid-decomposable group in the resin around the interface between actinic ray or radiation-irradiated part/unirradiated part (low-energy irradiation area) can be controlled. As a result, the contrast in image formation can be elevated and, in its turn, a relief image having improved rectangular properties and line edge roughness can be obtained.

The components (B1) to (B4) can be selected from among generally employed compounds capable of decomposing and generating an acid upon irradiation with one of an actinic ray and a radiation (photo-acid generators).

That is to say, use can be made of a compound or mixtures thereof selected from among compounds generating an acid upon irradiation with publicly known rays (ultraviolet rays of 400 to 200 nm, far ultraviolet rays, particularly preferably g, h and i rays, KrF excimer laser beam, ArF excimer laser beam, $F_2$ excimer laser beam, electron beams, X-ray, molecular beams or ion beams) which are employed in photo-initiators for cationic photopolymerization, photo-initiators for radical photopolymerization, photodecolouring agents for dyes, photodiscolouring agents and microresists.

Examples of such compounds include onium salts such as diazonium salts described in S. I. Schlesinger, Photogr. Sci. Eng., 18, 387 (1974), T. S. Bal et al., Polymer, 21, 423 (1980), etc., ammonium salts described in U.S. Pat. No. 4,069,055, U.S. Pat. No. 4,069,056, U.S. Pat. No. Re 27,992, JP-A-3-140140, etc., phosphonium salts described in D. C. Necker et al., Macromolecules, 17, 2468 (1984), C. S. Wen et al., Teh, Proc. Conf. Rad. Curing ASIA, p. 478, Tokyo Oct (1988), U.S. Pat. No. 4,069,055, U.S. Pat. No. 4,069,056, etc., iodonium salts described in J. V. Crivello et al., Macromolecules, 10(6), 1301 (1977), Chem. & Eng. News, Nov. 28, p. 31 (1988), EP 104,143, EP 339,049, EP 410,201, JP-A-2-150848, JP-A-2-196514, etc., sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al, Polymer Bull., 14, 279 (1985), J. V. Crivello et al., Macromolecules, 14(5), 1141 (1981), J. V. Crivello et al., J. Polymer Sci., Polymer Chem. Ed., 17, 2877 (1979), EP 370,693, EP 161,811, EP410,201, EP 339,049, EP233, 567, EP297,443, EP297,442, U.S. Pat. No. 4,933, 377, U.S. Pat. No. 3,902,114, U.S. Pat. No. 4,760,013, U.S. Pat. No. 4,734,444, U.S. Pat. No. 2,833,827 German Patent 2,904,626, German Patent 3,604,580, German Patent 3,604, 581, etc., selenonium salts described in J. V. Crivello et al., Macromoleclues; 10 (6), 1307 (1977), J. V. Crivello et al., J. Polymer Sci., Polymer Chem. Ed., 17, 1047 (1979), etc., and arsonium salts described in C. S. Wen et al., Teh, Proc. Conf. Rad. Curing ASIA, p. 478 Tokyo, Oct. (1988), etc., organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, JP-A-53-298339, etc., organic metal/organic halides described in K. Meier et al., J. Rad. Curing, 13 (4), 26 (1986), T. P. Gill et al., Inorg. Chem., 19 3007 (1980), D. Astruc, Acc. Chem. Res., 19(12), 377 (1896), JP-A-2-1614445, etc, photo-acid generators having O-nitrobenzyl type protecting group described in S. Hayase et al., J. Polymer Sci., 25, 753 (1987), E. Reichmanis et al., J. Polymer Sci., Polymer Chem. Ed., 23, 1 (1985), Q. Q. Zhuetal, J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin 1,1695 (1975), M. Rudinstein et al. Tetrahedron Lett., (17), 1445 (1975), J. W. Walker et al., J. Am. Chem. Soc., 110, 7170 (1988), S. C. Busian et al., J. Imaging Technol., 11(4), 191 (1985), H, M, Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130(6), F. M. Houlihan et al., Macromolecules, 21, 2001 (1988), EP 0290,750, EP046,083, EP156,535, EP271,851, EPO, 388, 343, U.S. Pat. No. 3,901,710, JP-A-60-198538, JP-A-53-133022, etc., photo-decomposable compounds photo-decomposable generating sulfonic acid typified by iminosulfonate, etc. described in M. TUNOOKA et al., Polymer Preprints Japan, 35 (8) G. Berner et al., J. Rad. Curing, 13(4), W. J. Mijs et al., Coating Technol., 55(697), 45 (1983), Akzo, H. Adachi et al., Polymer Preprints, Japan, 37(3), EP 0199,672, EP. 84515, EP 044,115, EP 618,564, EP 0101,122, U.S. Pat. No. 4,371,605, U.S. Pat. No. 4,431,774, JP-A-64-18143, JP-A-2-245756, JP-A-3-140109, etc., and disulfone compounds described in JP-A-61-166544, etc.

The acid generated from the components (B1) to (B-4) upon irradiation with one of an actinic ray and a radiation is preferably an organic acid. The components (B1) to (B4) are preferably onium salts.

Next, the components (B11) to (B4) will be described in greater detail.

As examples of the compound (B1) capable of generating a fluorine-containing sulfonic acid upon irradiation with one of an actinic ray and a radiation, iodonium salts represented by the following formula (PAG1) and sulfonium salts represented by the formula (PAG2) may be cited.

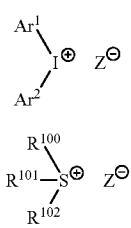
(PAG1)

(PAG2)

Ar¹ and Ar² independently represent each an aryl group. R$^{100}$, R$^{101}$ and R$^{102}$ independently represent each an alkyl group, a cycloalkyl group or an aryl group.

Z⁻ represents a sulfonate anion having at least one fluorine atom.

Two members of R$^{100}$, R$^{101}$ and R$^{102}$ and Ar¹ and Ar² may be bonded each via a single bond or a substituent.

As an aryl group of R$^{100}$, R$^{101}$ and R$^{102}$ and Ar¹ and Ar², an aryl group having from 6 to 14 carbon atoms is preferable. As an alkyl group or a cycloalkyl group thereof, an alkyl group or a cycloalkyl group having from 1 to a carbon atoms is preferable.

Preferable examples of the substituent of the aryl group include alkoxy groups having from 1 to 8 carbon atoms, alkyl groups having from 1 to 8 carbon atoms, alkoxycarbonyl groups having from 2 to 9 carbon atoms, alkylcarbonylamino groups having from 2 to 9 carbon atoms, a nitro group, a carboxyl group, a hydroxy group, halogen atoms and a phenylthio group. Preferable examples of the substituent of the alkyl group and the cycloalkyl group include alkoxy groups having from 1 to 8 carbon atoms, aryl groups having from 5 to 14 carbon atoms, arylcarbonyl groups having from 6 to 15 carbon atoms, a carboxyl group and halogen atoms.

Preferable examples of the sulfonate anion Z⁻ include aliphatic hydrocarbons having from 1 to 20 carbon atoms and aromatic hydrocarbons having from 5 to 20 carbon atoms each having at least one fluorine atom. Such a group may have a substituent. Examples of the substituent include optionally fluorine-substituted alkoxy groups having from 1 to 10 carbon atoms, optionally fluorine-substituted alkoxycarbonyl groups having from 2 to 11 carbon atoms, a phenylamino group, a phenylcarbonyl group, halogen atoms and a hydroxyl group. In the case of an aromatic hydrocarbon, alkyl groups and cycloalkyl groups having from 1 to 15 carbon atoms may be cited as further examples of the substituent.

Concerning an aliphatic sulfonate anion, an anion having a fluorine atom on the x-carbon atom of the sulfonate has a particularly high acid strength. A perfuloro aliphatic sulfonate has a further high acid strength.

Next, specific examples thereof will be presented, though the invention is not restricted thereto

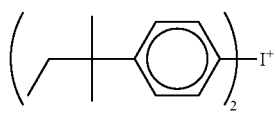 CF$_3$SO$_3^-$ (VI-1)

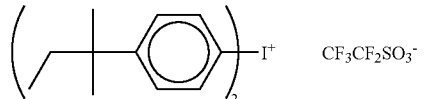 CF$_3$CF$_2$SO$_3^-$ (VI-2)

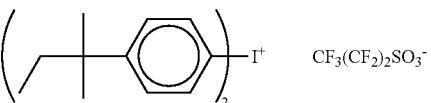 CF$_3$(CF$_2$)$_2$SO$_3^-$ (VI-3)

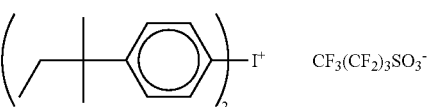 CF$_3$(CF$_2$)$_3$SO$_3^-$ (VI-4)

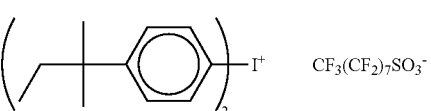 CF$_3$(CF$_2$)$_7$SO$_3^-$ (VI-5)

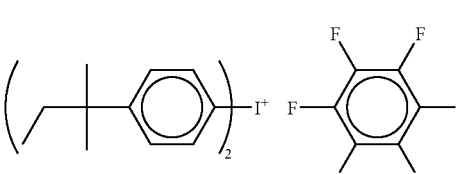 (VI-6)

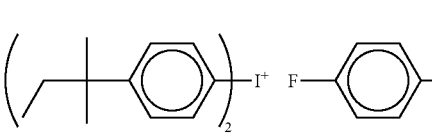 (VI-7)

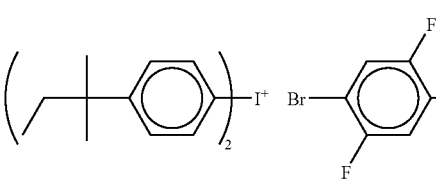 (VI-8)

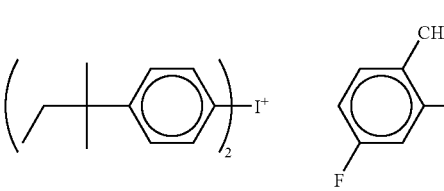 (VI-9)

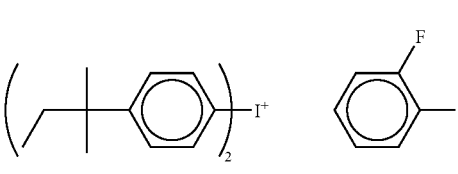 (VI-10)

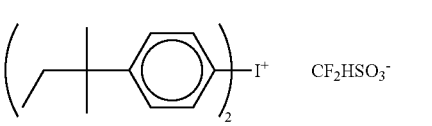 CF$_2$HSO$_3^-$ (VI-11)

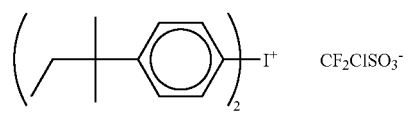 (VI-12) CF$_2$ClSO$_3^-$

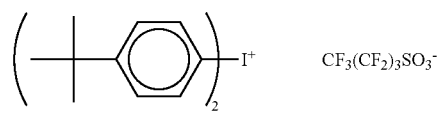 (VI-13) CF$_3$(CF$_2$)$_3$SO$_3^-$

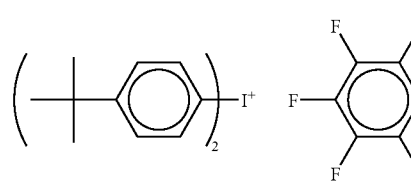 (VI-14)

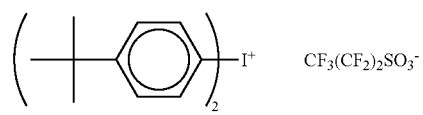 (VI-15) CF$_3$(CF$_2$)$_2$SO$_3^-$

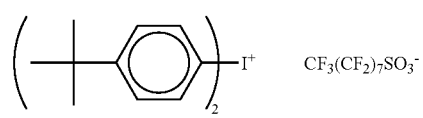 (VI-16) CF$_3$(CF$_2$)$_7$SO$_3^-$

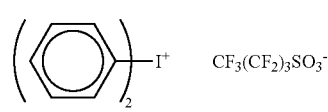 (VI-17) CF$_3$(CF$_2$)$_3$SO$_3^-$

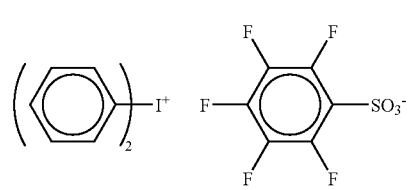 (VI-18)

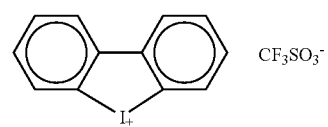 (VI-19) CF$_3$SO$_3^-$

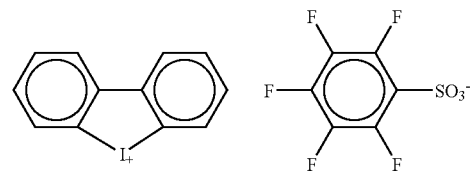 (VI-20)

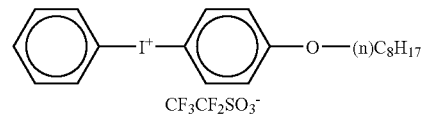 (VI-21) CF$_3$CF$_2$SO$_3^-$

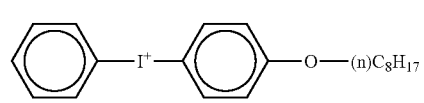 (VI-22)

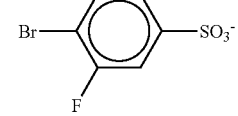 (VI-13-like Br/F structure)

 (VI-23) CF$_3$(CF$_2$)$_3$SO$_3^-$

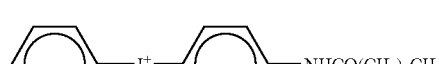 (VI-24) CF$_3$(CF$_2$)$_7$SO$_3^-$

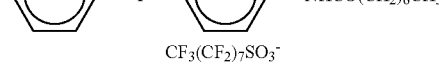 (VI-25) CF$_3$(CH$_2$)$_2$SO$_3^-$

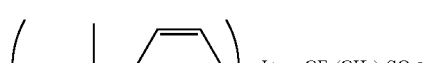 (VI-26) CF$_3$CH$_2$CH(CH$_3$)SO$_3^-$

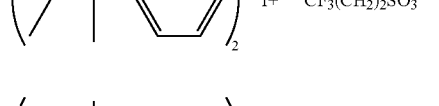 (VI-27) CF$_3$CH$_2$CH(CF$_3$)SO$_3^-$

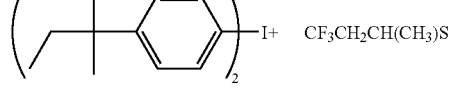 (VI-28) CH$_3$(CF$_2$)$_7$SO$_3^-$

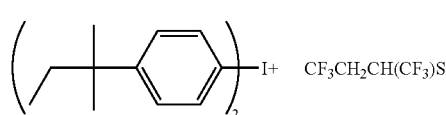 (VI-29) CF$_3$(CF$_2$)$_2$O(CF$_2$)$_2$SO$_3^-$

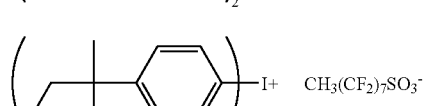 (VI-30) CF$_3$(CF$_2$)$_2$OCF(CF$_3$)SO$_3^-$

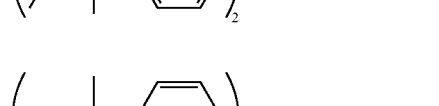 (VI-31) F[CF(CH$_3$)CF$_2$O]$_2$CF(CF$_3$)SO$_3^-$

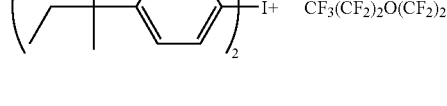 (VI-32) F[CF(CF$_3$)CF$_2$O]$_2$CF(CF$_3$)SO$_3^-$

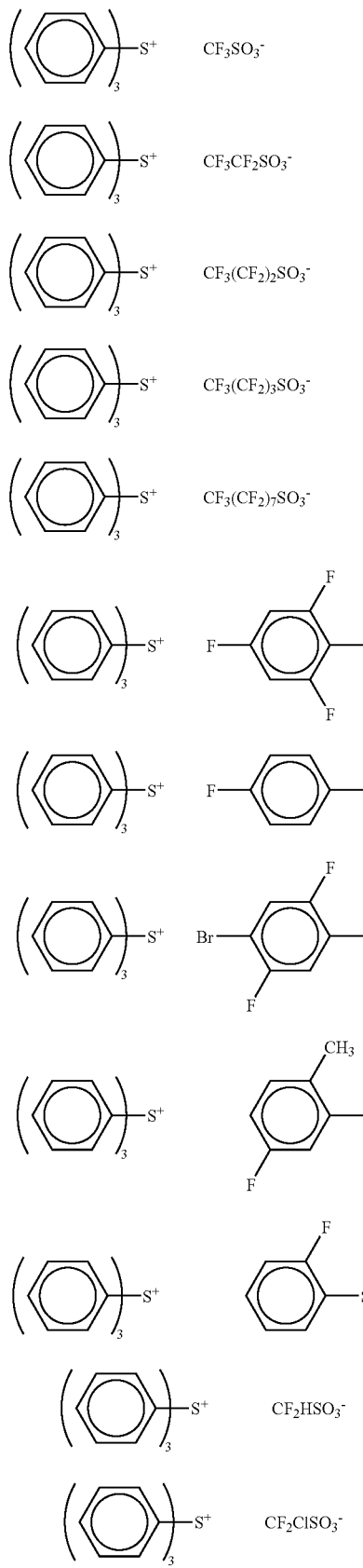
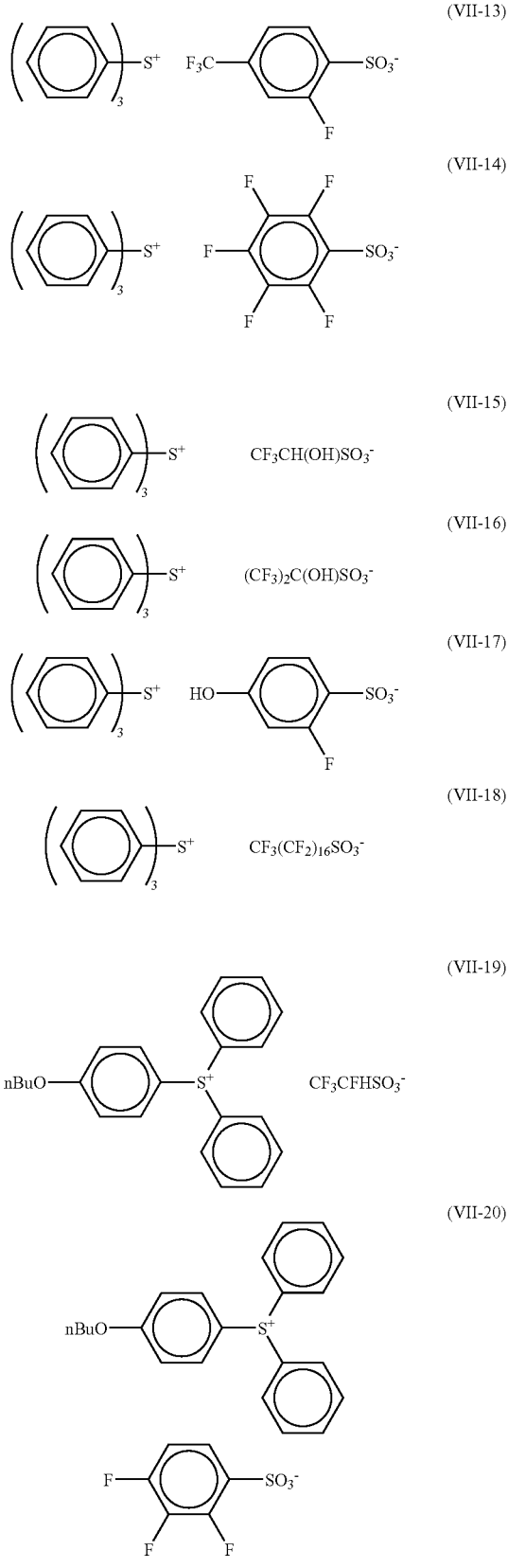

-continued
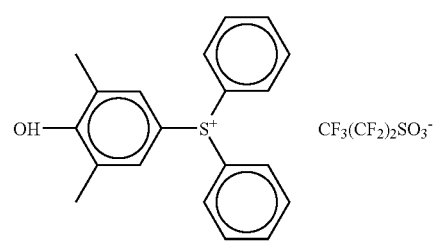 (VII-21)
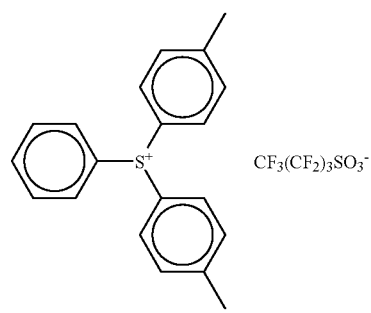 (VII-22)
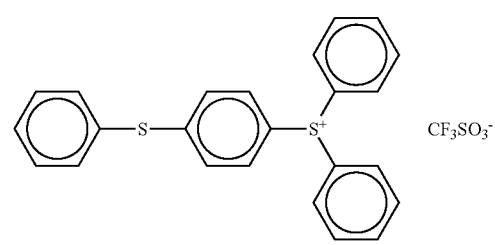 (VII-23)
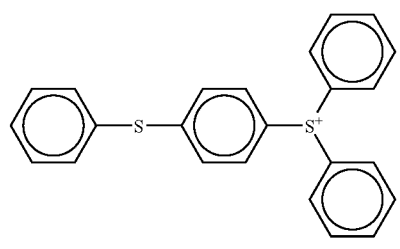 (VII-24)
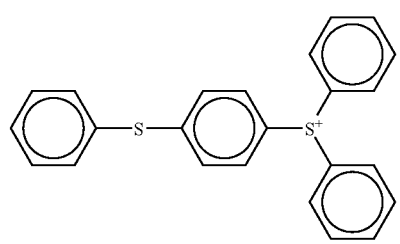 (VII-25)
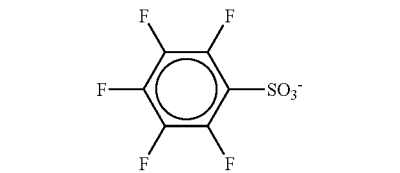
-continued
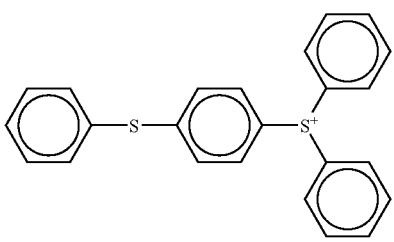 (VII-26)
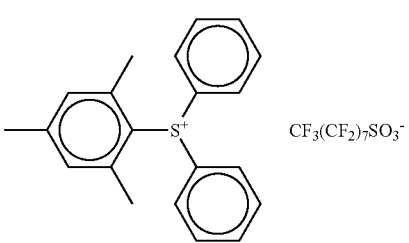 (VII-27)
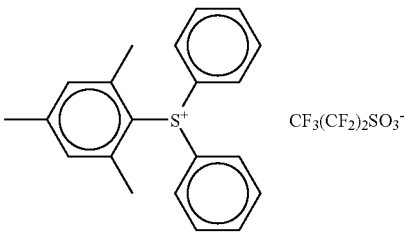 (VII-28)
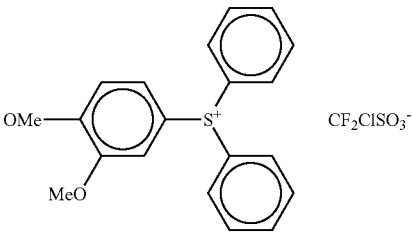 (VII-29)
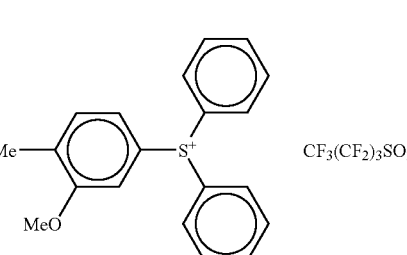 (VII-30)
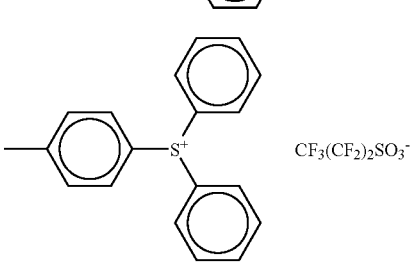 (VII-31)

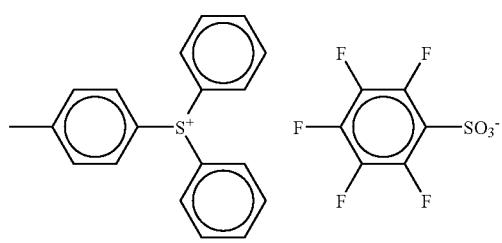
(VII-32)
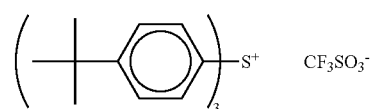
(VII-33)
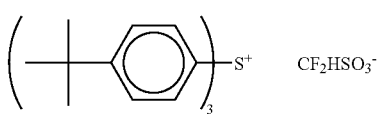
(VII-34)
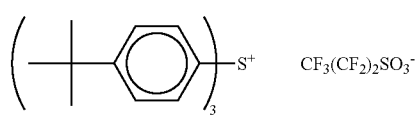
(VII-35)
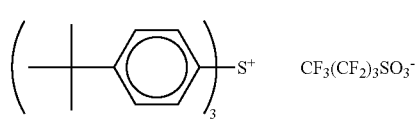
(VII-36)
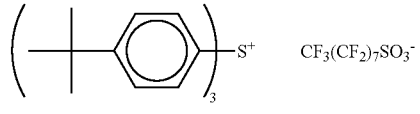
(VII-37)
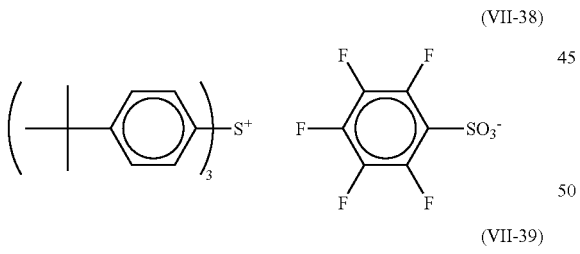
(VII-38)
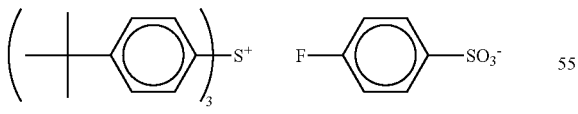
(VII-39)
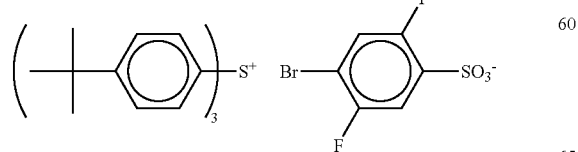
(VII-40)
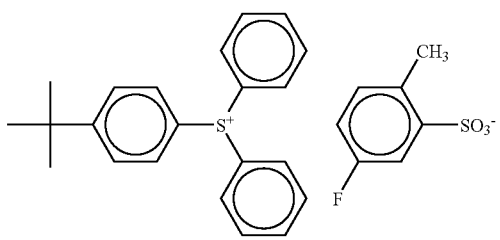
(VII-41)
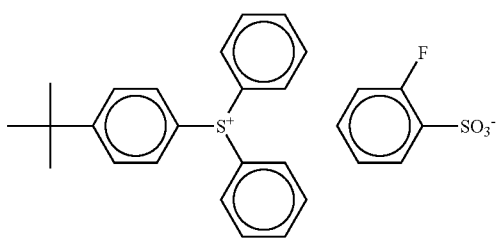
(VII-42)
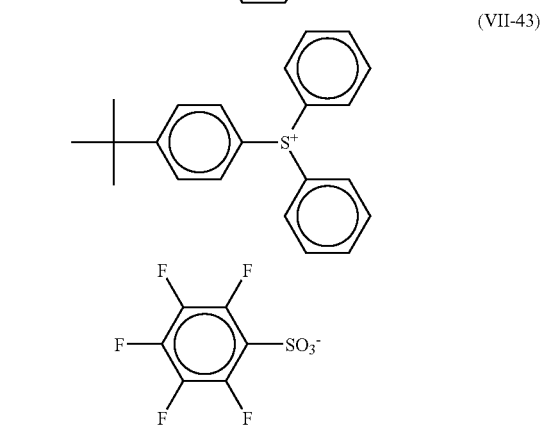
(VII-43)
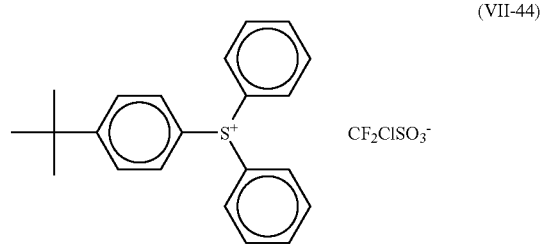
(VII-44)
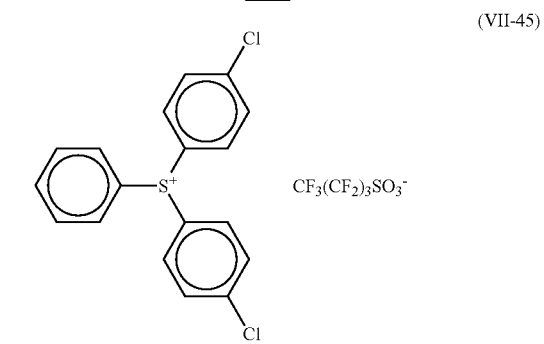
(VII-45)

-continued (VII-46)
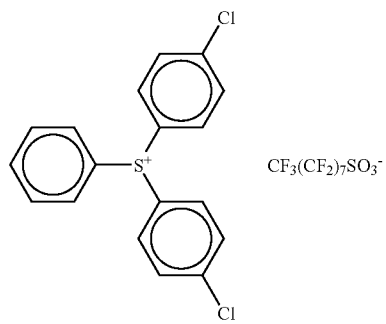

(VII-47)
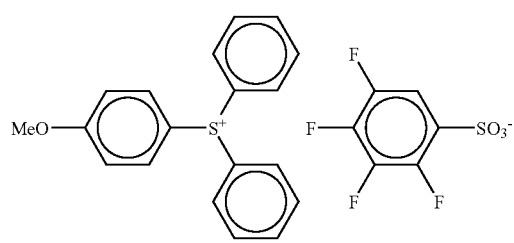

(VII-48)
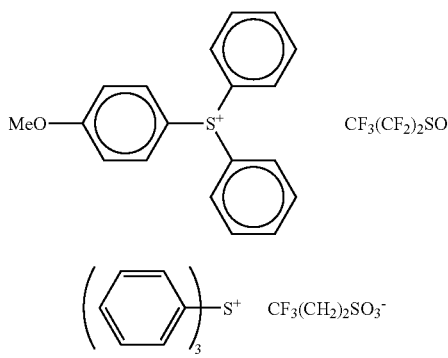

(VII-49)
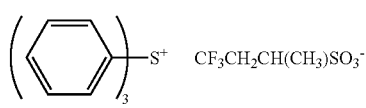

(VII-50)
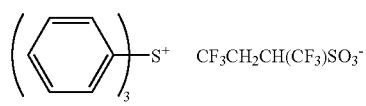

(VII-51)
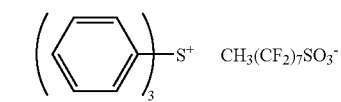

(VII-52)
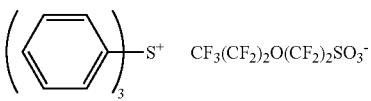

(VII-53)
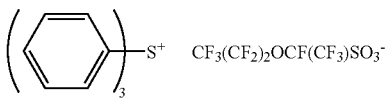

(VII-54)

-continued (VII-55)
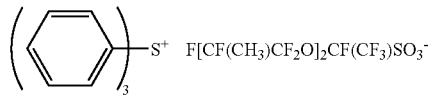

(VII-56)
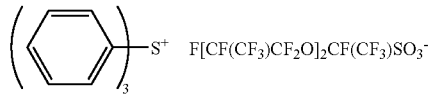

As examples of the compound (B2) capable of generating a fluorine-free sulfonic acid upon irradiation with one of an actinic ray and a radiation, iodinium salts and sulfonium salts of the above formulae (PAG1) and (PAG2) wherein $Z^-$ is fluorine-free sulfonate anion may be cited.

As specific examples thereof, the following compounds will be presented, though the invention is not restricted thereto.

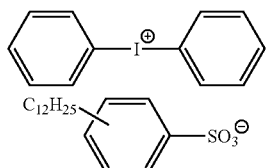

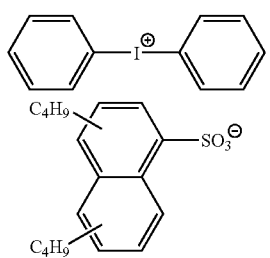

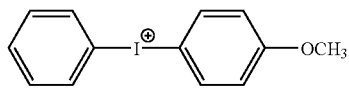

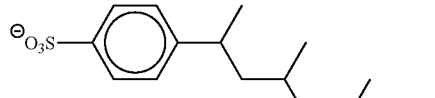

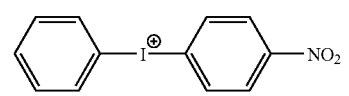

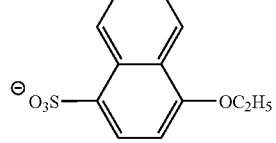

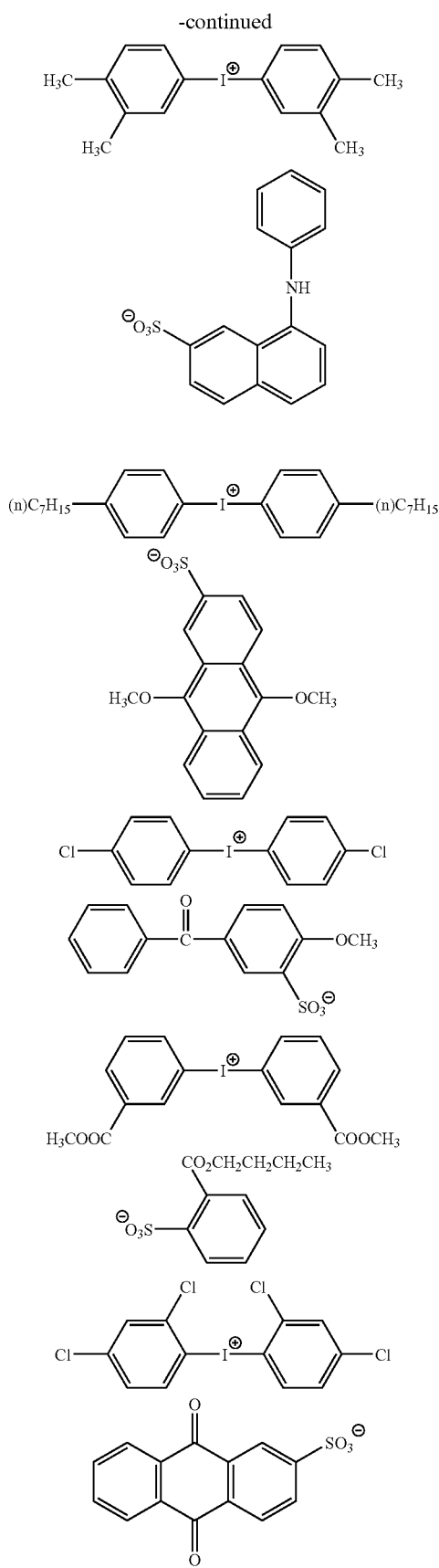
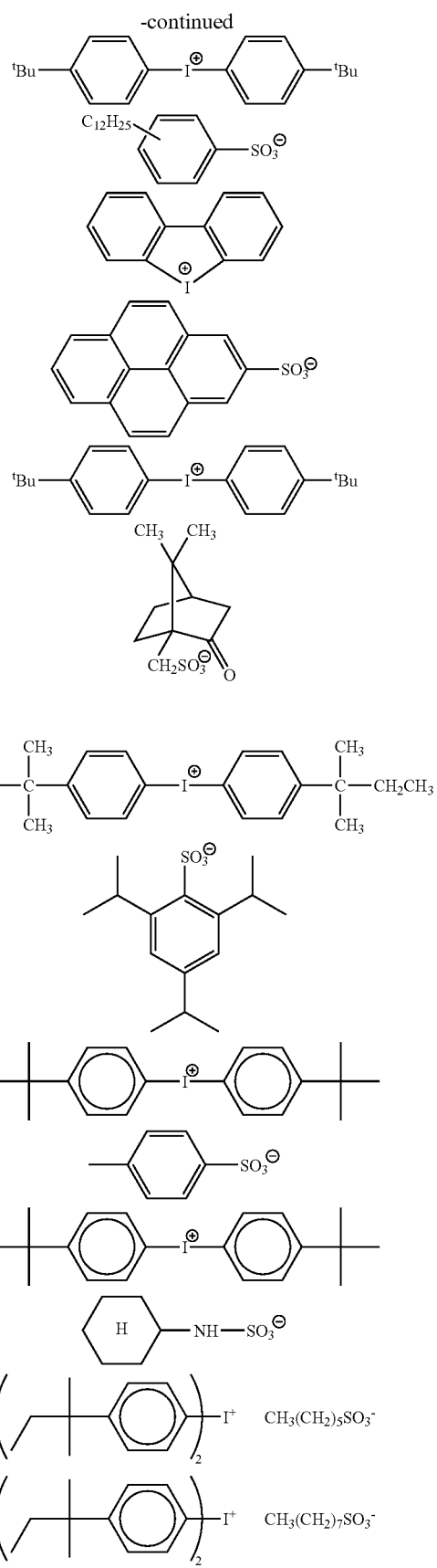

-continued
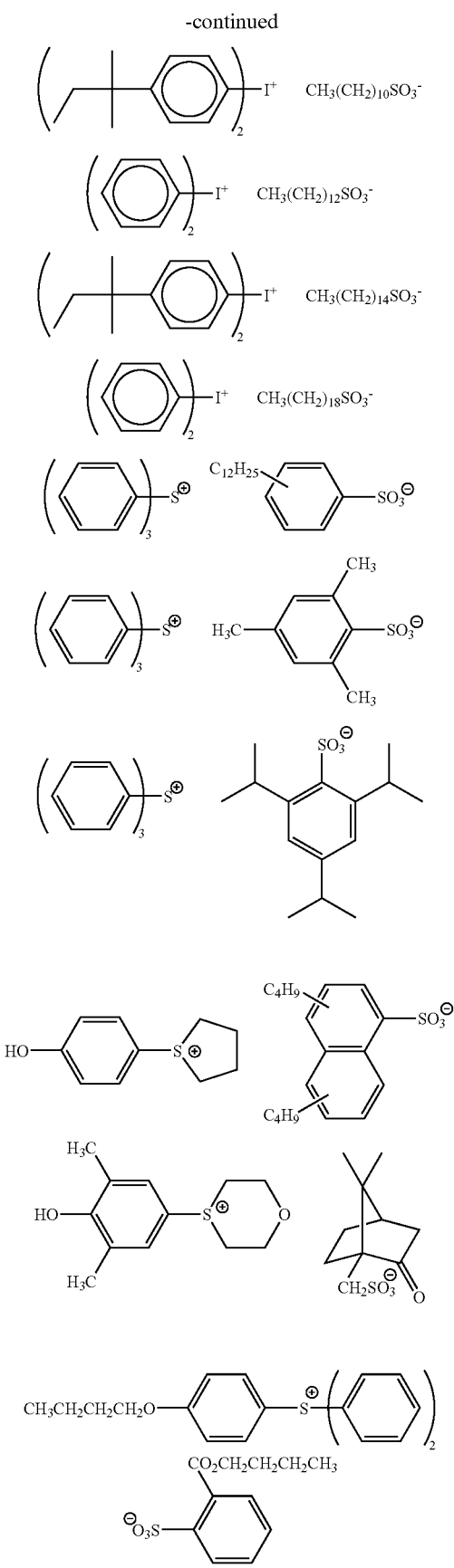
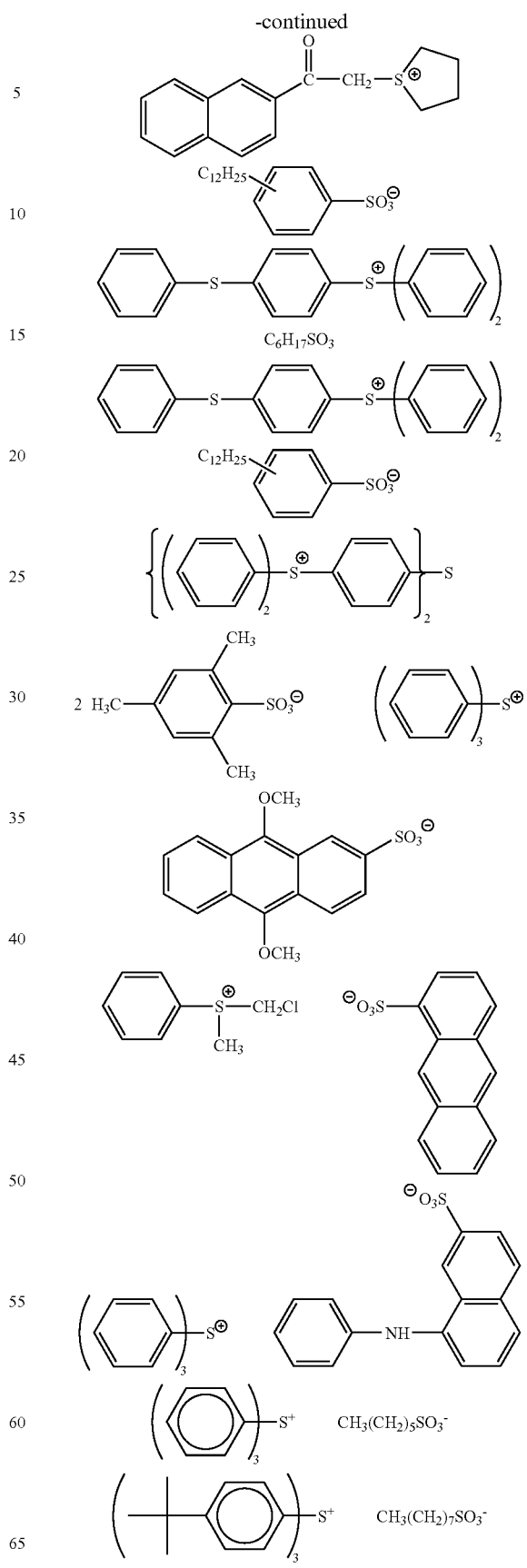

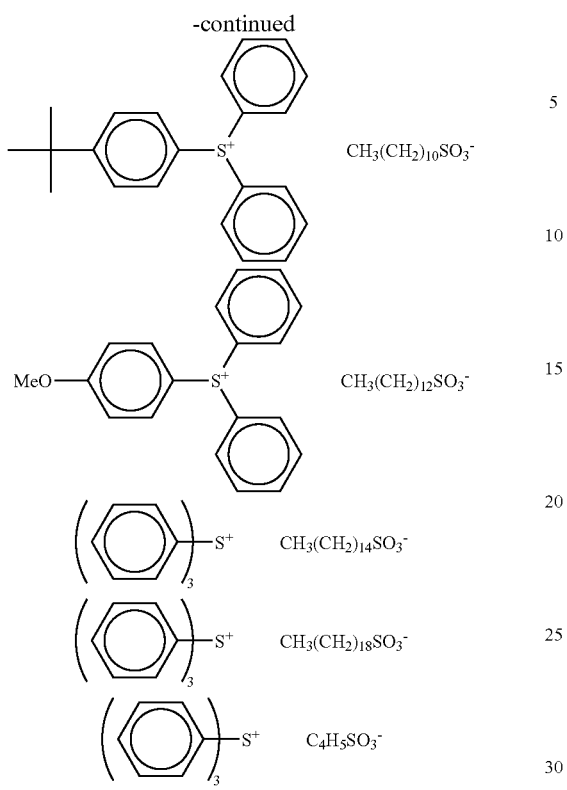

Moreover, disulfone derivatives represented by the following formula (PAG3) or iminosulfonate derivatives represented by the following formula (PAG4) may be cited.

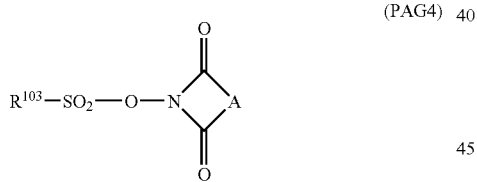

Ar³ and Ar⁴ independently represent each an aryl group. $R_{103}$ represents an alkyl group, a cycloalkyl group or an aryl group. A represents an alkylene group, an alkenylene group or an arylene group.

As specific examples thereof, the following compounds will be presented, though the invention is not restricted thereto.

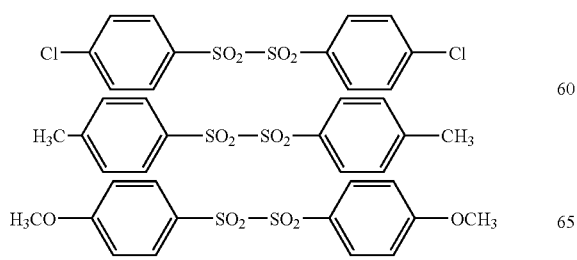

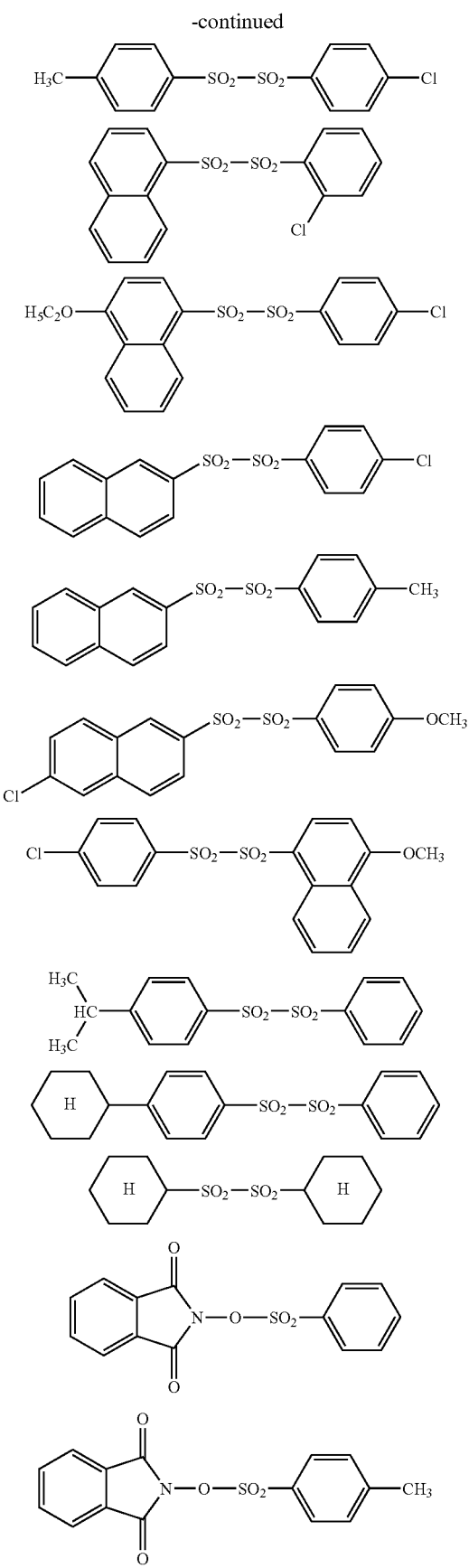

-continued

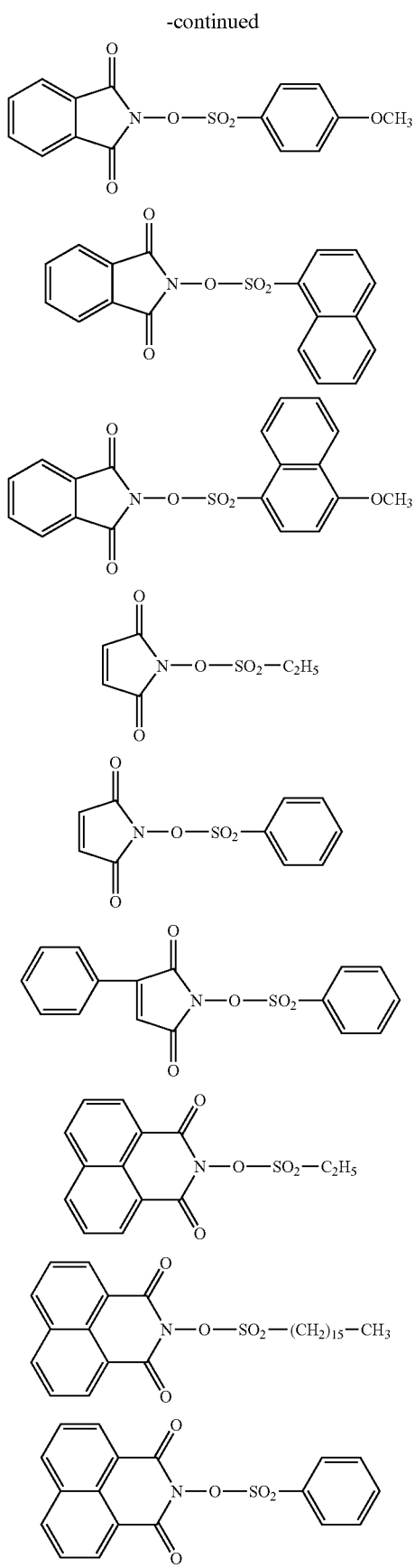

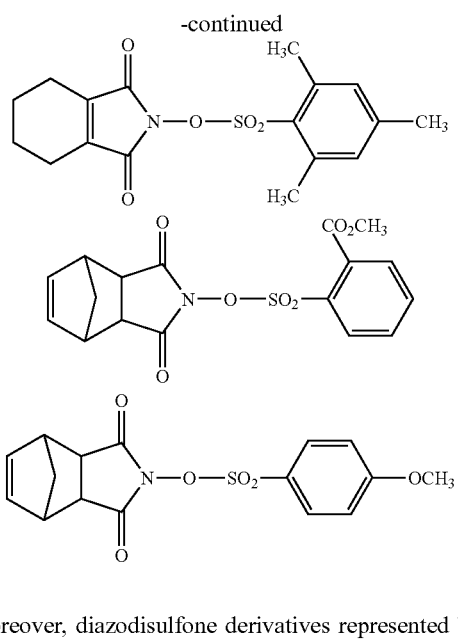

Moreover, diazodisulfone derivatives represented by the following formula (PAG5) may be cited.

(PAG5)

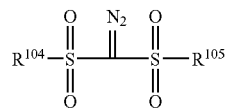

In this formula, $R^{104}$ and $R^{105}$ represent each an alkyl group, a cycloalkyl group or an aryl group.

As specific examples thereof, the following compounds will be presented, though the invention is not restricted thereto.

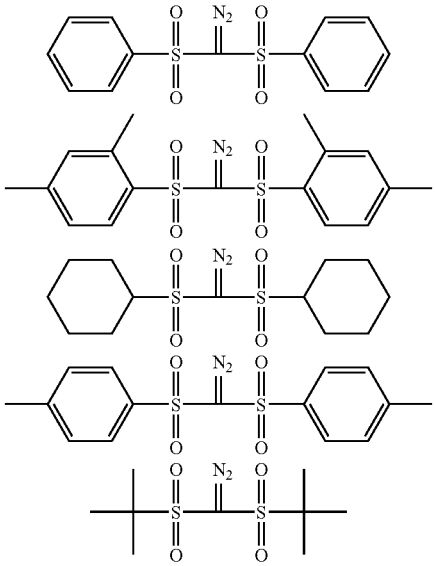

The compounds of the above-described components (B-1) and (B-2) can be synthesized by reacting an aromatic compound with a periodic acid salt and subjecting the thus obtained iodinium salt to salt-exchange into the corresponding sulfonic acid.

Synthesis can be also made by reacting an aryl Grignard reagent such as an aryl magnesium bromide with a substituted or unsubstituted phenyl sulfoxide and then subjecting the thus obtained triarylsulfonium halide to salt-exchange with the corresponding sulfonic acid. Alternatively, synthesis can be made by fusing a substituted or unsubstituted phenyl sulfoxide with a corresponding aromatic compound with the use of an acid catalyst such as methanesulfonic acid/diphosphorus pentaoxide or aluminum chloride followed by salt-exchange, or by fusing a diaryl iodonium salt with a diaryl sulfide by using a catalyst such as copper acetate followed by salt-exchange.

The salt-exchange can be carried out by a method of once forming a halide salt and then converting it into a sulfonic acid salt with the use of a silver reagent such as silver oxide, or by using an ion exchange resin. As the sulfonic acid or sulfonic acid salt to be used in the salt-exchange, use may be made of either marketed products or products prepared by, for example, hydrolyzing marketed sulfonic halides.

Next, the compound (B-3) generating a fluorine-containing carboxylic acid upon irradiation with one of an actinic ray and a radiation will be illustrated.

Examples of the fluorine-substituted aliphatic carboxylic acid include fluorine-substituted aliphatic carboxylic acids such as acetic acid, propionic acid, n-butyric acid, isobutyric acid, valerianic acid, trimethylacetic acid, caproic acid, heptanoic acid, caprylic acid, pelargonic acid, capric acid, lauric acid, myristic acid, palmitic acid, stearic acid, undecanoic acid, dodecanoic acid and tridecanoic acid. These compounds may have a hydroxyl group, an alkoxy group or a halogen atom as a substituent. Moreover, compounds having a linking group such as an oxygen atom, a sulfur atom, a carbonyl group, a carboxyl group or a sulfonyl group in the aliphatic chain are preferred.

Preferable examples of the fluorine-substituted aliphatic carboxylic acid are compounds represented by the following formula.

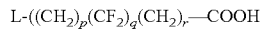

$$L-((CH_2)_p(CF_2)_q(CH_2)_r-COOH$$

In this formula, L represents a hydrogen atom or a fluorine atom. p and r independently represent each an integer of from 0 to 15, while q represents an integer of from 1 to 15. The hydrogen atom or fluorine atom in the alkyl chain in this formula may be substituted by an optionally fluorine-substituted alkyl group (preferably having from 1 to 5 carbon atoms), an optionally fluorine-substituted alkoxy group (preferably having from 1 to 5 carbon atoms) or a hydroxyl group.

The fluorine-substituted aliphatic carboxylic group as described above is preferably a fluorine-substituted saturated carboxylic acid having from 2 to 20 carbon atoms, still preferably from 4 to 20 carbon atoms. By controlling the carbon atom number to 4 or more, the diffusability of the decomposability of the carboxylic acid thus generated is lowered and thus changes in line width with the passage of time from exposure to post-heating can be lessened. In particular, a fluorine-substituted linear or branched saturated aliphatic carboxylic acid having from 4 to 18 carbon atoms is preferable.

Preferable examples of the fluorine-substituted aromatic carboxylic acid as described above include fluorine-substituted aromatic carboxylic acids having from 7 to 20 carbon atoms, still preferably from 7 to 15 carbon atoms and still preferably from 7 to 11 carbon atoms. Specific examples thereof include fluorine-substituted aromatic carboxylic acids such as benzoic acid, substituted benzoic acids, naphthoic acid, substituted naphthoic acids, anthracene-carboxylic acid and substituted anthracene-carboxylic acids (examples of substituents including alkyl, alkoxy and hydroxyl groups, halogen atoms, aryl, acyl, acyloxy, nitro, alkylthio and arylthio groups).

In such a fluorine-substituted aliphatic or aromatic carboxylic acid, one or more hydrogen atoms in the skeleton other than the carboxyl group is substituted by fluorine atoms. An aliphatic or aromatic carboxylic acid in which all of the hydrogen atoms in the skeleton other than the carboxylic group are substituted by fluorine atoms (i.e., a perfluoro saturated aliphatic carboxylic acid or a perfluoro aromatic carboxylic acid) is particularly preferred. Thus, the sensitivity can be further improved.

Among aliphatic carboxylate anions, an anion having a fluorine atom on the α-carbon atom of the carboxylate has a high acid strength. A perfluoro aliphatic sulfonic acid has a further high acid strength.

Preferable examples thereof include onium salt compounds having such a fluorine-substituted aliphatic or aromatic carboxylate anion as described above as a counter anion (sulfonium salts, iodonium salts, etc.), imidocarboxylate compounds having a carboxylic acid ester group and nitrobenzyl ester compounds.

Still preferable examples include compounds represented by the above-described formulae (I) to (III). Thus, sensitivity, resolution and exposure margin can be further improved. By irradiating such a compound with one of an actinic ray and a radiation, a saturated aliphatic or aromatic carboxylic acid substituted by at least one fluorine atom corresponding to X⁻ in the formulae (I) to (III) is generated, thereby serving as a photo-acid generator.

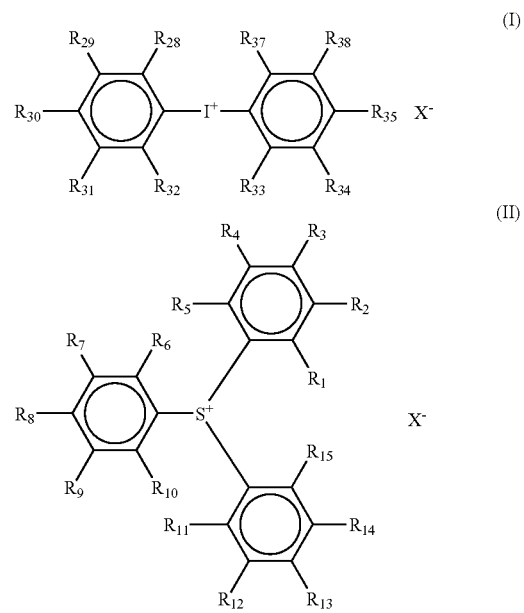

-continued

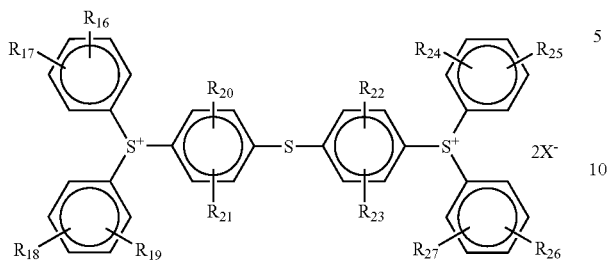
(III)

In the above formulae, $R_1$ to $R_{37}$ independently represent each a hydrogen atom, an alkyl group, a cycloalkyl group, a linear, branched or cyclic alkoxy group, a hydroxy group, a halogen atom or an —S—$R_{38}$ group, wherein $R_{38}$ represents a linear, branched or cyclic alkyl group or an aryl group. $X^-$ represents an aliphatic or aromatic carboxylate anion substituted by at least one fluorine atom.

It is preferable that $X^-$ is a perfluoro aliphatic carboxylate anion or a perfluoro aromatic carboxylate anion, still preferably a fluorine-substituted alkylcarboxylate anion having 4 or more carbon atoms.

Examples of an alkyl group of $R_1$ to $R_{37}$ in the formulae (I) to (III) include optionally substituted alkyl groups having from 1 to 4 carbon atoms such as methyl, ethyl, propyl, n-butyl, sec-butyl and t-butyl groups. Examples of a cycloalkyl group include optionally substituted cycloalkyl groups having from 3 to 8 carbon atoms such as cyclopropyl, cyclopentyl and cyclohexyl groups.

Examples of an alkoxy group of $R_1$ to $R_{37}$ include alkoxy groups having from 1 to 4 carbon atoms such as methoxy, ethoxy, hydroxyethoxy, propoxy, n-butoxy, isobutoxy, sec-butoxy and t-butoxy groups.

Examples of a halogen atom of $R_1$ to $R_{37}$ include fluorine, chlorine, bromine and iodine atoms Examples of the aryl group of $R_{38}$ include aryl groups having from 6 to 14 carbon atoms such as phenyl, tolyl, methoxyphenyl and naphthyl groups. Such an aryl group may have a substituent.

Preferable examples of substituents thereof include alkoxy groups having from 1 to 4 carbon atoms, halogen atoms (fluorine, chlorine and iodine atoms), aryl groups having from 6 to 10 carbon atoms, alkenyl groups having from 2 to 6 carbon atoms, a cyano group, a hydroxy group, a carboxy group, an alkoxycarbonyl group and a nitro group.

The iodonium compounds or sulfonium compounds represented by the formulae (I) to (III) to be used in the invention have at least a fluorine-substituted saturated aliphatic or aromatic carboxylate anion as the counter ion $X^-$. Such an anion is an anion (—COO$^-$) remaining after a hydrogen atom leaves from the carboxylate (—COOH).

Next, specific examples thereof will be presented, though the invention is not restricted thereto.

Specific examples (I-1f) to (I-36f) of photo-acid generator represented by the formula (I):

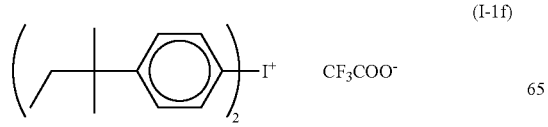
(I-1f)

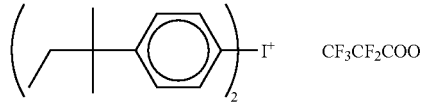
(I-2f)

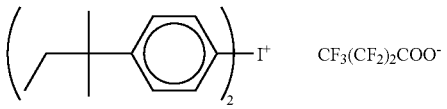
(I-3f)

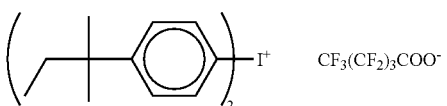
(I-4f)

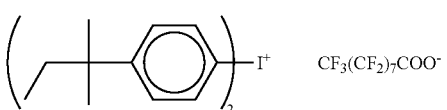
(I-5f)

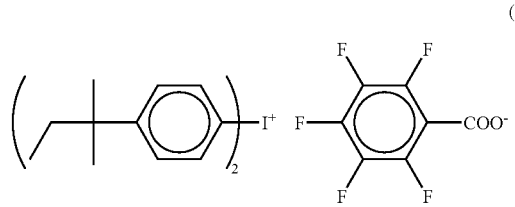
(I-6f)

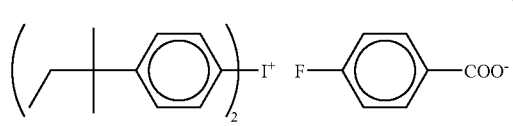
(I-7f)

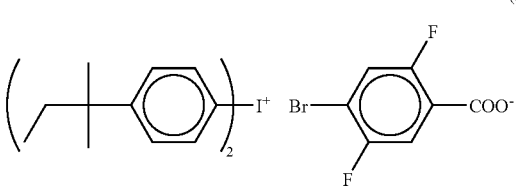
(I-8f)

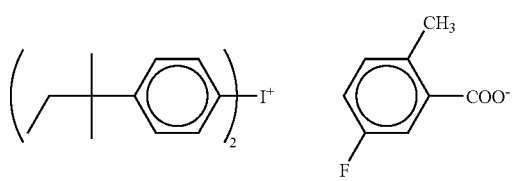
(I-9f)

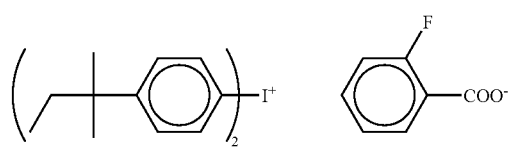
(I-10f)

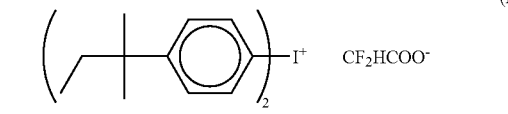
(I-11f)

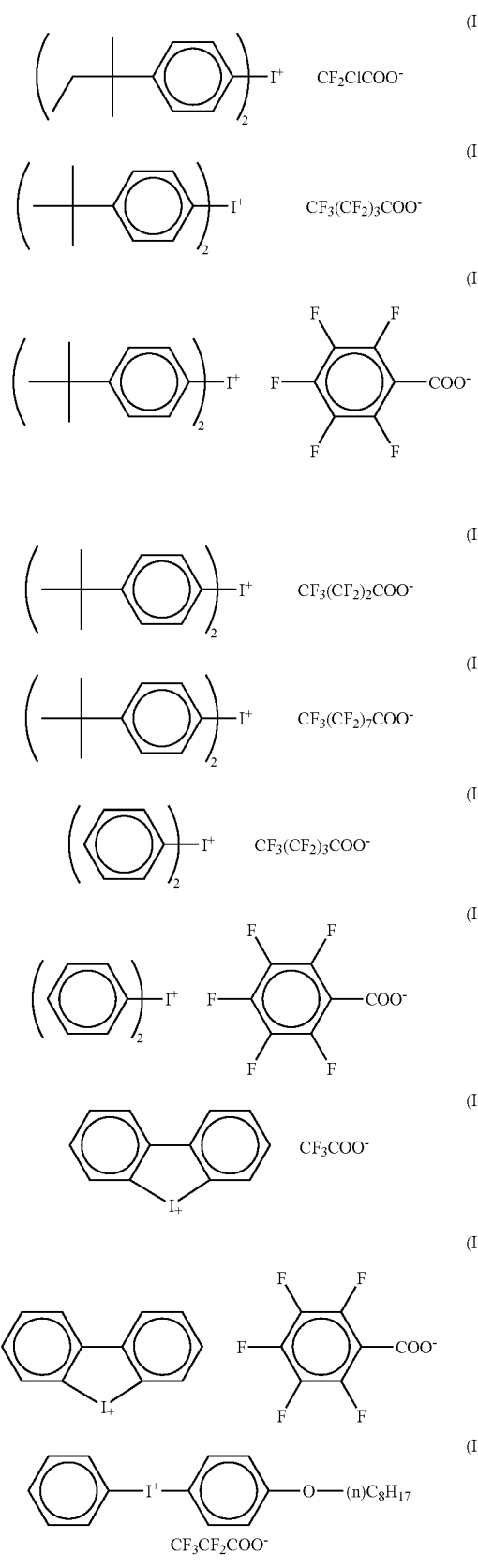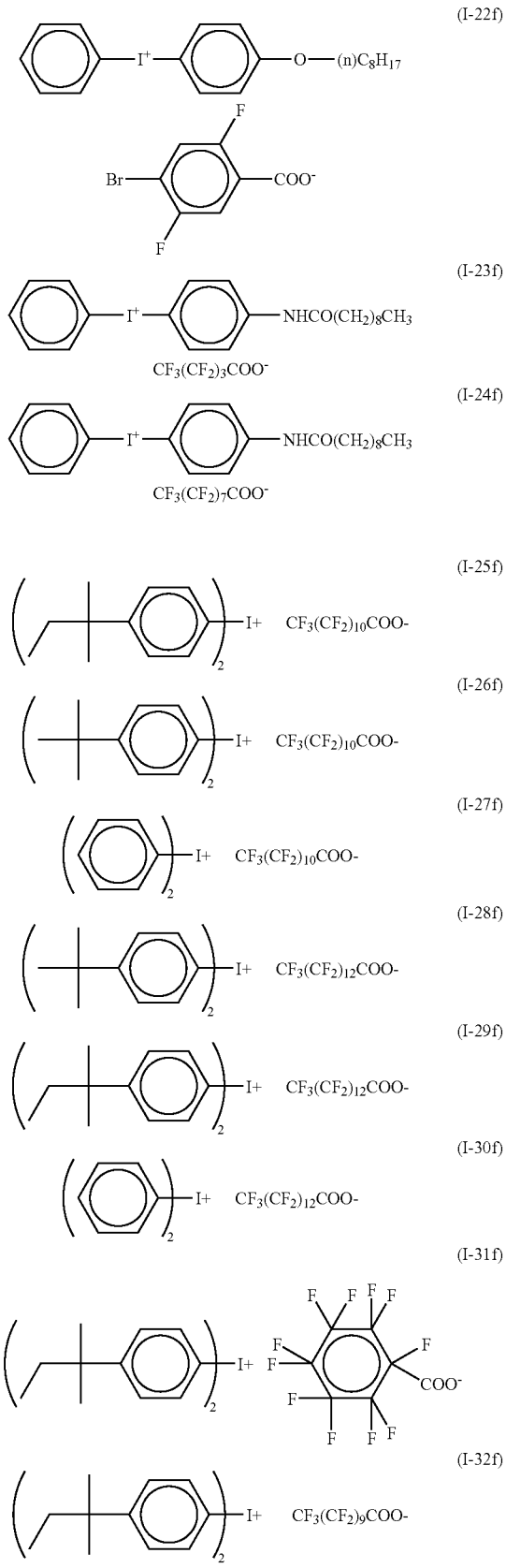

(I-33f) 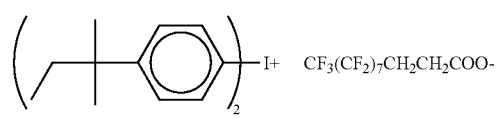
(I-34f) 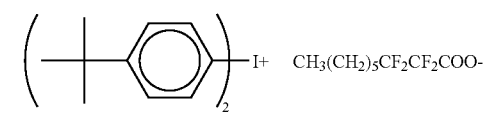
(I-35f) 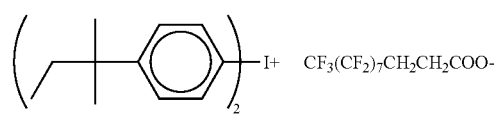
(I-36f) 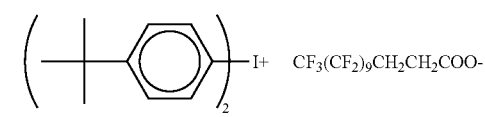
Specific examples (II-1f) to (II-67f) of photo-acid generator represented by the formula (II):
(II-1f) 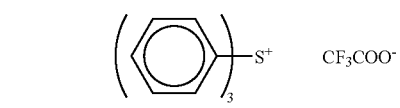
(II-2f) 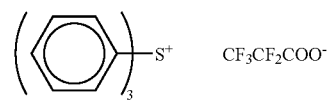
(II-3f) 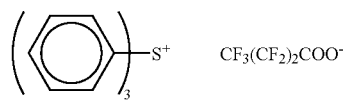
(II-4f) 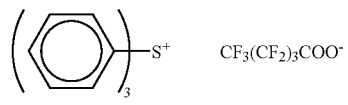
(II-5f) 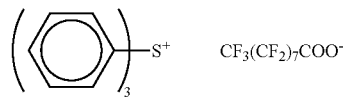
(II-6f) 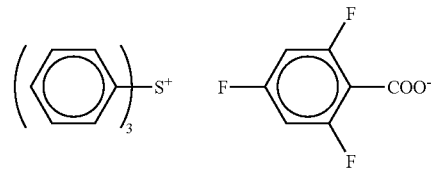
(II-7f) 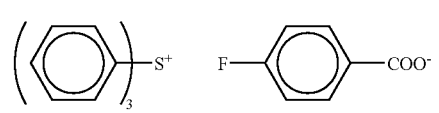
(II-8f) 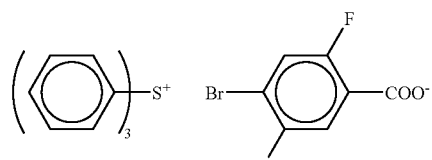
(II-9f) 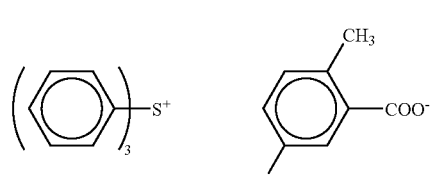
(II-10f) 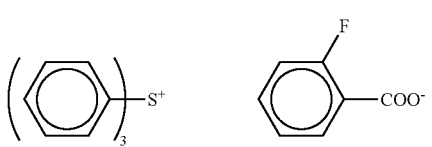
(II-11f) 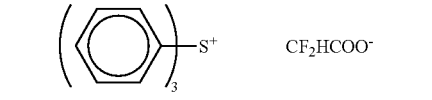
(II-12f) 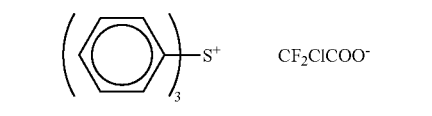
(II-13f) 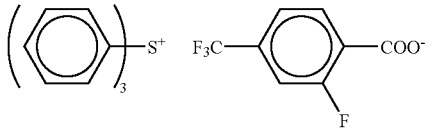
(II-14f) 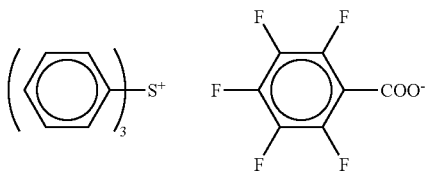
(II-15f) 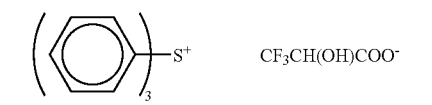
(II-16f) 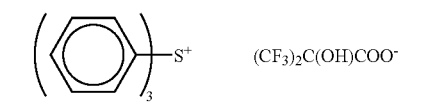
(II-17f) 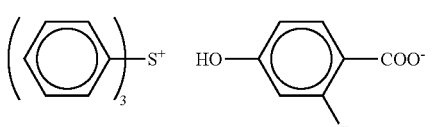
(II-18f) 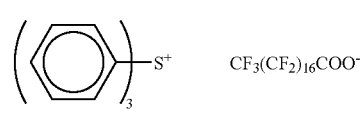

-continued
(II-19f)
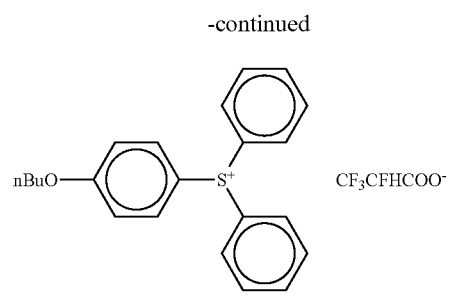
(II-20f)
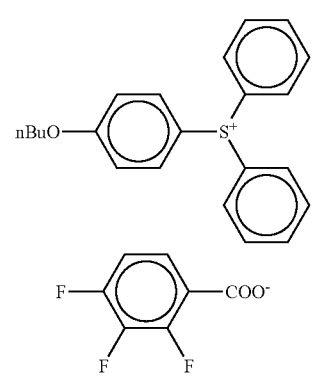
(II-21f)
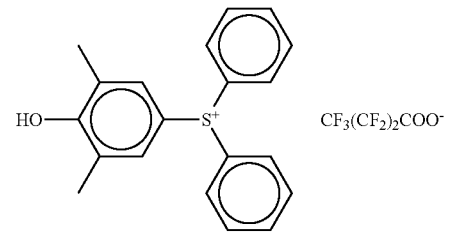
(II-22f)
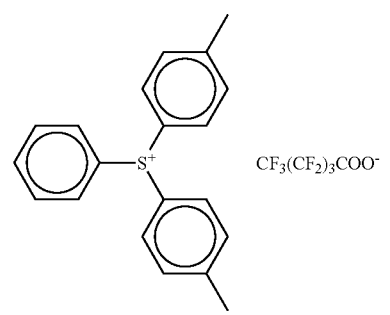
(II-23f)
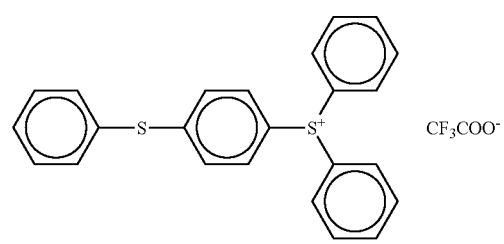
-continued
(II-24f)
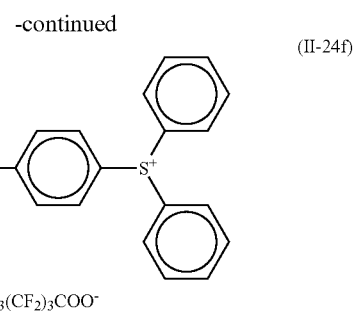
(II-25f)
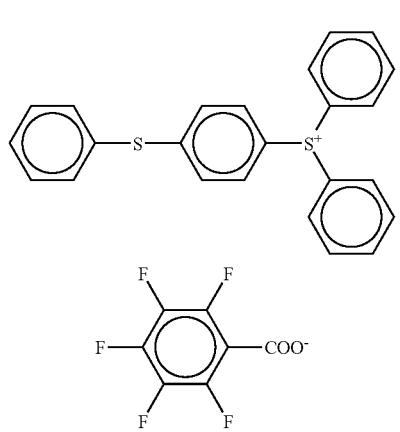
(II-26f)
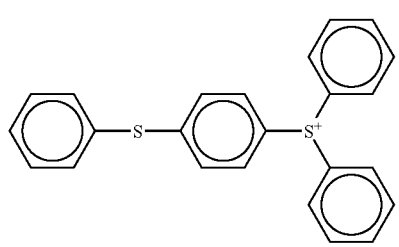
(II-27f)
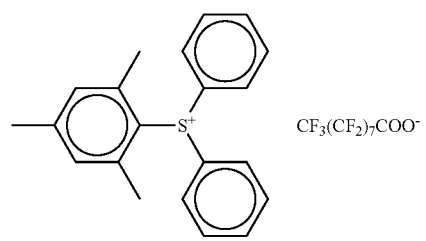
(II-28f)
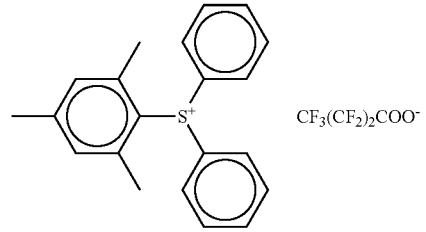

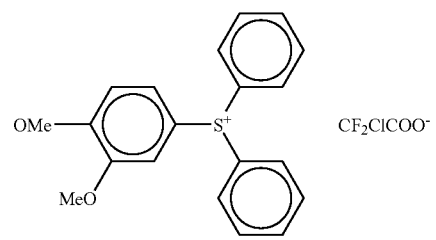 (II-29f)
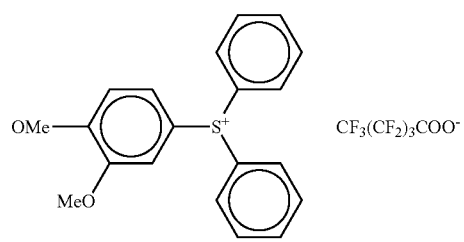 (II-30f)
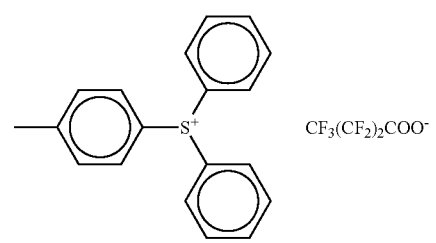 (II-31f)
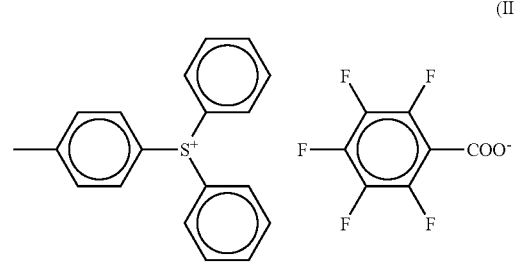 (II-32f)
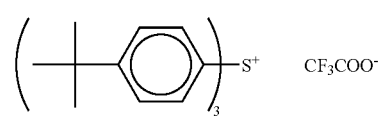 (II-33f)
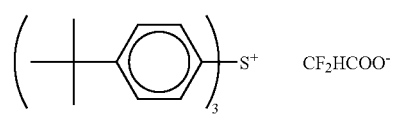 (II-34f)
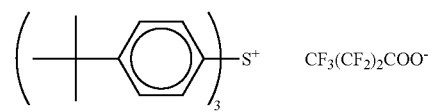 (II-35f)
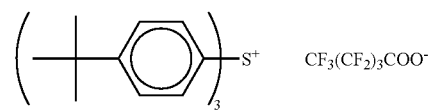 (II-36f)
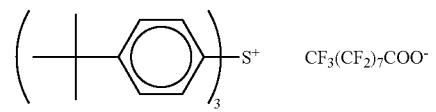 (II-37f)
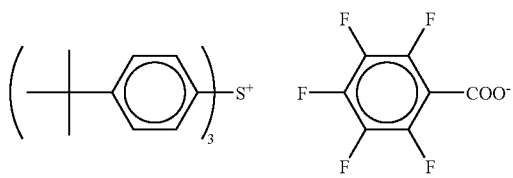 (II-38f)
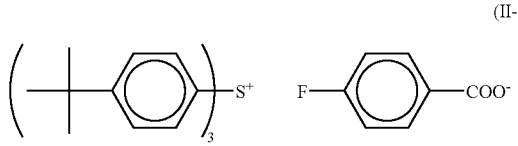 (II-39f)
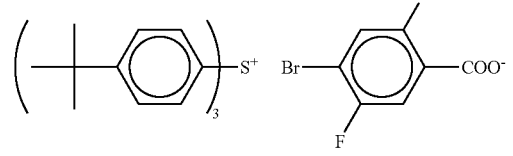 (II-40f)
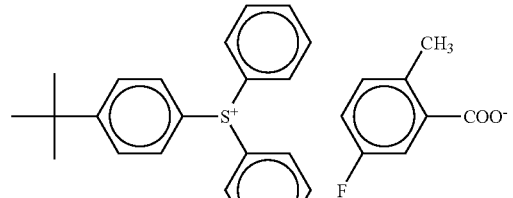 (II-41f)
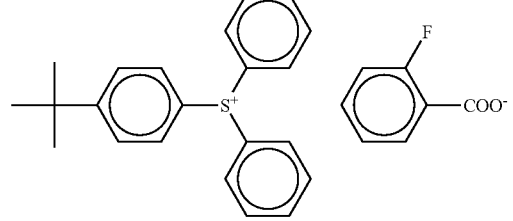 (II-42f)
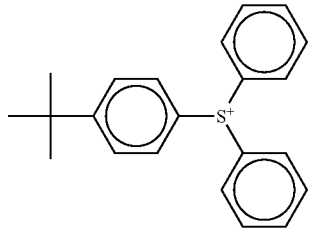 (II-43f)
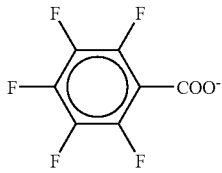

-continued
(II-44f)
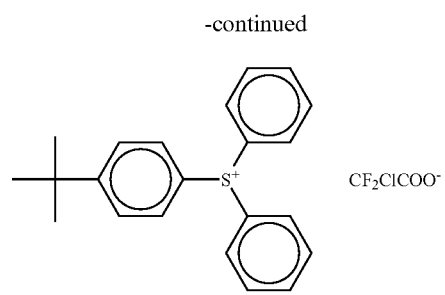
(II-45f)
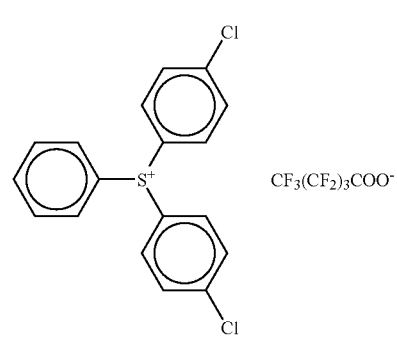
(II-46f)
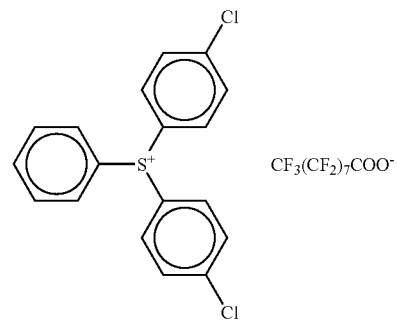
(II-47f)
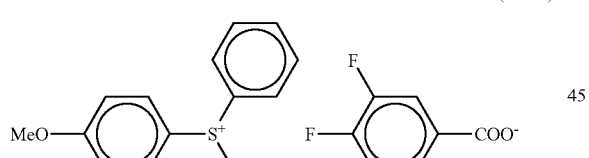
(II-48f)
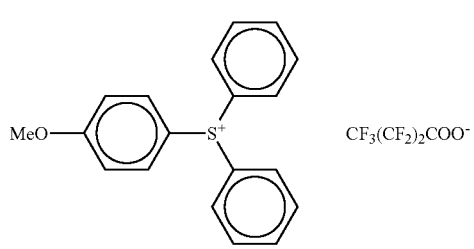
(II-49f)
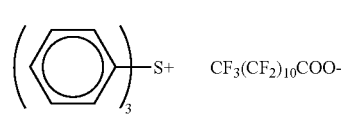
-continued
(II-50f)
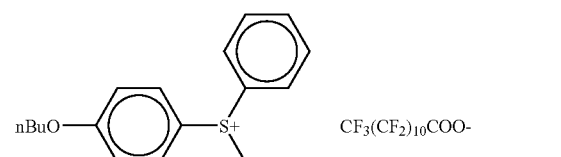
(II-51f)
(II-52f)
(II-53f)
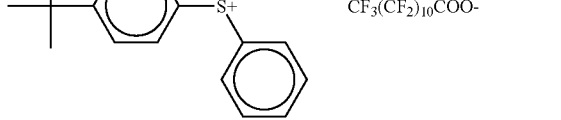
(II-54f)
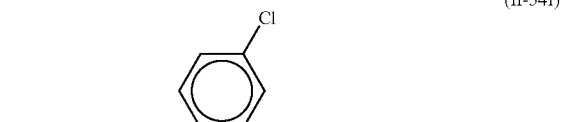
(II-55f)
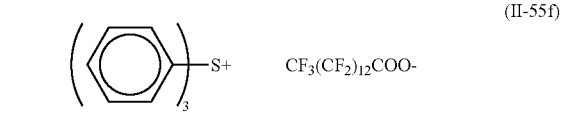
(II-56f)
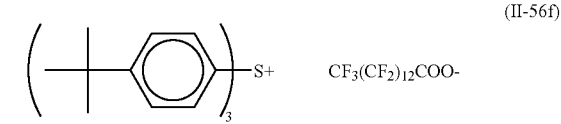

(II-57f)
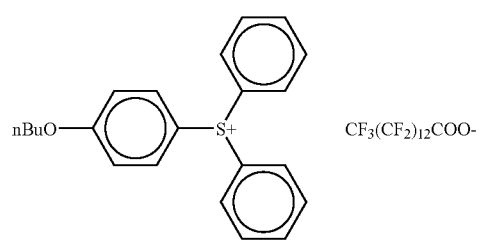
(II-58f)
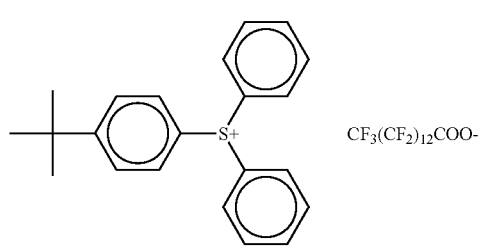
(II-59f)
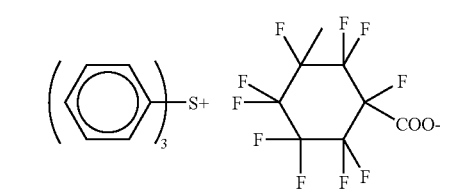
(II-60f)
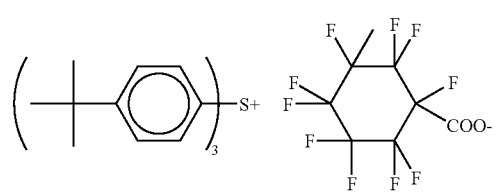
(II-61f)
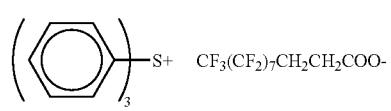
(II-62f)
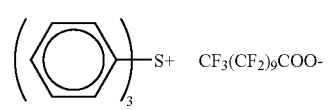
(II-63f)
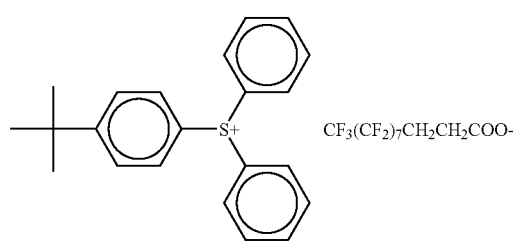
(II-64f)
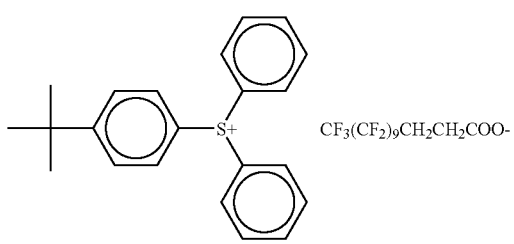
(II-65f)
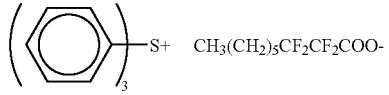
(II-66f)
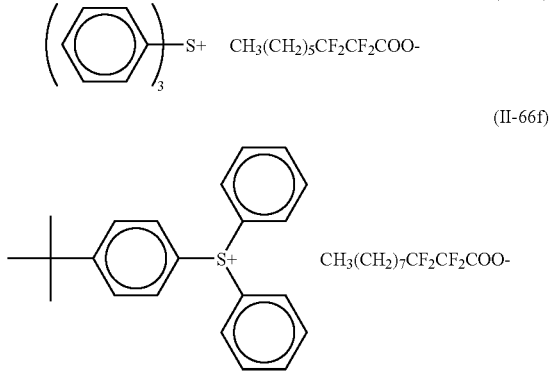
(II-67f)
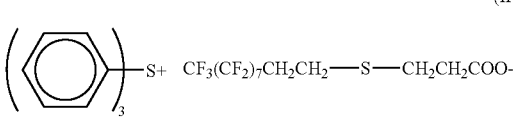
Specific examples (III-1f) to (III-4f) of photo-acid generator represented by the formula (III):
(III-1f)
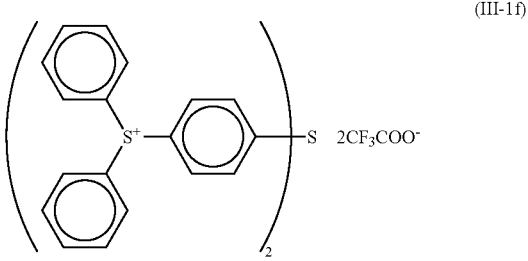
(III-2f)
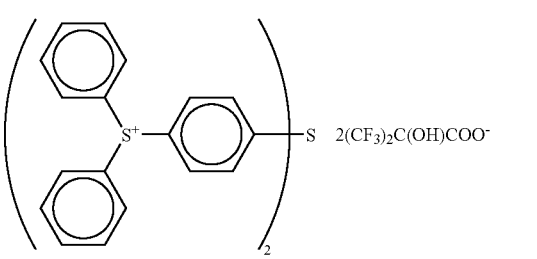

-continued (III-3f)

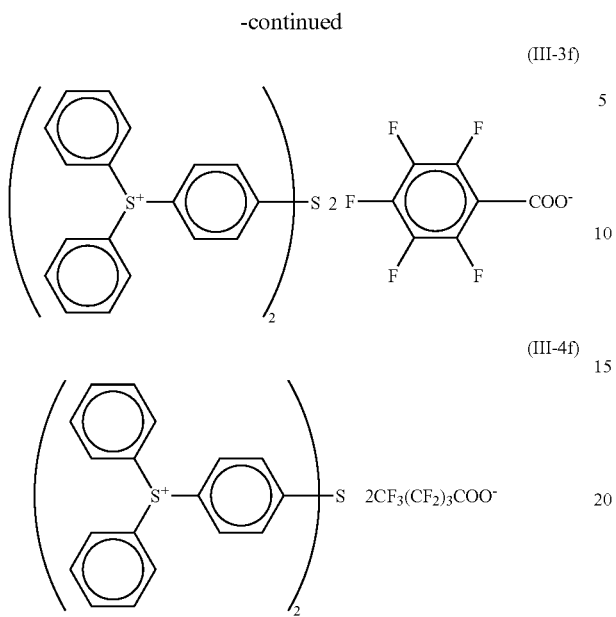

(III-4f)

Specific examples (IV-1f) to (V-4f) of other photo-acid generators:

(IV-1f)

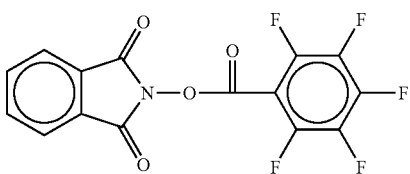

(IV-2f)

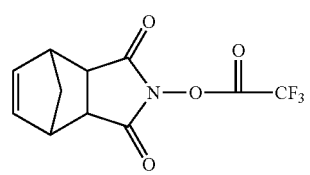

(IV-3f)

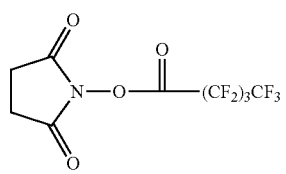

(V-1f)

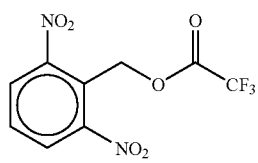

(V-2f)

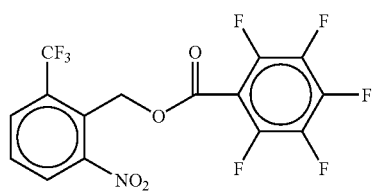

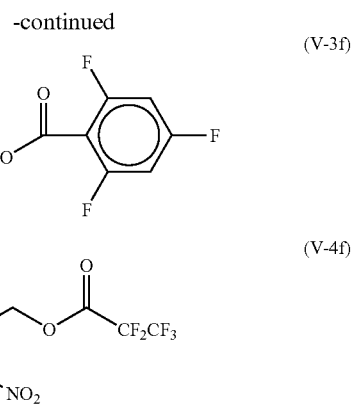

The compounds represented by the formula (I) as described above can be synthesized by reacting an aromatic compound with a periodic acid salt and subjecting the thus obtained iodinium salt to salt-exchange into the corresponding sulfonic acid.

The compounds represented by the formulae (II) and (III) can be synthesized by reacting an aryl Grignard reagent such as an aryl magnesium bromide with a substituted or unsubstituted phenyl sulfoxide and then subjecting the thus obtained triarylsulfonium halide to salt-exchange with the corresponding sulfonic acid. Alternatively, synthesis can be made by fusing a substituted or unsubstituted phenyl sulfoxide with a corresponding aromatic compound with the use of an acid catalyst such as methanesulfonic acid/diphosphorus pentaoxide or aluminum chloride followed by salt-exchange, or by fusing a diaryl iodonium salt with a diaryl sulfide by using a catalyst such as copper acetate followed by salt-exchange.

The salt-exchange can be carried out by a method of once forming a halide salt and then converting it into a sulfonic acid salt with the use of a silver reagent such as silver oxide, or by using an ion exchange resin. As the sulfonic acid or sulfonic acid salt to be used in the salt-exchange, use may be made of either marketed products or products prepared by, for example, hydrolyzing marketed sulfonic halides As the fluorine-substituted carboxylate serving as an anion, it is also preferable to employ a compound derived from a fluoro aliphatic compound which is produced by the telomerization method (also called the telomer method) or the oligomerization method (also called the oligomer method). Methods of producing these fluoro aliphatic compounds are described in, for example, Fusso Kagobutu no Gosei to Kino, (supervised by Nobuo Ishikawa, CMC, 1987), p. 117 to 118 and Chemistry of Organic Fluorine Compounds II (Monograph 187 Ed by Milos. Hudlicky and Attila E. Pavlath, American Chemical Society 1995) p. 747 to 752. In the telomerization method, an alkyl halide (for example, an iodide) having a large chain transfer constant is employed as a telogen and a fluorine-containing vinyl compound (for example, tetrafluoroethylene) is radical-polymerized to thereby synthesize a telomer (as in an example shown in Scheme-1). By the synthesis using this telomer method, a mixture of a plural number of compounds having different chain lengths is obtained. The mixture may be used as such. Alternatively, it may be purified before using.

Examples of the compound (B4) generating a fluorine-free carboxylic acid upon irradiation with one of an actinic ray and a radiation include compounds represented by the following formulae (AI) to (AV).

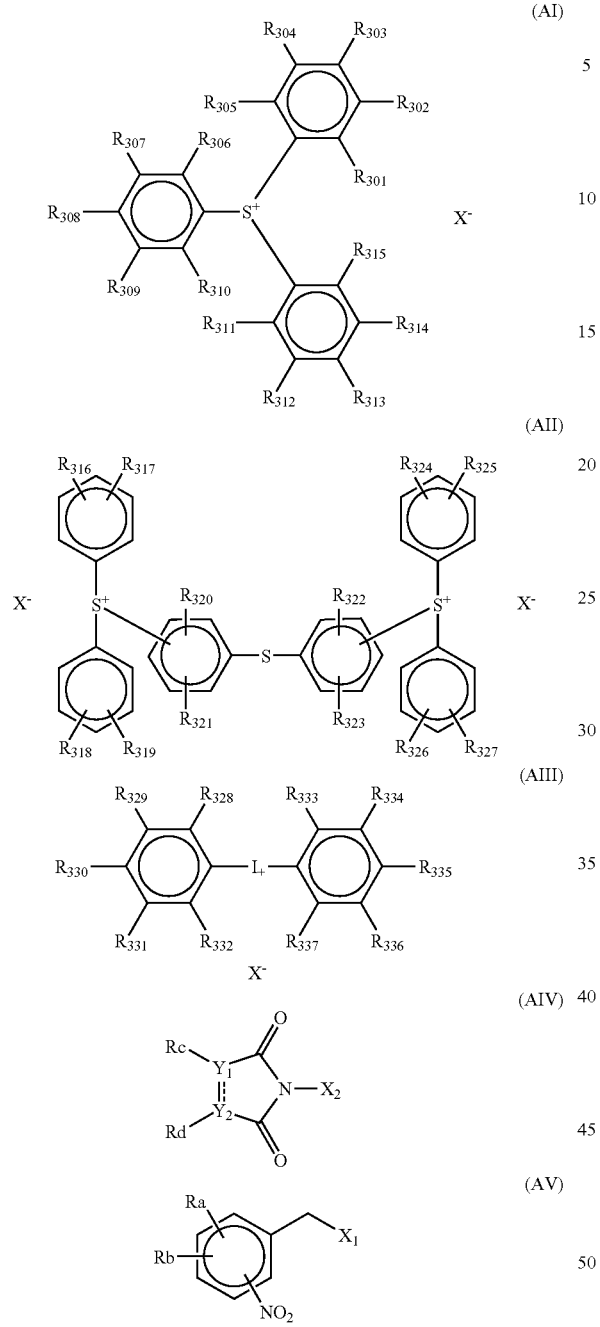

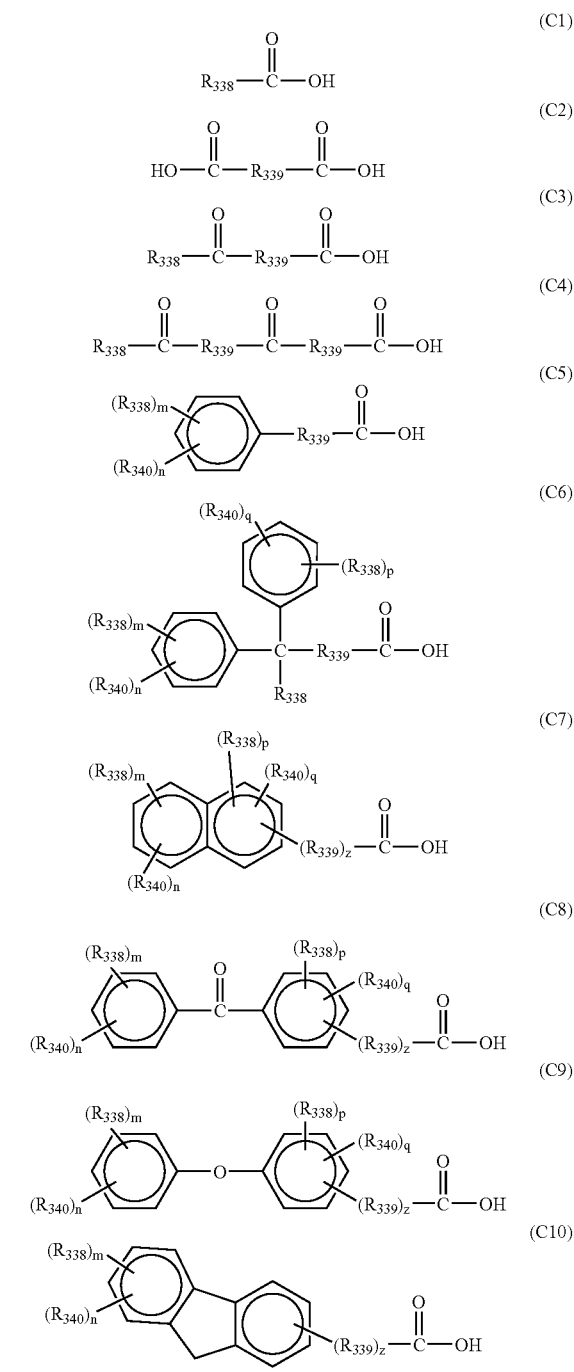

having an oxygen atom or a nitrogen atom in the ring. $Y_1$ and $Y_2$ represent each a carbon atom and the $Y_1-Y_2$ bond may be either a single bond or a double bond. $X^-$ represents an anion of a carboxylic acid compound represented by the following formulae. $X_1$ and $X_2$ independently represent each an ester group of the carboxyl group moiety of a carboxylic acid group represented by the following formulae.

In the above formulae, $R_{301}$ to $R_{337}$ independently represent each a hydrogen atom, a linear, branched or cyclic alkyl group, a linear, branched or cyclic alkoxy group, a hydroxy group, a halogen atom or an —S—$R_0$ group wherein $R_0$ represents a linear, branched or cyclic alkyl group or an aryl group.

Ra and Rb independently represent each a hydrogen atom, a nitro group, a halogen atom, an optionally substituted alkyl group, a cycloalkyl group or an alkoxy group. Rc and Rd independently represent each a halogen atom, an optionally substituted alkyl group or an aryl group. Alternatively, Rc and Rd may be bonded together to form an aromatic ring or a monocyclic or polycyclic hydrocarbon ring optionally In the above formulae, $R_{338}$ represents a linear, branched or cyclic alkyl group having from 1 to 30 carbon atoms optionally having an oxygen atom or a nitrogen atom in its alkyl chain, a linear, branched or cyclic alkenyl group having from 1 to 20 carbon atoms, a linear, branched or cyclic alkynyl group having from 1 to 20 carbon atoms, a linear, branched or cyclic alkoxyl group having from 1 to 20 carbon atoms, the above-described alkyl group in which at least a part of the hydrogen atoms are substituted by a halogen atom and/or a hydroxyl group, or a substituted or unsubstituted aryl group having from 6 to 20 carbon atoms. Examples of the substituent of the aryl group include alkyl, nitro, hydroxyl, alkoxy, acyl and alkoxycabronyl groups and halogen atoms.

$R_{339}$ represents a single bond, a linear, branched or cyclic alkylene group having from 1 to 20 carbon atoms (optionally containing an oxygen atom or a nitrogen atom in its alkylene chain), a linear, branched or cyclic alkenylene group having from 1 to 20 carbon atoms, the above-described alkylene group in which at least a part of the hydrogen atoms are substituted by a halogen atom and/or a hydroxyl group, the above-described alkenylene group in which at least a part of the hydrogen atoms is substituted by a halogen atom and/or a hydroxyl group, or an alkoxyalkylene group having from 2 to 20 carbon atoms. $R_{338}$'s and $R_{339}$'s may be either the same or different from each other.

$R_{340}$ represents a hydroxyl group or a halogen atom and $R_{340}$'s may be either the same or different from each other. m, n, p and q independently represent each an integer of from 0 to 3, provided that m+n is not more than 5 an dp+q is not more than 5.

Examples of an alkyl group of $R_{301}$ to $R_{337}$, Ra, Rb, Rc, Rd and Ro in the above formulae (AI) to (AV) include optionally substituted alkyl groups having from 1 to 4 carbon atoms such as methyl, ethyl, propyl, n-butyl, sec-butyl and t-butyl groups. Examples of a cycloalkyl group include optionally substituted cycloalkyl groups having from 3 to 8 carbon atoms such as cyclopropyl, cyclopentyl and cyclohexyl groups.

Examples of an alkoxy group of $R_{301}$ to $R_{337}$, Ra, Rb, Rc, Rd and Ro include alkoxy groups having from 1 to 4 carbon atoms such as methoxy, ethoxy, hydroxyethoxy, propoxy, n-butoxy, isobutoxy, sec-butoxy and t-butoxy groups.

Examples of a halogen atom of $R_{301}$ to $R_{337}$, Ra, Rb, Rc, Rd and Ro include fluorine, chlorine, bromine and iodine atoms.

Examples of an aryl group of Ro, Rc and Rd include aryl optionally substituted aryl groups having from 6 to 14 carbon atoms such as phenyl, tolyl, methoxyphenyl and naphthyl groups.

Preferable examples of the substituents thereof include alkoxy groups having from 1 to 4 carbon atoms, halogen atoms (fluorine, chlorine and iodine atoms), aryl groups having from 6 to 10 carbon atoms, alkenyl groups having from 2 to 6 carbon atoms, a cyano group, a hydroxy group, a carboxy group, alkoxycarbonyl groups and a nitro group.

Examples of an aromatic, monocyclic or polycyclic hydrocarbon (optionally containing an oxygen atom or a nitrogen atom in its ring) formed by the binding of Rc to Rd include a benzene structure, a naphthalene structure, a cyclohexane structure, a norbornene structure and an oxabicyclo structure.

The iodonium compounds or sulfonium compounds represented by the formulae (AI) to (AV) to be used in the invention have at least a substituent which is an ester group (—COO—) derived from the carboxyl group (—COOH) in at least one of the carboxylic acid compounds of the above formulae (C1) to (C10).

Examples of an alkyl group or a cycloalkyl group having from 1 to 30 carbon atoms (optionally containing an oxygen atom or a nitrogen atom in the alkyl or cycloalkyl chain) in $R_{338}$ include methyl, ethyl, propyl, butyl, pentyl, hexyl, cyclohexyl, dodecyl, 1-ethoxyethyl and adamantyl.

Examples of a linear, branched or cyclic alkenyl group having from 1 to 20 carbon atoms include ethenyl, propenyl, isopropenyl and cyclohexene.

Examples of a linear, branched or cyclic alkynyl group having from 1 to 20 carbon atoms include acetylene and propenylene.

Examples of a linear, branched or cyclic alkoxy group having from 1 to 20 carbon atoms include methoxy, ethoxy, propyloxy, butoxy, cyclohexyloxy, isobutoxy and dodecyloxy Examples of substituted or unsubstituted aryl group having from 6 to 20 carbon atoms include phenyl, naphthyl and anthranyl.

Examples of the substituent of the aryl group include alkyl groups, a nitro group, a hydroxyl group, alkoxy groups, acyl groups, alkoxycarbonyl groups and halogen atoms.

Examples of a linear, branched or cyclic alkylene group having from 1 to 20 carbon atoms (optionally containing an oxygen atom or a nitrogen atom in the alkylene chain) in $R_{339}$ include methylene, ethylene, propylene, butylene, isobutylene, ethoxyethylene and cyclohexylene.

Examples of a linear, branched or cyclic alkenylene group having from 1 to 20 carbon atoms include vinylene and allylene.

Next, specific examples thereof will be presented, though the invention is not restricted thereto.

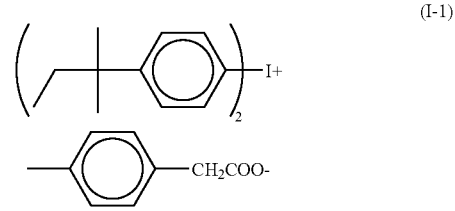

(I-1)

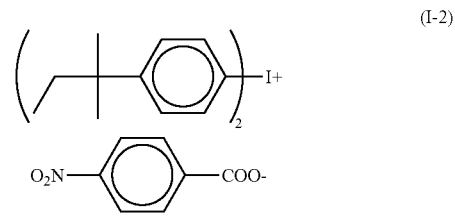

(I-2)

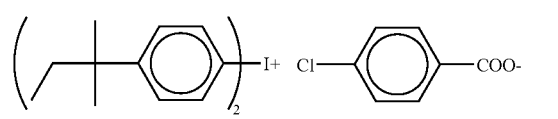

(I-3)

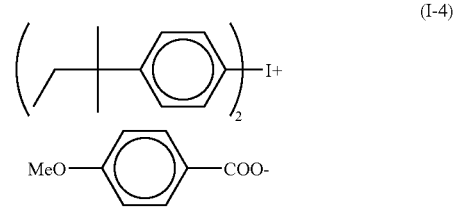

(I-4)

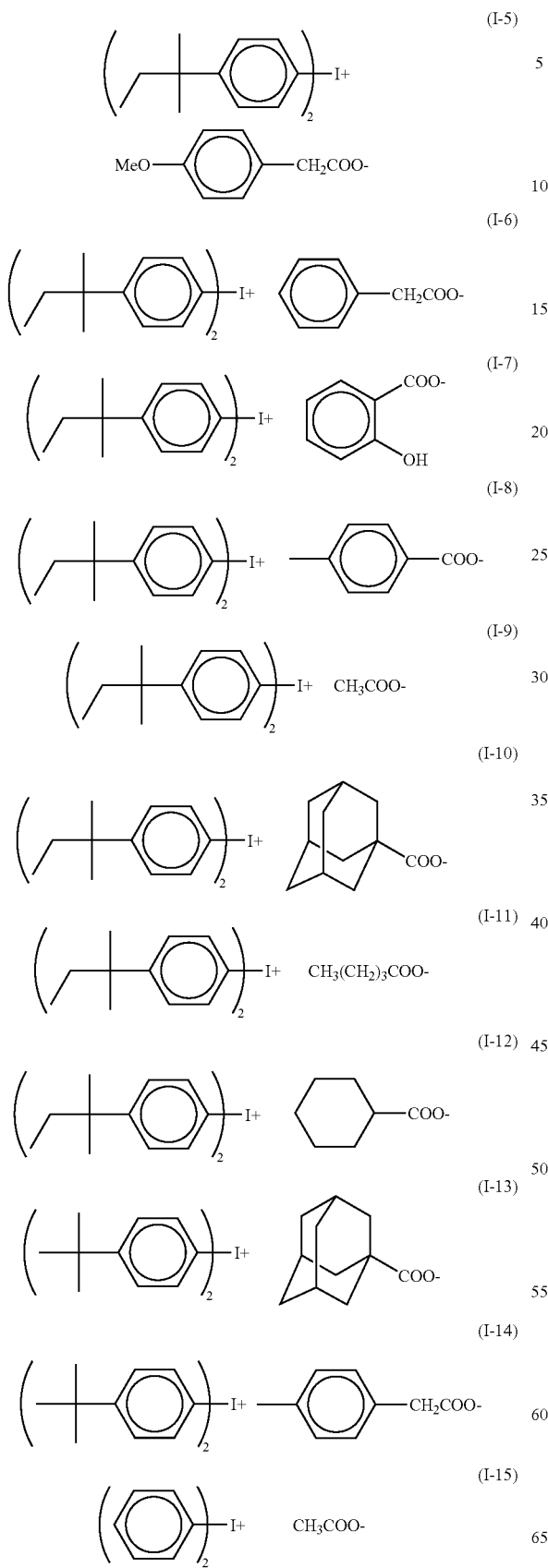
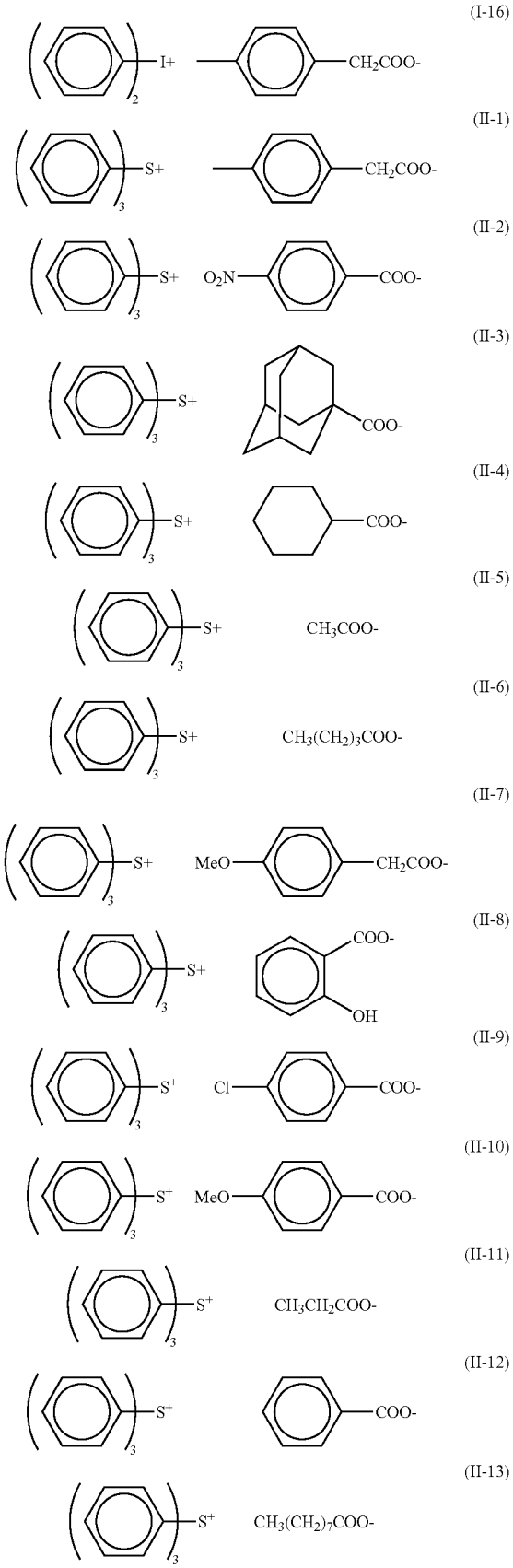

(II-14) 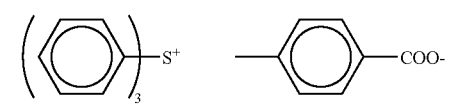
(II-15) 
(II-16) 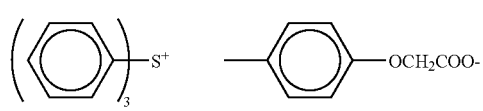
(II-17) 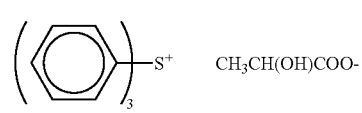
(II-18) 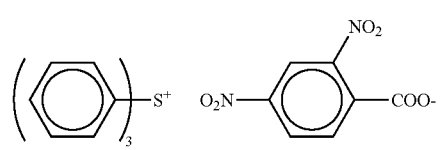
(II-19) 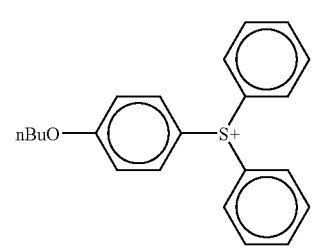
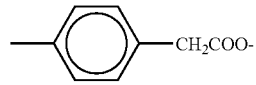
(II-20) 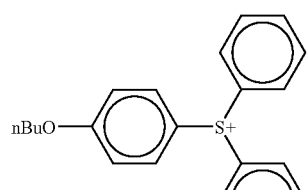
(II-21) 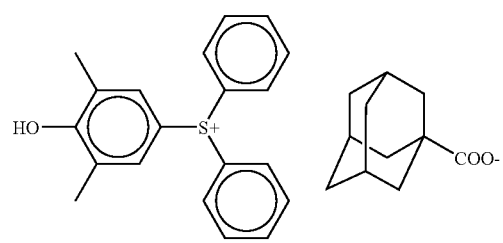
(II-22) 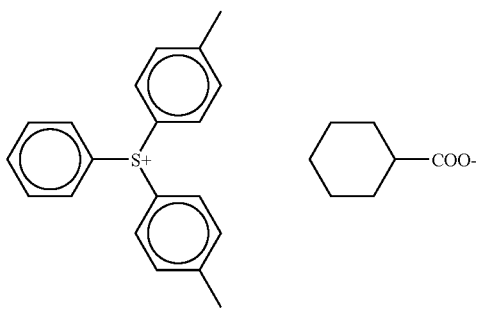
(II-23) 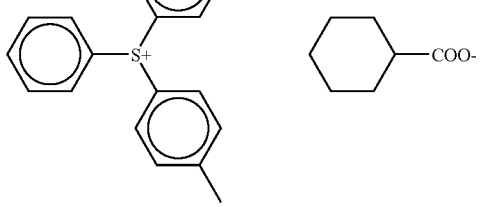
(II-24) 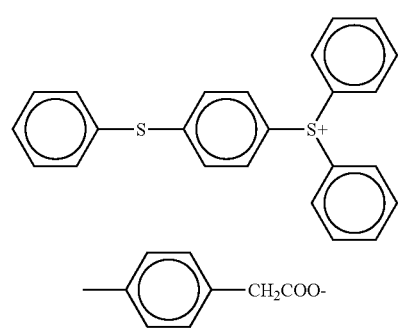
(II-25) 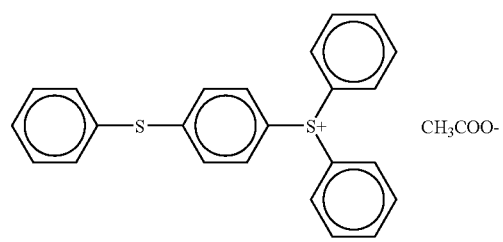
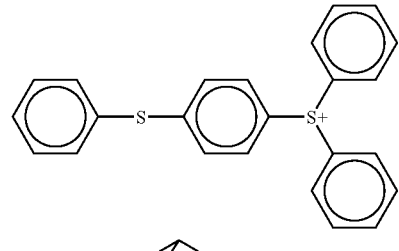
(II-26) 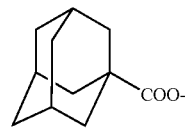
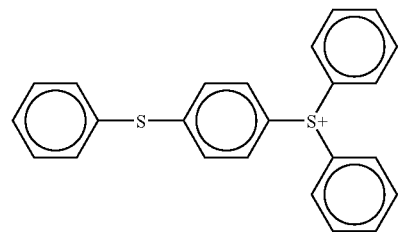

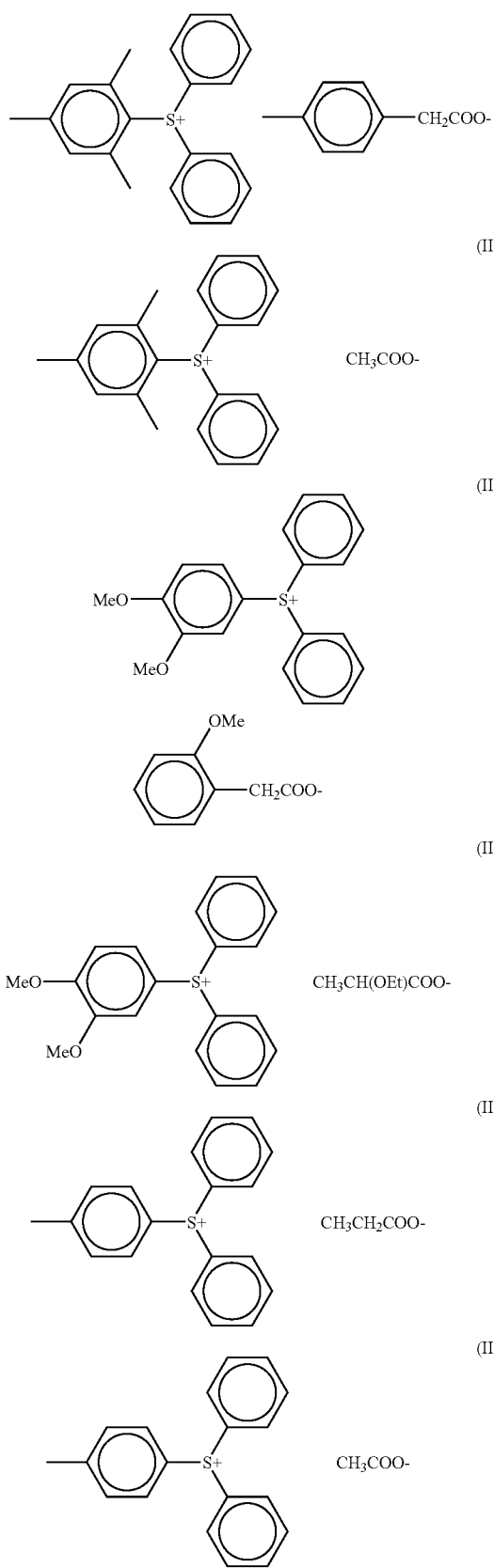
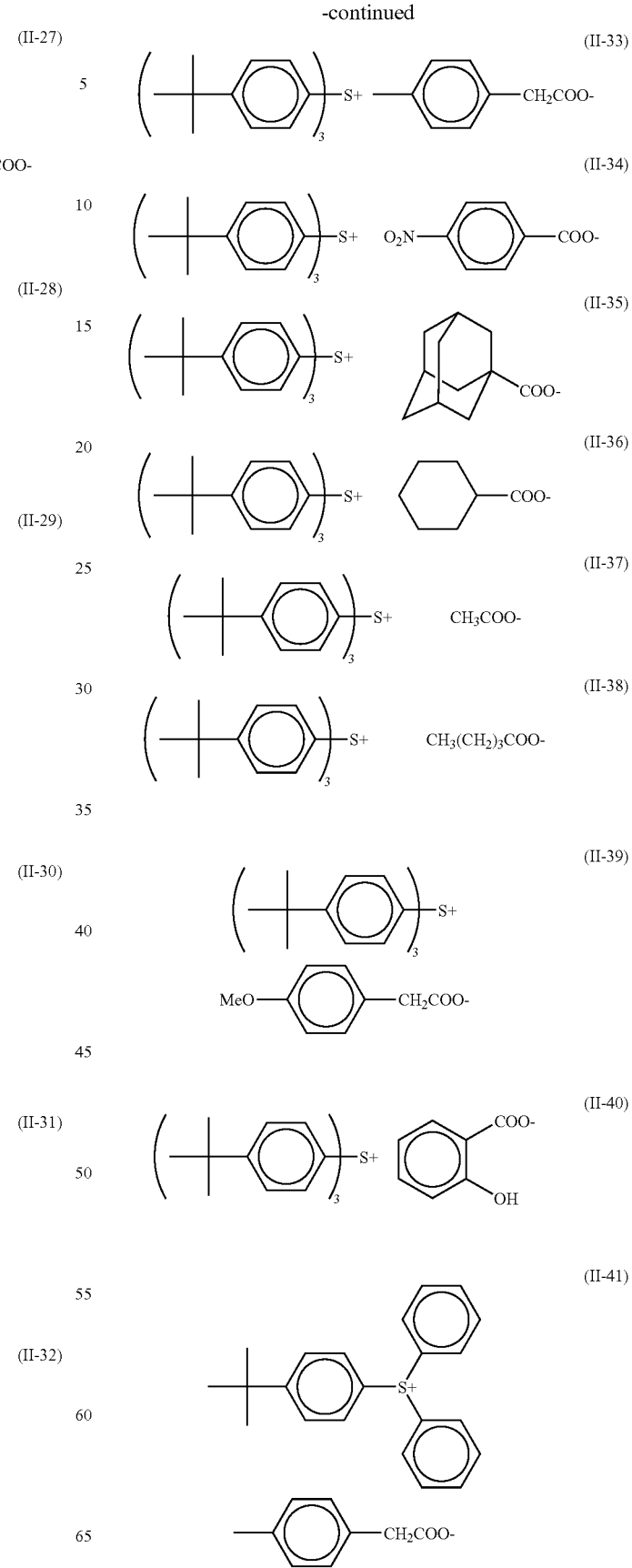

(II-42) 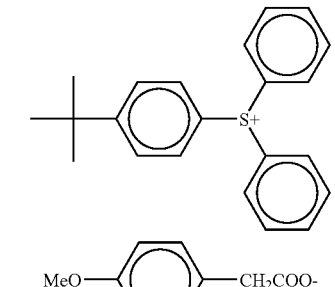
(II-43) 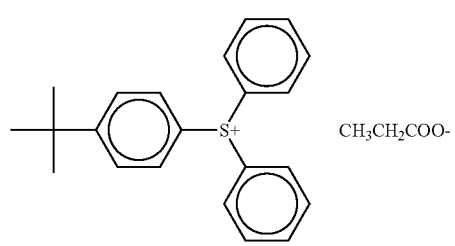
(II-44) 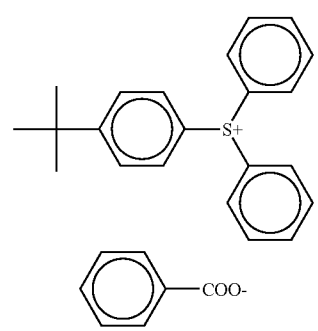
(II-45) 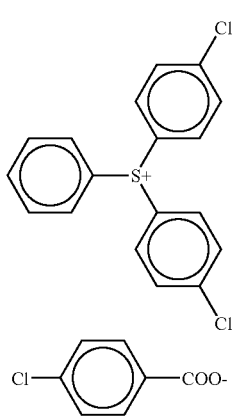
(II-46) 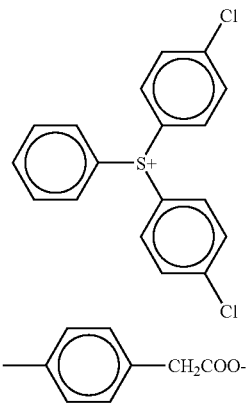
(II-47) 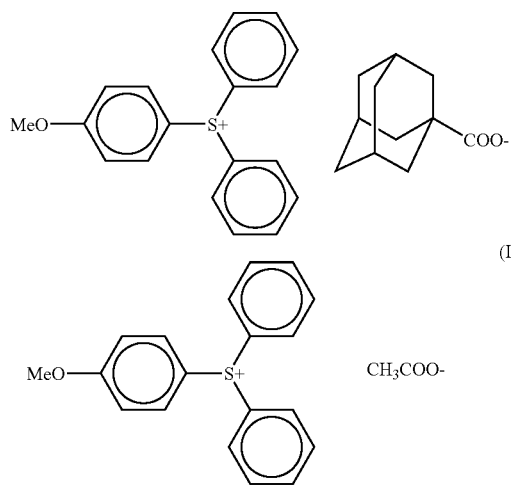
(II-48) 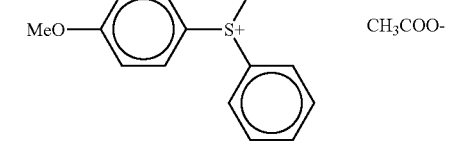
(III-1) 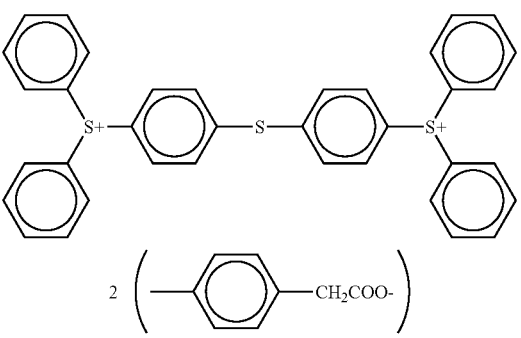
(III-2) 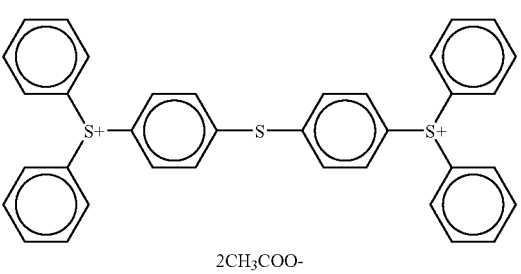

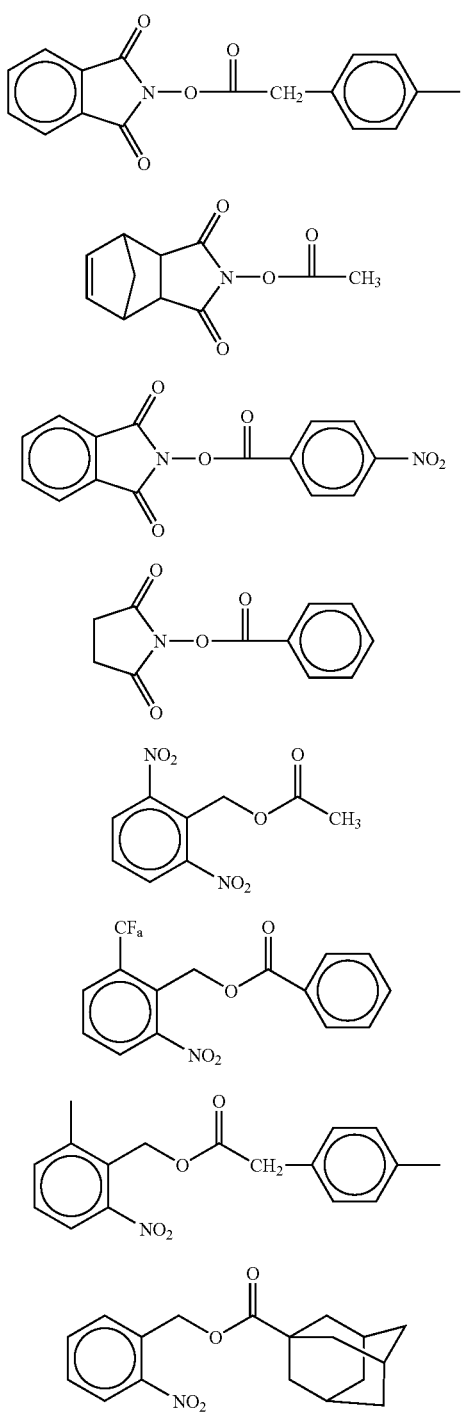

The above photo-acid generators, i.e., the compounds represented by the formulae (AI), (AII) and (AIII) can be synthesized by using a method described in U.S. Pat. No. 3,734,928, methods described in Macromolecules, vol. 10, 1307 (1977), Journal of Organic Chemistry, vol. 55, 4222 (1990) and J. Radiat. Curing, vol. 5(1), 2 (1978), etc. followed by the exchange of a counter anion. The compounds represented by the formulae (AIV) and (AV) can be obtained by reacting an N-hydroxyimide compound with a carboxylic acid chloride under basic conditions or reacting nitrobenzyl alcohol with a carboxylic acid chloride under basic conditions.

The ratio by weight of the acid generator (B-1) generating an acid having a relatively high acid strength to the acid generator (B-2) generating an acid having a relatively low acid strength ranges generally from 1/1 to 50/1, preferably from 1/1 to 10/1, still preferably from 2/1 to 5/1.

These two acid generators are employed in a total content of usually from 0.5 to 20% by weight, preferably from 0.75 to 15% by weight and still preferably from 1 to 10% by weight, based on the total solid components.

[3] Solvent (Component C)

In using the composition according to the invention, the above components are dissolved in a solvent ir which they are soluble and the solution is coated to a support. Preferable examples of the solvent usable include 1-methoxy-2-propanol acetate, 1-methoxy-2-propanol, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran. Among all, 1-methoxy-2-propanol acetate and 1-methoxy-2-propanol are particularly preferable. Either one of these solvent or a mixture thereof may be used.

[4] Surfactant (D)

It is preferable that the photoresist composition according to the invention further contains one or more of surfactants containing at least one of a group consisting of a fluorine atom and a silicon atom (a fluorine-containing surfactant, a silicon-containing surfactant and a surfactant containing both of fluorine and silicon atoms). Addition of such surfactants containing at least one of a group consisting of a fluorine atom and a silicon atom contributes to the prevention of development defect and improvement in coating properties.

Examples of these surfactants containing at least one of a group consisting of a fluorine atom and a silicon atom include surfactants described in JP-A-62-36663, JP-A-61-226746, JP-A-61-226745, JP-A-62-170950, JP-A=63-34540, JP-A-7-230165, JP-A-8-62834, JP-A-9-54432, JP-A-9-5988, JP-A-2002-277862, U.S. Pat. No. 5,405,720, U.S. Pat. No. 5,360,692, U.S. Pat. No. 5,529,881, U.S. Pat. No. 5,296,330, U.S. Pat. 5,436,098, U.S. Pat. No. 5,576,143, U.S. Pat. No. 5,294,511 and U.S. Pat. No. 5,824,451. It is also possible to employ the following marketed surfactants as such.

Examples of marketed surfactants usable herein include surfactants containing at least one of a group consisting of a fluorine atom and a silicon atom such as Eftop EF301 and EF 303 (manufactured by Shin-Akita Kasei K. K.), Florad FC430 and 431 (manufactured by Sumitomo 3M, Inc.), Megafac F171, F173, F176, F189 and ROB (manufactured by Dainippon Ink & Chemicals, Inc.), Surflon S-382, DC101, 102, 103, 104, 105 and 106 (manufactured by Asahi Glass Co., Ltd.), Troysol S-366 (manufactured by Troy Chemical Industries, Inc.). It is also possible to use silicon-containing surfactants such As Polysiloxane polymer KP341 (manufactured by Shin-Etsu Chemical Industry Col., Ltd.).

In addition to the publicly known surfactants as described above, use can be also made of surfactants comprising a polymer having a fluoro aliphatic group derived from a fluoro aliphatic compound which is produced by the telomerization method (also called the telomer method) or the oligomerization method (also called the oligomer method). Such a fluoro aliphatic compound can be synthesized by a method described in JP-A-2002-90991.

As the polymer having a fluoro aliphatic group, a copolymer of a monomer having a fluoro aliphatic group with a (poly(oxyalkylene)) acrylate and/or a (poly(oxyalkylene)) methacrylate is preferable. Either a copolymer with irregular distribution or a block copolymer may be used. Examples of the poly(oxyalkylene) group include poly(oxyethylene), poly (oxypropylene) and poly (oxybutylene) groups. Use may be also made of units having alkylenes with different chain lengths in a single chain such as a poly (oxyethyleneoxypropylene block unit) and poly(oxyethylene-oxypropylene block unit). Moreover, use may be made of not only a copolymer or a dimer of a monomer having a fluoro aliphatic group with a (poly(oxyalkylene)) acrylate (or methacrylate) but also a trimer or a higher copolymer having two or more different monomers having a fluoro aliphatic group or two or more different (poly(oxyalkylene)) acrylates (or methacrylates) copolymerized at the same time.

Examples of marketed surfactants include Megafac F178, F-470, F-473, F-475, F-476 and F-472 (manufactured by Dainippon Ink & Chemicals, Inc.). Further examples thereof include a copolymer of a $C_6F_{13}$-containing acrylate (or methacrylate) with a (poly (oxyalkylene)) acrylate (or methacrylate), a copolymer of a $C_6F_{13}$-containing acrylate (or methacrylate) with (poly(oxyethylene))acrylate (or methacrylate) and (poly (oxypropylene)) acrylate (or methacrylate), a copolymer of a $C_8F_{17}$-containing acrylate (or methacrylate) with a (poly(oxyalkylene))acrylate (or methacrylate), and a copolymer of a $C_8F_{17}$-containing acrylate (or methacrylate) with (poly(oxyethylene))acrylate (or methacrylate) and (poly(oxypropylene))acrylate (or methacrylate).

The surfactant containing at least one of a group consisting of a fluorine atom and a silicon atom is used in an amount of prferably from 0.0001 to 2% by weight, still preferably form 0.001 to 1% by weight based on the whole positive photoresist composition (exlcuding the solvent).

[5] Acid Diffusion Inhibitor (E)

It is preferable that an acid diffusion inhibitor is added to the composition according to the invention to prevent changes in the performance (T-top formation in pattern, change in sensitivity, change in pattern line width, etc.) with the passage of time after the irradiation with one of an actinic ray and radiation until the heat treatment, changes in performance with the passage of time after the coating and, furthermore, the excessive diffusion of an acid (worsening in resolution) during the heat treatment after the irradiation with one of an actinic ray and radiation. As the acid diffusion inhibitor, use can be made of an organic basic compound. For example, it is preferable to use an organic basic compound containing nitrogen, e.g., a conjugated acid compound with a pKa value of 4 or more.

Specific examples thereof include the following structures (A) to (E).

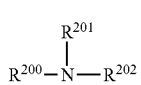

(A)

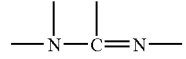

(B)

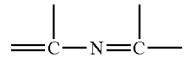

(C)

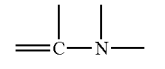

(D)

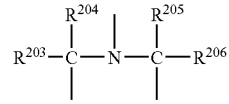

(E)

In the above formulae, $R^{200}$, $R^{201}$ and $R^{202}$ may be the same or different and each represents a hydrogen atom, an alkyl group having from 1 to 20 carbon atoms, a cycloalkyl group having from 3 to 20 carbon atoms or an aryl group having from 6 to 20 carbon atoms, or $R^{201}$ and $R^{202}$ may be bonded to form a ring together. The alkyl and cycloalkyl groups may be substituted. Examples of the substituted alkyl group include aminoalkyl groups having from 1 to 20 carbon atoms and hydroxyalkyl groups having from 1 to 20 carbon atoms. Examples of the substituted cycloalkyl groups include aminocycloalkyl groups having from 3 to 20 carbon atoms and hydroxycycloalkyl groups having from 3 to 20 carbon atoms.

$R^{203}$, $R^{204}$, $R^{205}$ and $R^{206}$ may be the same or different and each represents an alkyl group or a cycloalkyl group having from 1 to 30 carbon atoms.

A still preferable compound is a nitrogen-containing basic compound having two or more nitrogen atoms differing in chemical environment per molecule. A particularly preferable compound is a compound having both of a substituted or unsubstituted amino group and a nitrogen-containing cyclic structure or a compound having an alkylamino group.

Particularly preferable examples thereof include substituted or unsubstituted guanidine, substituted or unsubstituted aminopyridine, substituted or unsubstituted aminoalkylpyridine, substituted or unsubstituted aminopyrrolidine, substituted or unsubstituted indazole, imidazole, substituted or unsubstituted pyrazole, substituted or unsubstituted pyradine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholine. Examples of preferable substituents include amino, aminoalkyl, alkylamino, aminoaryl, arylamino, alkyl, alkoxy, acyl, acyloxy, aryl, aryloxy, nitro, hydroxyl and cyano groups.

Particularly preferable compounds include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aimoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(-aminoethyl)morpholine and so on, though the invention is not restricted thereto.

Either one of these nitrogen-containing basic compounds or a mixture of two or more of them may be used.

It is preferable that the acid generator and the organic basic compound are employed in the composition at a ratio by mol of (acid generator)/(organic basic compound) from 2.5 to 300. From the viewpoints of sensitivity and resolution, it is preferred that the molar ratio is 2.5 or higher. From the viewpoints of the change in the resist pattern with the passage of time from the exposure to the heating and resolution, the molar ratio is 300 or lower. The molar ratio of (acid generator)/(organic basic compound) preferably ranges from 5.0 to 200, still preferably from 7.0 to 150.

In producing a fine integrated circuit element, etc., a pattern is formed on a resist film by coating the composition according to the invention to a substrate (for example, a transparent substrate such as a silicone/silicone dioxide-coated glass substrate or an ITO substrate), thus forming a resist film, irradiating it with the use of an actinic ray or radiation drawing device, heating, developing, rinsing and drying to give a favorable resist pattern.

As the developing solution for the resist composition according to the invention, use can be made of aqueous solutions of alkalis, for example, inorganic alkalis such as sodium hydroxide, potassium hydroxide, sodium carbonate, sodium silicate, sodium metasilicate and aqueous ammonia, primary amines such as etnylamine and n-propylamine, secondary amines such as diethylamine and di-n-butylamine, tertiary amines such as triethylamine and methyldiethylamine, alcohol amines such as dimethylethanolamine and triethanolamine, quaternary amine salts such as tetramethylammonium hydroxide, tetraethylammonium hydroxide and choline, and cyclic amines such as pyrrole and piperidine. Furthermore, alcohols such as isopropyl alcohol and surfactants such as a nonionic surfactant may be added to the aqueous solutions of alkalis as cited above.

Among these developing solutions, quaternary ammonium salts are preferable and tetramethylammonium hydroxide and choline are still preferable.

The alkali concentration in the alkali developing solution ranges usually form 0.1 to 20% by weight while its pH value usually ranges from 10 to 15.

EXAMPLES

Now, the invention will be illustrated in greater detail by reference to the following EXAMPLES, though the contents of the invention are not restricted thereto.

Synthesis Example (Synthesis of Resin (a-5))

Into a 100 ml 3-necked flask provided with a condenser and a nitrogen-inlet tube, 1,1,1,3,3,3-hexafluoro-2-(2-fluoro-bicyclo[2.21]hept-5-en-2-yl)-propan-2-ol, 2-trifluoromethyl-acrylic acid 2-ethyl-adamantan-2-yl ester and 2-trifluoromethyl-acrylic acid 3,5-dihydroxy-adamantan-1-yl ester were fed at a molar ratio of 40/30/30. Next, tetrahydrofuran was added to prepare 30 g of a liquid reaction mixture having a monomer concentration of 30% by weight. Then it was heated to 65° C. while stirring under a nitrogen gas stream. An azo polymerization initiator V-65 (manufactured by wako Pure Chemical Industries, Ltd.) was added in an amount of 5.0% by mol based on the total amount by mol of the above three monomers and the mixture was reacted for 8 hours while stirring under a nitrogen gas stream. To the liquid reaction mixture thus obtained, 200 ml of hexane was added and the polymer thus formed was purified by precipitating from the solution to thereby separate the unreacted monomers.

The obtained polymer was analyzed by GPC (in a THF solvent, calculated in terms of polystyrene). Thus, the weight-average molecular weight of the polymer was 9,200, the degree of dispersion was 1.52 and the ratio of compounds having a molecular weight of 1000 or less was not more than 5% by weight.

Resins according to the invention listed in Table 1 were synthesized by the same procedure.

TABLE 1

| Resin | Composition ratio (by mol) (from the left side in structural formula) | Weight-average molecular weight | Degree of dispersion |
|---|---|---|---|
| a-1  | 50/25/25     | 8600 | 1.53 |
| a-2  | 45/30/25     | 8500 | 1.51 |
| a-3  | 50/30/20     | 7600 | 1.52 |
| a-4  | 30/25/25     | 8200 | 1.51 |
| a-5  | 40/30/30     | 9200 | 1.52 |
| a-6  | 20/20/50/10  | 7900 | 1.51 |
| a-7  | 20/50/20/10  | 8800 | 1.48 |
| a-8  | 20/50/20/10  | 8600 | 1.49 |
| a-9  | 20/10/50/10  | 7900 | 1.55 |
| a-10 | 40/30/30     | 8100 | 1.56 |
| a-11 | 20/10/50/20  | 8300 | 1.61 |
| a-12 | 40/30/30     | 7700 | 1.55 |
| a-13 | 10/20/50/20  | 7900 | 1.48 |
| a-14 | 20/50/20/10  | 8000 | 1.59 |
| a-15 | 20/20/50/10  | 8800 | 1.57 |

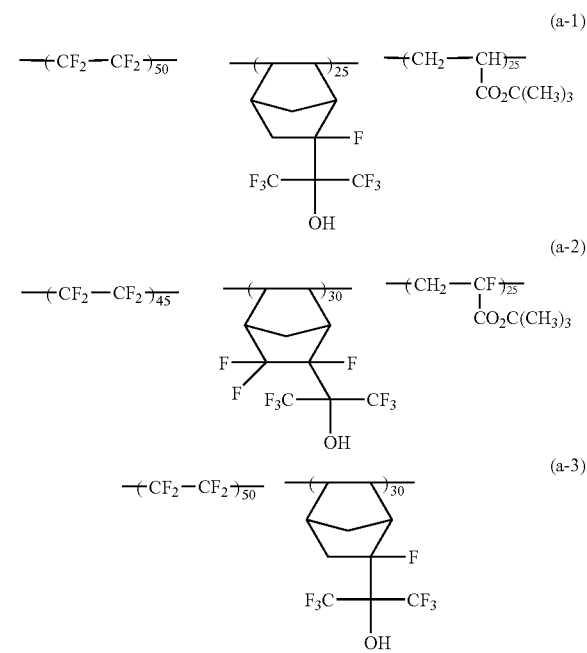

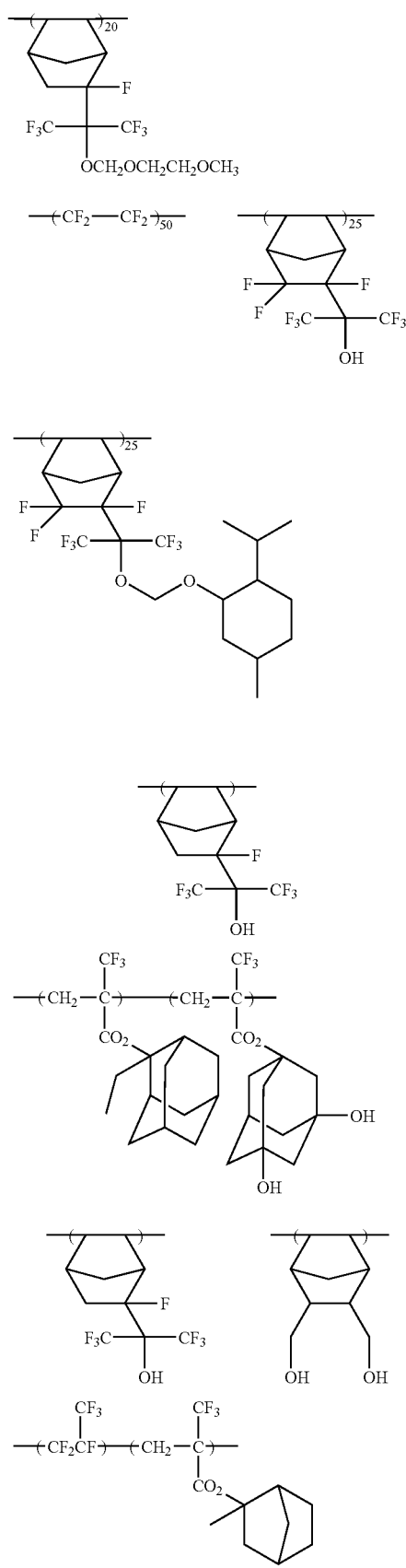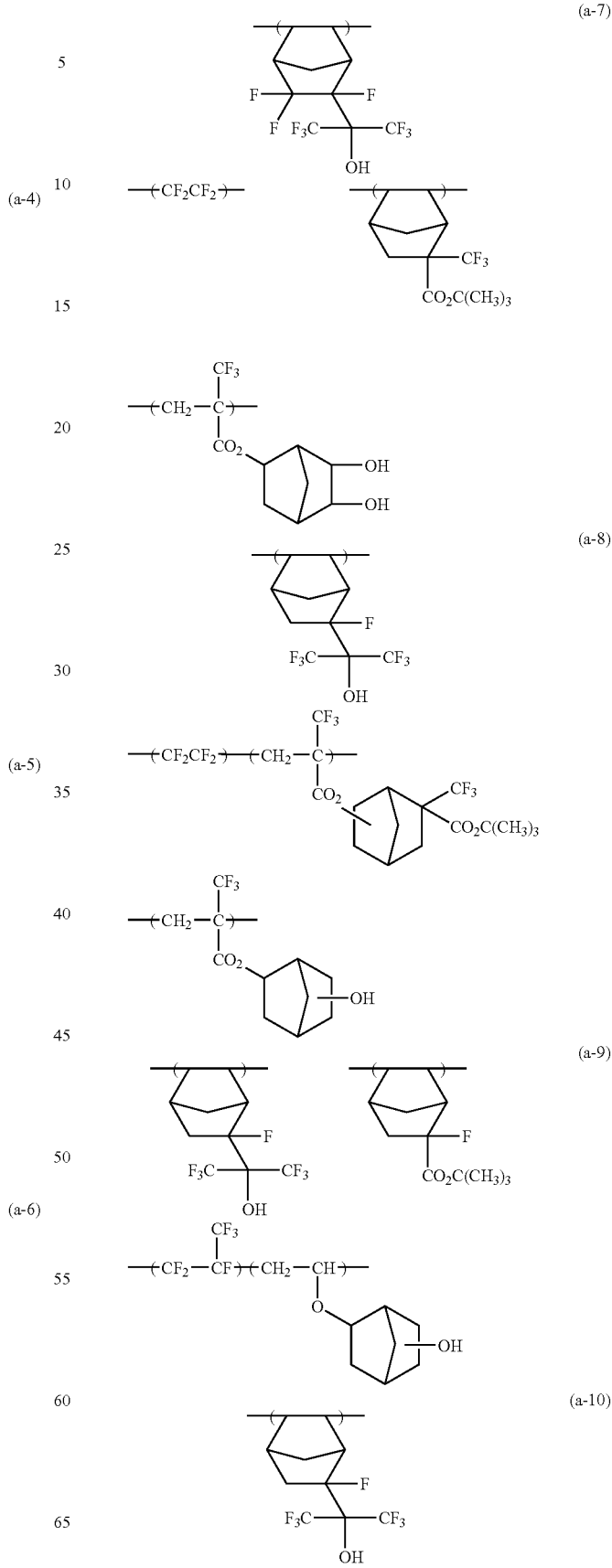

-continued
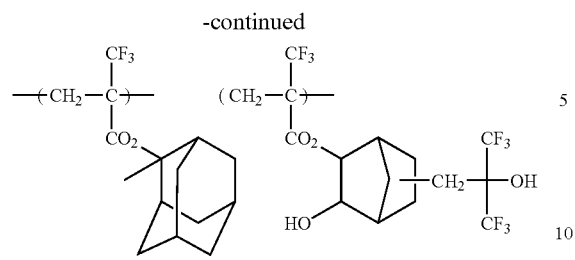
(a-11)
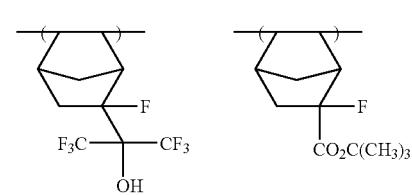
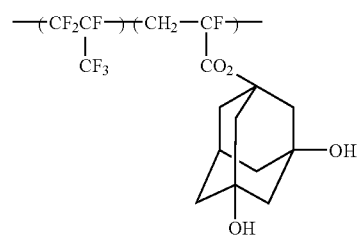
(a-12)
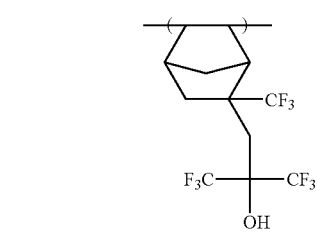
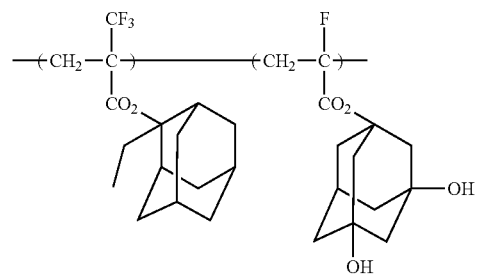
(a-13)
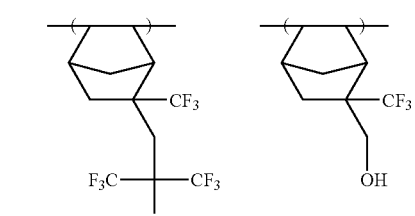
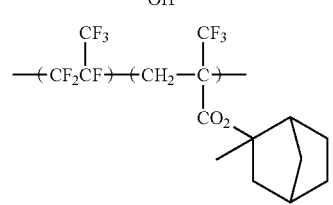
-continued
(a-14)
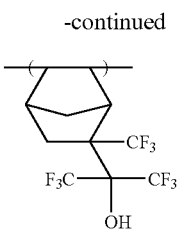
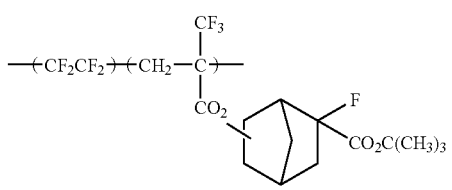
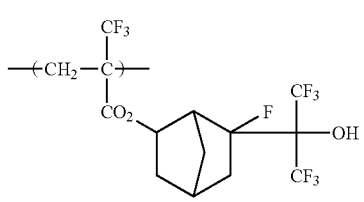
(a-15)
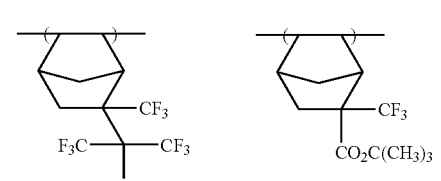
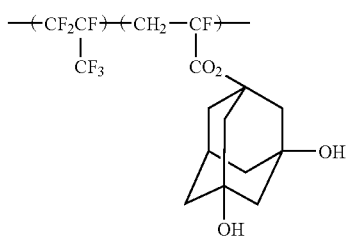
(b-1)
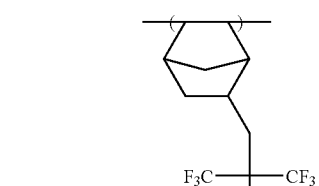
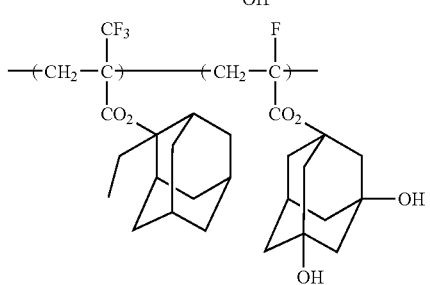

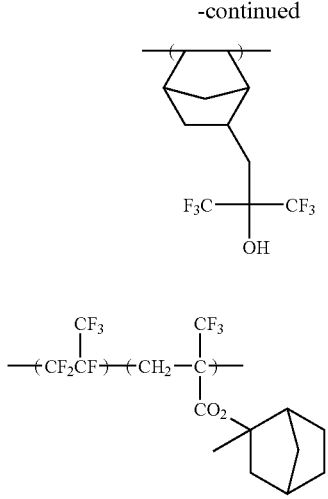

<Synthesis of Triphenylsulfonium Nonafluorobutane Sulfonate (VII-4)>

20 g of triphenylsulfonium iodide was dissolved in 500 ml of methanol. After adding 12.5 g of silver oxide, the mixture was stirred at room temperature for 4 hours. Then the liquid reaction mixture was filtered to remove the silver compound. TO the resultant solution, 14.9 g of nonafluorobutanesulfonic acid was added and the solution was concentrated. 300 ml of diisopropyl ether was added to the oily product thus obtained. After thoroughly stirring, the diisopropyl ether was removed by decantation twice. The obtained oily product was dried under reduced pressure to give 18 g of the target product.

<Synthesis of Triphenylsulfonium Nonafluoropentanoate (II-4f)>

20 g of triphenylsulfonium iodide was dissolved in 500 ml of methanol. After adding 12.5 g of silver oxide, the mixture was stirred at room temperature for 4 hours. Then the liquid reaction mixture was filtered to remove the silver compound. TO the resultant solution, 14.9 g of nonafluoropentanoic acid was added and the solution was concentrated. 300 ml of diisopropyl ether was added to the oily product thus obtained. After thoroughly stirring, the diisopropyl ether was removed by decantation twice. The obtained oily product was dried under reduced pressure to give 18 g of the target product.

Examples 1 to 15 and Comparative Examples 1 to 3

1.2 g of the resin component A, 0.024 g of the acid generator component B-1, 0.006 g of the acid generator component B-2, 100 ppm (based on the polymer solution) of the surfactant component D, and 0.0021 g of the basic compound component E were dissolved in 19.6 g of the solvent component C, each as shown in the following Table 2. The obtained polymer solution was filtered through a 0.1 µm Teflon® filter to prepare a positive photoresist solution.

Symbols given in Table 2 have the following meanings.

N-1: hexamethylenetetramine
N-2: 1,5-diazabicyclo[4.3.0]-5-nonene
W-1: Megafac F176 (manufactured by Dainippon Ink & Chemicals, Inc.)
W-2: Megafac R08 (manufactured by Dainippon Ink &Chemicals, Inc.) (fluorine and silicon type)
S1: ethyl lactate
S2: propylene glycol monomethyl ether acetate
S3: propylene glycol monomethyl ether The amount of each component given in Table 2 is expressed by weight.

Evaluation was made as follows.

[Bottom Spread Shape Evaluation 1]

The positive photoresist solution as prepared above was uniformly coated on a silicone wafer having been coated with an anti-reflecting coating (DUV42-6, manufactured by Brewer Science Inc.) by using a spin coater and dried by heating to 120° C. for 60 seconds to give a positive photoresist film of 0.15 µm in film thickness. This resist film was subjected to pattern exposure with the use of an $F_2$ excimer laser microstepper (NA=0.60) via a line-and-space mask (line width: 150 nm, line/space=1/1). Immediately after the exposure, it was heated on a hot plate at 110° C. for 90 seconds. Further, development was performed with a 2.38% by weight aqueous solution of tetramethylammonium hydroxide at 23° C. for 30 seconds and rinsed with purified water for 30 seconds followed by drying. The resist performance of the thus obtained pattern on the silicone wafer was evaluated by the following method. A line-and-space pattern of 150 nm in dimensional size was observed under an SEM (Model S-8840 manufactured by Hitachi) and the degree of the bottom spread shape shown in FIG. 1 was evaluated in accordance with the following formula. A smaller value indicates the less bottom spread.

Formula: (B-A)/2B×100(%)

[Bottom Spread Shape Evaluation 2]

The positive photoresist solution as prepared above was uniformly coated on an SiON substrate by using a spin coater and dried by heating to 120° C. for 60 seconds to give a positive photoresist film. This resist film was subjected to pattern exposure with the use of an $F_2$ excimer laser microstepper (NA=0.60) via a line-and-space mask (line width: 150 nm, line/space=1/1). Immediately after the exposure, it was heated on a hot plate at 110° C. for 90 seconds. Further, development was performed with a 2.38% by weight aqueous solution of tetramethylammonium hydroxide at 23° C. for 30 seconds and rinsed with purified water for 30 seconds followed by drying. The resist performance of the thus obtained pattern on the silicone wafer was evaluated by the following method. A line-and-space pattern of 150 nm in dimensional size was observed under an SEM (Model S-8840 manufactured by Hitachi) and the degree of the bottom spread shape shown in FIG. 1 was evaluated in accordance with the following formula. A smaller value indicates the less bottom spread.

Formula: (B-A)/2B×100(%)

Table 2 summarizes the results of the performance evaluations.

TABLE 2

| | Composition | | | | | | Evaluation | |
|---|---|---|---|---|---|---|---|---|
| | Resin (10 g) | Component (B-1) (g) | Component (B-2) (g) | Solvent | Surfactant | Basic compound | Bottom spread shape evaluation 1 | Bottom spread shape evaluation 2 |
| Ex. 1 | a-1 | (VII-4) | (II-1) | S2 | W-1 | — | 14 | 22 |
| Ex. 2 | a-2 | (VII-4) | (II-2) | S1/S2 (20/80) | W-1 | — | 15 | 23 |
| Ex. 3 | a-3 | (VII-4) | (II-3) | S1/S2/S3 (10/80/10) | W-1 | (N-1) | 14 | 22 |
| Ex. 4 | a-4 | (VII-4) | (II-4) | S1/S2 (20/80) | W-1 | — | 14 | 23 |
| Ex. 5 | a-5 | (VII-4) | (II-5) | S2 | W-1 | (N-2) | 13 | 24 |
| Ex. 6 | a-6 | (VII-4) | (II-6) | S2 | W-2 | — | 14 | 25 |
| Ex. 7 | a-7 | (VII-4) | (II-7) | S2 | W-1 | — | 14 | 21 |
| Ex. 8 | a-8 | (VII-36) | (II-5) | S2 | W-2 | — | 15 | 22 |
| Ex. 9 | a-9 | (VII-4) | (II-5f) | S2 | W-1 | — | 13 | 22 |
| Ex. 10 | a-10 | (VII-36) | (II-4f) | S2 | W-1 | — | 15 | 23 |
| Ex. 11 | a-11 | (VII-36) | (II-4f)/(II-5) (50/50) | S2 | W-2 | — | 14 | 24 |
| Ex. 12 | a-12 | (VII-1) | (II-6) | S2 | W-1 | — | 15 | 22 |
| Ex. 13 | a-13 | (VII-4) | (II-6) | S2 | W-1 | (N-1) | 14 | 25 |
| Ex. 14 | a-14 | (VII-5) | (II-6) | S2 | W-1 | — | 14 | 22 |
| Ex. 15 | a-15 | (VII-52) | (II-6) | S2 | W-1 | — | 14 | 22 |
| C. Ex. 1 | a-5 | (VII-4) | — | S2 | W-1 | (N-2) | 25 | 41 |
| C. Ex. 2 | b-1 | (VII-4) | (II-1) | S2 | W-1 | — | 30 | 40 |
| C. Ex. 3 | b-2 | (VII-4) | (II-1) | S2 | W-1 | — | 33 | 41 |

The results given in Table 2 indicate that the compositions according to the invention showed favorable profiles with regulated bottom spread.

This application is based on Japanese Patent application JP 2003-298897, filed Aug. 22, 2003, the entire content of which is hereby incorporated by reference, the same as if set forth at length.

What is claimed is:

1. A positive photoresist composition containing:
(A) a resin which contains at least one of a repeating unit represented by the formula (IA) and a repeating unit represented by the formula (IB), and is decomposed by an action of an acid and shows an increase in a solubility in an alkali developer; and
(B) as compounds capable of generating an acid upon irradiation with one of an actinic ray and a radiation, at least two compounds selected from the group consisting of:
(B1) a compound capable of generating an aliphatic or aromatic sulfonic acid substituted by at least one fluorine atom upon irradiation with one of an actinic ray and a radiation;
(B2) a compound capable of generating an aliphatic or aromatic sulfonic acid containing no fluorine atom upon irradiation with one of an actinic ray and a radiation;
(B3) a compound capable of generating an aliphatic or aromatic carboxylic acid substituted by at least one fluorine atom upon irradiation with one of an actinic ray and a radiation; and
(B4) a compound capable of generating an aliphatic or aromatic carboxylic acid containing no fluorine atom upon irradiation with one of an actinic ray and a radiation;

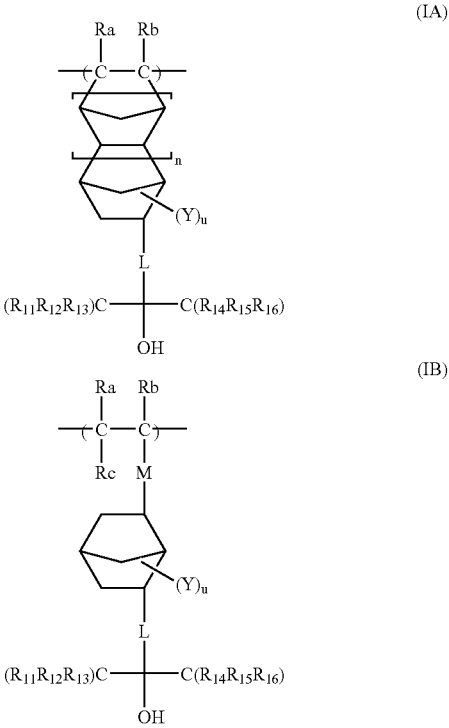

wherein Ra, Rb and Rc each independently represents a hydrogen atom, a methyl group, a fluorine atom or a fluoroalkyl group;
n is 0 or 1;
Y represents a fluorine atom or a fluoroalkyl group;

u is an integer of from 1 to 5;

L and M each independently represents a methylene group, an oxygen atom or an ester group; and $R_{11}$ to $R_{16}$ each independently represents a hydrogen atom, a fluorine atom or a fluoroalkyl group, provided that at least one of $R_{11}$ to $R_{16}$ represents a fluorine atom or a fluoroalkyl group.

2. The photoresist composition according to claim 1, wherein the resin (A) contains at least one of a repeating unit represented by the following formula (IIA) and a repeating unit represented by the following formula (IIB):

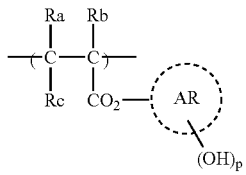

(IIA)

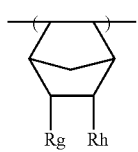

(IIB)

wherein Ra, Rb and Rc each independently represents a hydrogen atom, a methyl group, a fluorine atom or a fluoroalkyl group;

AR represents an alicyclic hydrocarbon structure;

p is an integer of from 1 to 5; and

Rg and Rh each independently represents a hydrogen atom, a hydroxyl group or a hydroxyalkyl group, provided that at least one of Rg and Rh represents a hydroxyl group or a hydroxyalkyl group.

3. The photoresist composition according to claim 1, wherein the resin (A) further contains at least one of repeating units represented by the following formulae (VIII) to (XVII):

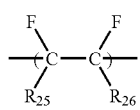

(VIII)

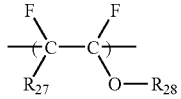

(IX)

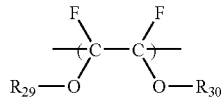

(X)

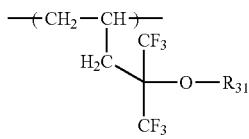

(XI)

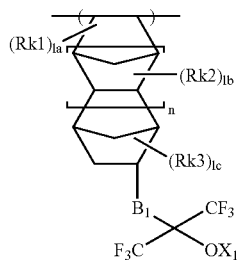

(XII)

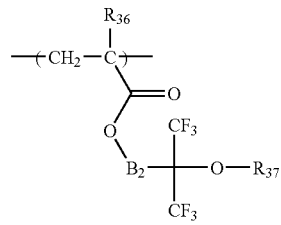

(XIII)

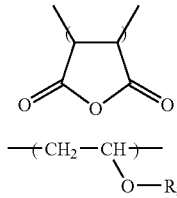

(XIV)

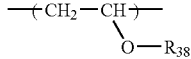

(XV)

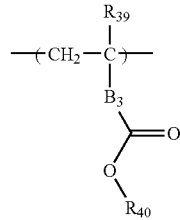

(XVI)

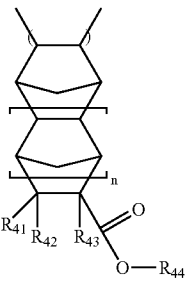

(XVII)

wherein $R_{25}$, $R_{26}$ and $R_{27}$ may be same or different and each represents a hydrogen atom, a fluorine atom, an alkyl group, a cycloalkyl group or an aryl group; $R_{28}$, $R_{29}$ and $R_{30}$ may be same or different and each represents an alkyl group, a cycloalkyl group or an aryl group; or $R_{25}$ and $R_{26}$, $R_{27}$ and $R_{28}$, or $R_{29}$ and $R_{30}$ may be bonded to each other to form a ring; $R_{31}$, $R_{37}$, $R_{40}$ and $R_{44}$ may be same or different and each represents a hydrogen atom, an alkyl group, a cycloalkyl group, an acyl group or an alkoxycarbonyl group; $R_{41}$, $R_{42}$ and $R_{43}$ may be same or different and each represents a hydrogen atom, a halogen atom, an alkyl group or an alkoxy group; $R_{36}$ and $R_{39}$ may be same or different and each represents a hydrogen atom, a halogen atom, a cyano group or an alkyl group; $R_{38}$ represents an alkyl group, a cycloalkyl group, an aralkyl group or an aryl group; $B_1$ and $B_2$ represent each a single bond or a divalent linking group; $B_3$ represents a divalent linking group; n is 0 or 1;

Rk1, Rk2 and Rk3 each independently represents a halogen atom, an alkyl group or an alkoxy group;

$X_1$ represents a hydrogen atom or a monovalent organic group;

1a is 0 or 1; 1b is an integer of 0 to 2; and 1c is an integer of 0 to 5.

4. The photoresist composition according to claim 1, further containing (D) a surfactant containing at least one of a fluorine atom and a silicone atom.

5. The photoresist composition according to claim 1, further containing (E) a basic compound having a nitrogen atom.

6. The photoresist composition according to claim 1, for using in $F_2$ laser irradiation.

7. A pattern making method comprising forming a resist film by using the photoresist composition according to claim 1, exposing the resist film and developing.

* * * * *